United States Patent
Hayano

(10) Patent No.: US 12,552,816 B2
(45) Date of Patent: *Feb. 17, 2026

(54) LIGHT EMITTING DIODE

(71) Applicant: SAMSUNG DISPLAY CO., LTD., Yongin-si (KR)

(72) Inventor: Tetsuji Hayano, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 930 days.

This patent is subject to a terminal disclaimer.

(21) Appl. No.: 17/664,571

(22) Filed: May 23, 2022

(65) Prior Publication Data

US 2022/0411443 A1 Dec. 29, 2022

Related U.S. Application Data

(63) Continuation-in-part of application No. 17/584,052, filed on Jan. 25, 2022.

(30) Foreign Application Priority Data

May 26, 2021 (KR) .......................... 10-2021-0067595

(51) Int. Cl.
*C07F 5/02* (2006.01)
*H10K 50/115* (2023.01)
(Continued)

(52) U.S. Cl.
CPC .......... *C07F 5/027* (2013.01); *H10K 85/657* (2023.02); *H10K 50/115* (2023.02); *H10K 50/15* (2023.02)

(58) Field of Classification Search
CPC ....... C07F 5/027; C07F 5/025; H10K 85/322; H10K 85/658; H10K 85/657; C09K 2211/1014

See application file for complete search history.

(56) References Cited

U.S. PATENT DOCUMENTS

| | | |
|---|---|---|
| 2015/0236274 A1 | 8/2015 | Hatakeyama et al. |
| 2018/0301629 A1 | 10/2018 | Hatakeyama et al. |

(Continued)

FOREIGN PATENT DOCUMENTS

| | | |
|---|---|---|
| CA | 3 017 010 A1 | 3/2019 |
| CN | 110407858 A | 11/2019 |

(Continued)

OTHER PUBLICATIONS

Machine Translation of CN112645968 (Year: 2021).*
(Continued)

*Primary Examiner* — Jenna N Chandhok
(74) *Attorney, Agent, or Firm* — Womble Bond Dickinson (US) LLP

(57) ABSTRACT

A light emitting diode of one or more embodiments includes a first electrode, a second electrode opposite the first electrode, and at least one functional layer disposed between the first electrode and the second electrode, the at least one functional layer including a polycyclic compound represented by Formula 1 below, wherein the first electrode and the second electrode each independently includes at least one selected from among Ag, Mg, Cu, Al, Pt, Pd, Au, Ni, Nd, Ir, Cr, Li, Ca, LiF, Mo, Ti, W, In, Sn, Zn, compounds thereof, and mixtures thereof.

(Continued)

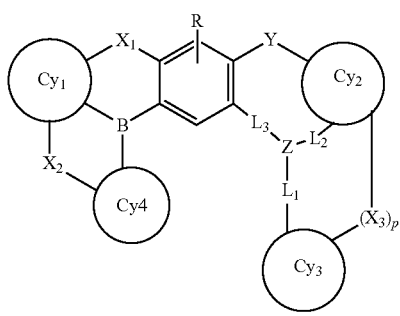

Formula 1

20 Claims, 6 Drawing Sheets

(51) Int. Cl.
    *H10K 50/15* (2023.01)
    *H10K 85/60* (2023.01)

(56) References Cited

U.S. PATENT DOCUMENTS

| | | | |
|---|---|---|---|
| 2019/0027694 | A1 | 1/2019 | Hatakeyama et al. |
| 2019/0058124 | A1 | 2/2019 | Hatakeyama et al. |
| 2019/0181350 | A1 | 6/2019 | Hatakeyama et al. |
| 2019/0207112 | A1 | 7/2019 | Hatakeyama et al. |
| 2019/0256538 | A1 | 8/2019 | Hatakeyama et al. |
| 2020/0058885 | A1 | 2/2020 | Hong et al. |
| 2020/0091431 | A1 | 3/2020 | Hatakeyama et al. |
| 2020/0144515 | A1 | 5/2020 | Hatakeyama et al. |
| 2020/0190115 | A1 | 6/2020 | Hatakeyama et al. |
| 2020/0203617 | A1 | 6/2020 | Duan et al. |
| 2020/0203627 | A1 | 6/2020 | Miyazaki et al. |
| 2020/0403160 | A1* | 12/2020 | Sakamoto ............ H10K 85/633 |
| 2021/0111344 | A1 | 4/2021 | Hayano |
| 2021/0143332 | A1 | 5/2021 | Hayano |
| 2021/0305512 | A1* | 9/2021 | Suzaki .................. C07F 5/027 |
| 2021/0376250 | A1* | 12/2021 | Suzaki ............... H10K 85/6574 |

FOREIGN PATENT DOCUMENTS

| | | | | |
|---|---|---|---|---|
| CN | 112645968 | A * | 4/2021 | ............ C07F 5/02 |
| JP | 2012-507507 | A | 3/2012 | |
| JP | 5935199 | B2 | 6/2016 | |
| KR | 10-2016-0119683 | A | 10/2016 | |
| KR | 10-2017-0130434 | A | 11/2017 | |
| KR | 10-2018-0108559 | A | 10/2018 | |
| KR | 10-2018-0108604 | A | 10/2018 | |
| KR | 10-2018-0122298 | A | 11/2018 | |
| KR | 10-1955648 | B1 | 3/2019 | |
| KR | 10-2019-0069295 | A | 6/2019 | |
| KR | 10-2053324 | B1 | 12/2019 | |
| KR | 10-2058028 | B1 | 12/2019 | |
| KR | 10-2020-0006965 | A | 1/2020 | |
| KR | 10-2020-0078755 | A | 7/2020 | |
| KR | 10-2021-0043054 | A | 4/2021 | |
| KR | 10-2021-0057263 | A | 5/2021 | |
| WO | WO 2015/102118 | A1 | 7/2015 | |
| WO | WO 2016/152544 | A1 | 9/2016 | |
| WO | WO 2017/126443 | A1 | 7/2017 | |
| WO | WO 2017/138526 | A1 | 8/2017 | |
| WO | WO 2017/188111 | A1 | 11/2017 | |
| WO | WO 2018/047639 | A1 | 3/2018 | |
| WO | WO 2018/203666 | A1 | 11/2018 | |
| WO | WO 2018/212169 | A1 | 11/2018 | |
| WO | WO 2020/080872 | A1 | 4/2020 | |
| WO | WO 2020/200884 | A1 | 10/2020 | |

OTHER PUBLICATIONS

Kohei Matsui, et al., "One-Shot Multiple Borylation toward BN-Doped Nanographenes", Journal of the American Chemical Society, ACS Publications, published Nov. 9, 2017, 140, pp. 1195-1198.

Numata, Masaki et al., "High efficiency pure blue thermally activated delayed fluorescence molecules having 10H-phenoxaborin and acridan units", *Chem. Commun.*, 2015, 51, pp. 9443-9446.

Numata, Masaki et al., "Supporting Information—High efficiency pure blue thermally activated delayed fluorescence molecules having 10H-phenoxaborin and acridan units", *Chem. Commun.*, 2015, 51, pp. 1-37.

Park, In Seob et al., "High-Performance Dibenzoheteraborin-Based Thermally Activated Delayed Fluorescence Emitters: Molecular Architectonics for Concurrently Achieving Narrowband Emission and Efficient Triplet-Singlet Spin Conversion", *Adv. Funct. Mater.* 2018, 28, 1802031, 12pp.

Park, Im Seob et al., "Supporting Information—High-Performance Dibenzoheteraborin-Based Thermally Activated Delayed Fluorescence Emitters: Molecular Architectonics for Concurrently Achieving Narrowband Emission and Efficient Triplet-Singlet Spin Conversion", *Adv. Funct. Mater.* 2018, 28, 1802031, S1-S16, 17pp.

US Office Action dated May 14, 2025, issued in U.S. Appl. No. 17/584,052 (21 pages).

* cited by examiner

LIGHT EMITTING DIODE

CROSS-REFERENCE TO RELATED APPLICATION

This application is a continuation in part of U.S. application Ser. No. 17/584,052, filed Jan. 25, 2022, which claims priority to and the benefit of Korean Patent Application No. 10-2021-0067595, filed on May 26, 2021, the entire content of which is hereby incorporated by reference.

BACKGROUND

One or more aspects of embodiments of the present disclosure herein relate to a light emitting diode, and particularly, to a light emitting diode including a novel polycyclic compound.

The development of an organic electroluminescence display device as an image display device is being actively conducted. The organic electroluminescence display device is a self-luminescent display device in which holes and electrons injected from a first electrode and a second electrode recombine in an emission layer so that a light emitting material in the emission layer emits light to achieve display of images.

In the application of a light emitting diode to a display device, improved efficiency is desired, and development of materials for a light emitting diode that is capable of suitably achieving this characteristic is being continuously desired.

SUMMARY

One or more aspects of embodiments of the present disclosure are directed toward a light emitting diode showing high efficiency and long-life characteristics.

One or more embodiments of the present disclosure are directed toward a light emitting diode including: a first electrode; a second electrode opposite the first electrode; and at least one functional layer between the first electrode and the second electrode, the at least one functional layer including a polycyclic compound represented by Formula 1, wherein the first electrode and the second electrode each independently includes at least one selected among Ag, Mg, Cu, Al, Pt, Pd, Au, Ni, Nd, Ir, Cr, Li, Ca, LiF, Mo, Ti, W, In, Sn, Zn, compounds thereof, and mixtures thereof:

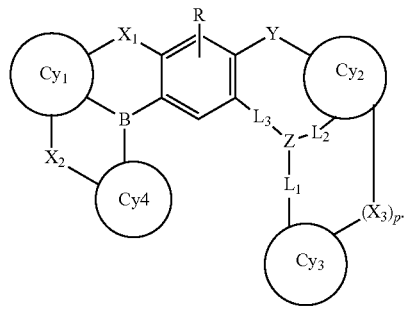

Formula 1

In Formula 1, $X_1$, $X_2$, and $X_3$ may be each independently a direct linkage, *—O—*, *—S—*, *—CO—*, *—SO$_2$—*, or *—NAr$_a$—*; Y may be *—S—* or *—Se—*; Z may be *—B—* or *—N—*; $L_1$, $L_2$ and $L_3$ may be each independently a direct linkage, *—O—*, *—S—*, or *—NAr$_b$—*, where if Z is *—N—*, $L_1$, $L_2$ and $L_3$ are each a direct linkage, and if Z is *—B—*, any two selected from among $L_1$, $L_2$ and $L_3$ are direct linkages, and the remaining one may be *—O—*, *—S—*, or *—NAr$_b$—*; "p" may be 0 or 1, where if Z is *—B—*, "p" is 1, and if Z is *—N—*, "p" is 0; $Cy_1$, $Cy_2$, $Cy_3$, and $Cy_4$ may be each independently a substituted or unsubstituted aromatic hydrocarbon ring of 6 to 30 ring-forming carbon atoms, or a substituted or unsubstituted aromatic heterocycle of 2 to 30 ring-forming carbon atoms; $Ar_a$ and $Ar_b$ may be each independently a substituted or unsubstituted aryl group of 6 to 30 ring-forming carbon atoms, or a substituted or unsubstituted heteroaryl group of 2 to 30 ring-forming carbon atoms; and R may be a hydrogen atom, a deuterium atom, a halogen atom, a cyano group, a substituted or unsubstituted nitro group, a substituted or unsubstituted amine group, a substituted or unsubstituted alkoxy group of 1 to 20 carbon atoms, a substituted or unsubstituted alkyl group of 1 to 30 carbon atoms, a substituted or unsubstituted alkenyl group of 2 to 30 carbon atoms, a substituted or unsubstituted aryl group of 6 to 50 ring-forming carbon atoms, or a substituted or unsubstituted heteroaryl group of 2 to 50 ring-forming carbon atoms, and/or may be combined with an adjacent group to form a ring.

In one or more embodiments, the polycyclic compound represented by Formula 1 may be represented by Formula 2-1 or Formula 2-2:

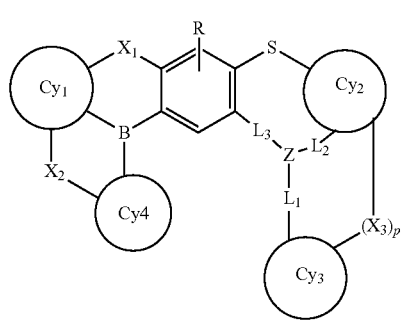

Formula 2-1

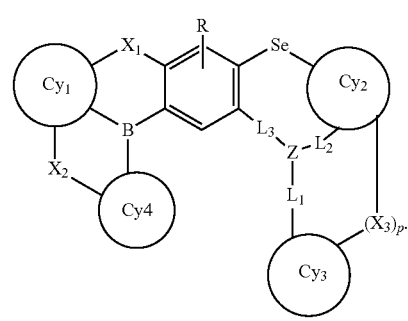

Formula 2-2

In Formula 2-1 and Formula 2-2, $X_1$, $X_2$, $X_3$, Z, $L_1$, $L_2$, $L_3$, "p", $Cy_1$, $Cy_2$, $Cy_3$, $Cy_4$ and R are the same as defined in Formula 1.

In one or more embodiments, the polycyclic compound represented by Formula 1 may be represented by Formula 3:

Formula 3

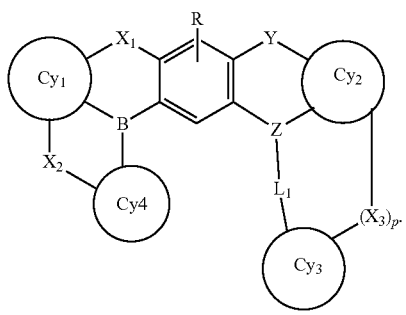

In Formula 3, $X_1$, $X_2$, $X_3$, Y, Z, $L_1$, "p", $Cy_1$, $Cy_2$, $Cy_3$, $Cy_4$ and R are the same as defined in Formula 1.

In one or more embodiments, the polycyclic compound represented by Formula 1 may be represented by Formula 4-1 or Formula 4-2:

Formula 4-1

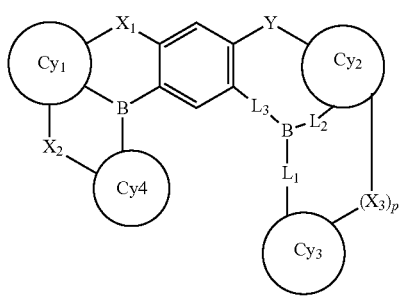

Formula 4-2

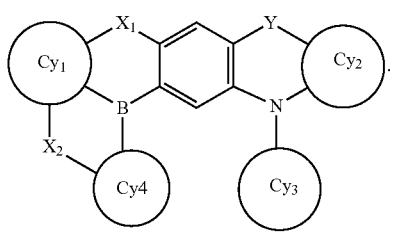

In Formula 4-1 and Formula 4-2, $X_1$, $X_2$, $X_3$, Y, $L_1$, $L_2$, $L_3$, $Cy_1$, $Cy_2$, $Cy_3$, and $Cy_4$ are the same as defined in Formula 1.

In one or more embodiments, the polycyclic compound represented by Formula 1 may be represented by any one selected from among Formula 5-1 to Formula 5-3:

Formula 5-1

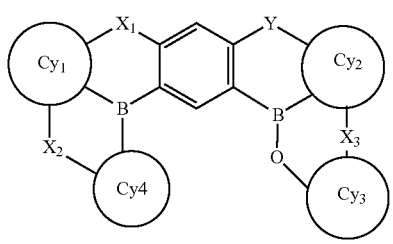

Formula 5-2

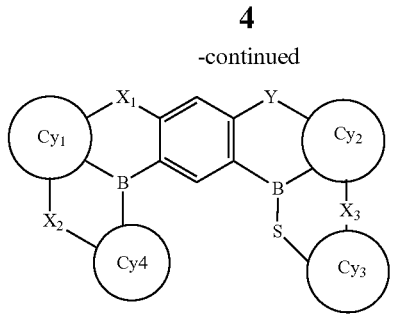

Formula 5-3

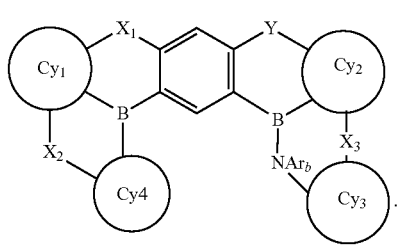

In Formula 5-1 to Formula 5-3, $X_1$, $X_2$, $X_3$, Y, $Cy_1$, $Cy_2$, $Cy_3$, $Cy_4$, and $Ar_b$ are the same as defined in Formula 1.

In one or more embodiments, $Cy_1$, $Cy_2$, $Cy_3$, and $Cy_4$ may be each independently a substituted or unsubstituted aromatic hydrocarbon ring of 6 to 20 ring-forming carbon atoms.

In one or more embodiments, the polycyclic compound represented by Formula 1 may be represented by Formula 6:

Formula 6

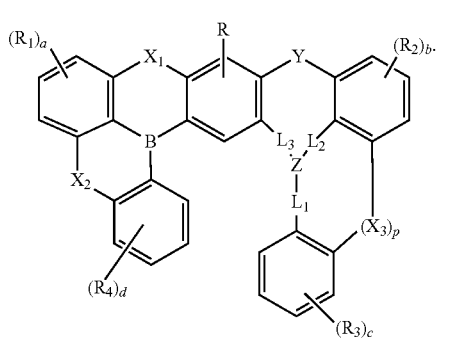

In Formula 6, $R_1$, $R_2$, $R_3$, and $R_4$ may be each independently a hydrogen atom, a deuterium atom, a halogen atom, a cyano group, a substituted or unsubstituted nitro group, a substituted or unsubstituted amine group, a substituted or unsubstituted alkoxy group of 1 to 20 carbon atoms, a substituted or unsubstituted alkyl group of 1 to 30 carbon atoms, a substituted or unsubstituted alkenyl group of 2 to 30 carbon atoms, a substituted or unsubstituted aryl group of 6 to 50 ring-forming carbon atoms, or a substituted or unsubstituted heteroaryl group of 2 to 50 ring-forming carbon atoms, and/or may be combined with an adjacent group to form a ring; "a" and "b" may be each independently an integer of 0 to 3; "c" and "d" may be each independently an integer of 0 to 4; and $X_1$, $X_2$, $X_3$, Y, Z, $L_1$, $L_2$, $L_3$, "p", and R are the same as defined in Formula 1.

In one or more embodiments, $R_1$ and $R_2$ may be each independently a substituted or unsubstituted diphenyl amine group, or a substituted or unsubstituted carbazole group.

In one or more embodiments, $R_3$ may be a hydrogen atom, a deuterium atom, a substituted or unsubstituted phenyl group, or a substituted or unsubstituted biphenyl group.

In one or more embodiments, $R_4$ may be a hydrogen atom or a deuterium atom.

In one or more embodiments, $Ar_a$ and $Ar_b$ may be each independently a substituted or unsubstituted phenyl group, or a substituted or unsubstituted biphenyl group.

In one or more embodiments, the polycyclic compound represented by Formula 1 may be represented by any one selected from among polycyclic compounds in Compound Group 1:

Compound Group 1

(A-1)
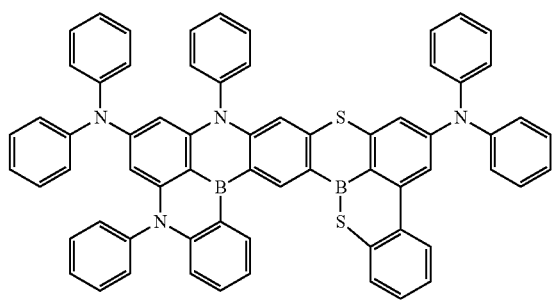

(A-5)
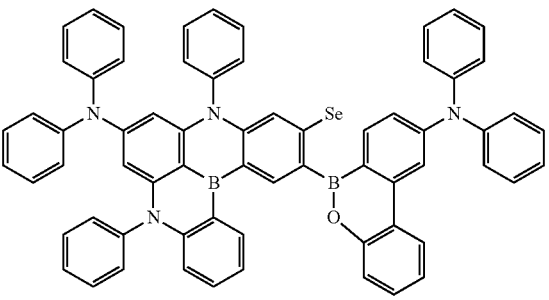

(A-2)
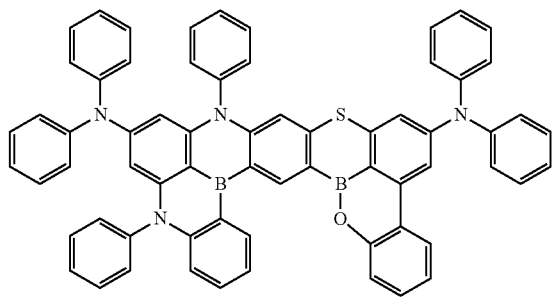

(A-6)
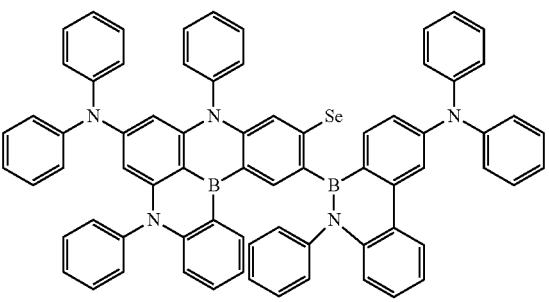

(A-3)
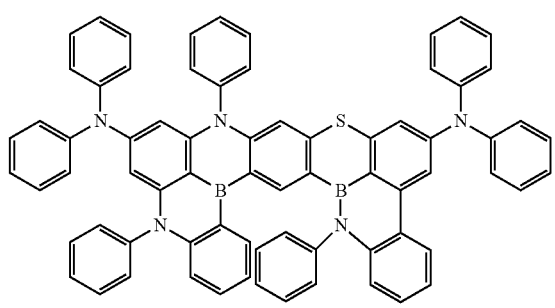

(A-7)
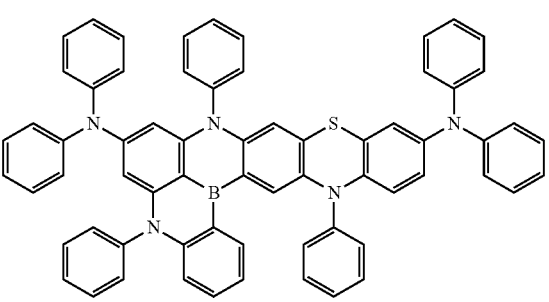

(A-4)
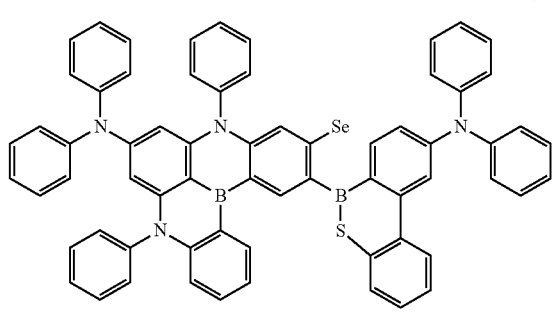

(A-8)
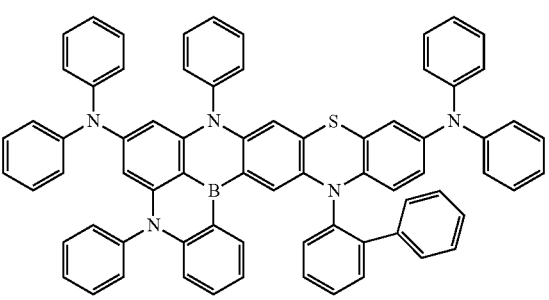

(A-9)
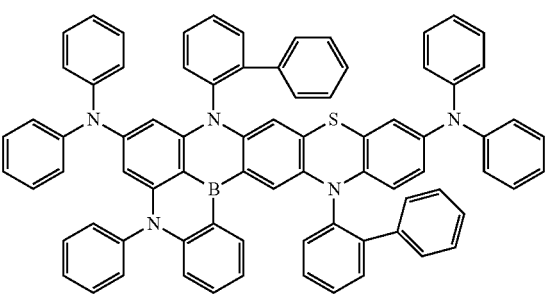

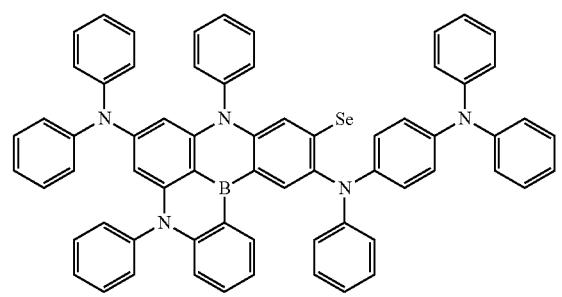
(A-10)
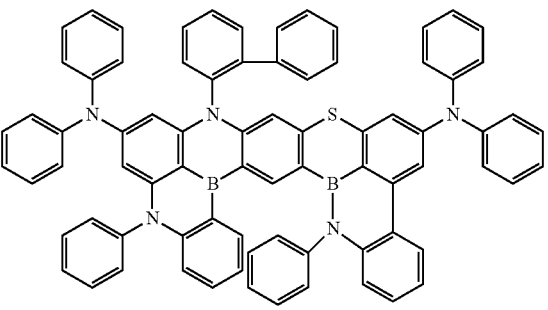
(A-15)
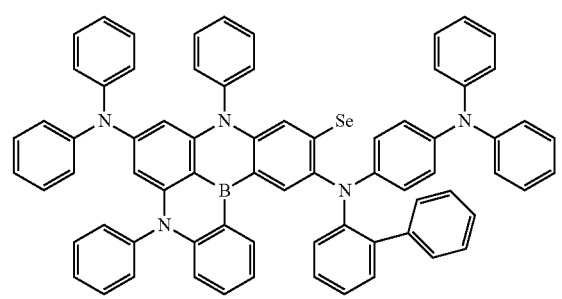
(A-11)
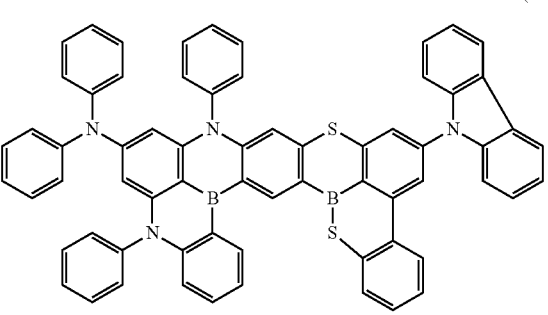
(B-1)
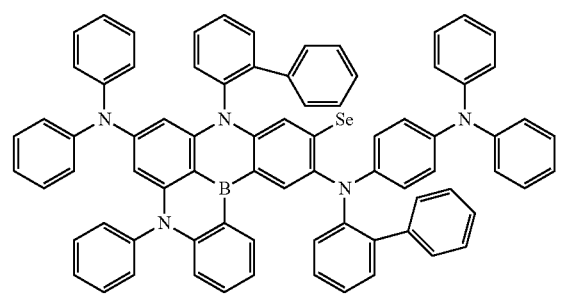
(A-12)
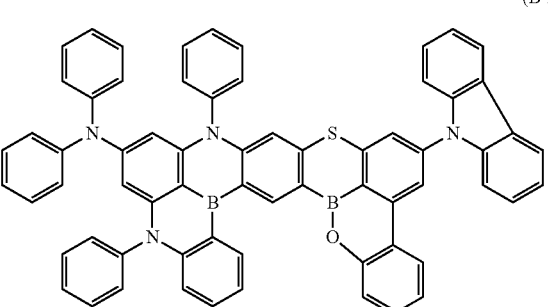
(B-2)
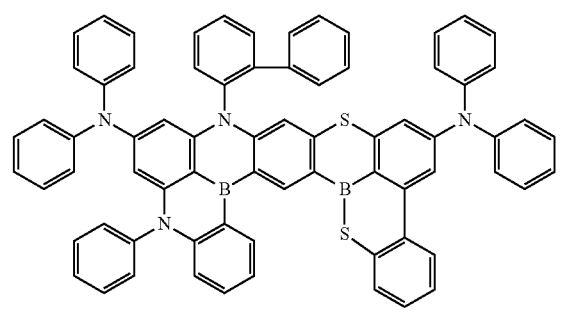
(A-13)
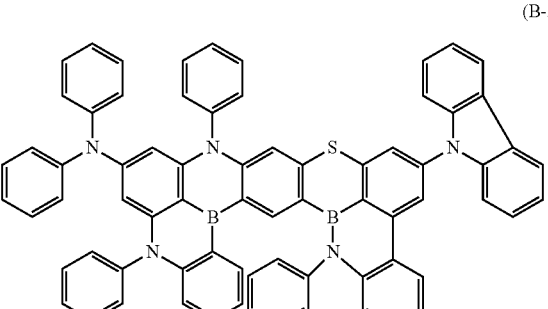
(B-3)
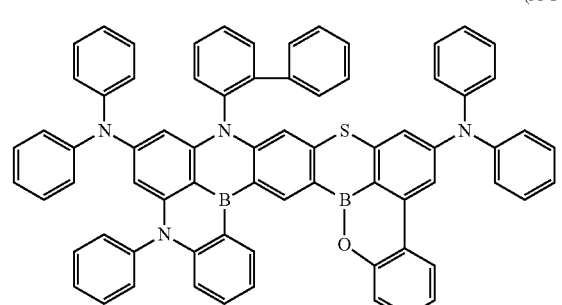
(A-14)
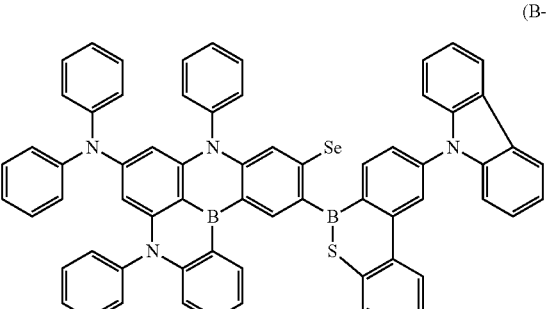
(B-4)

(B-5)
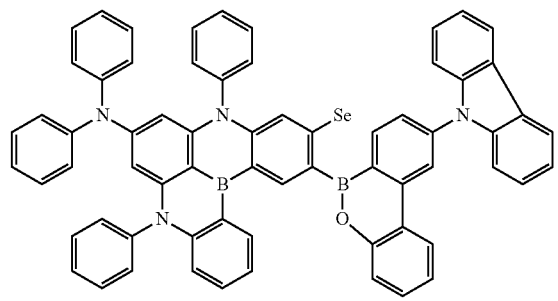
(B-6)
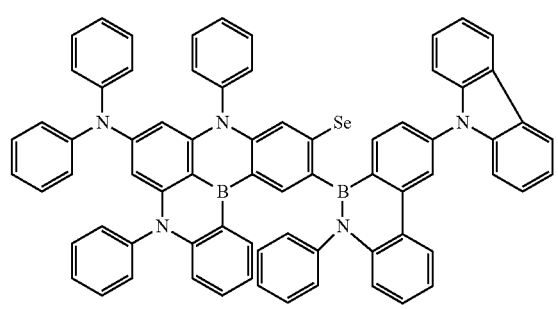
(B-7)
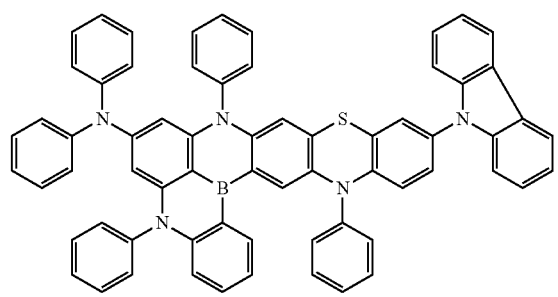
(B-8)
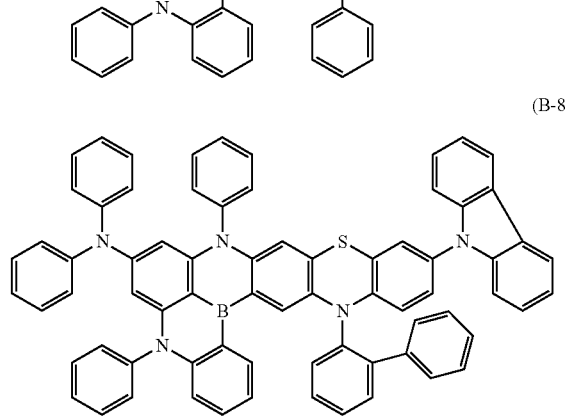
(B-9)
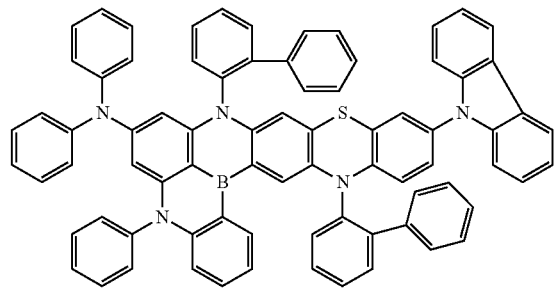
(B-10)
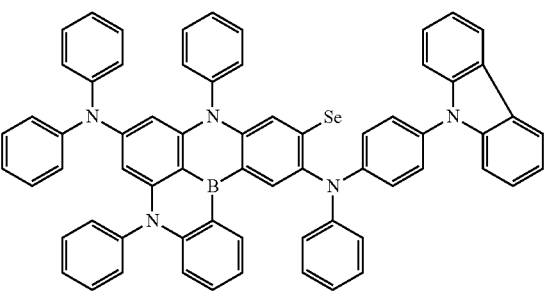
(B-11)
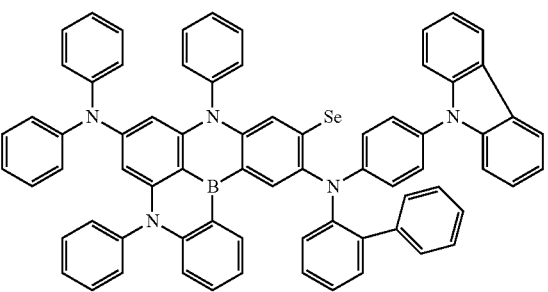
(B-12)
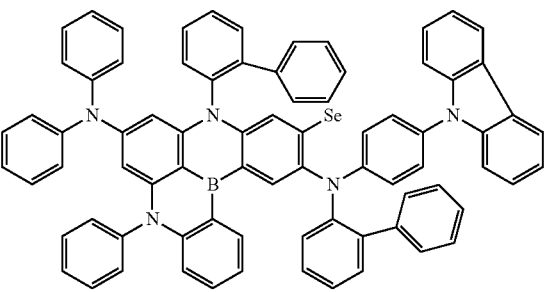
(B-13)
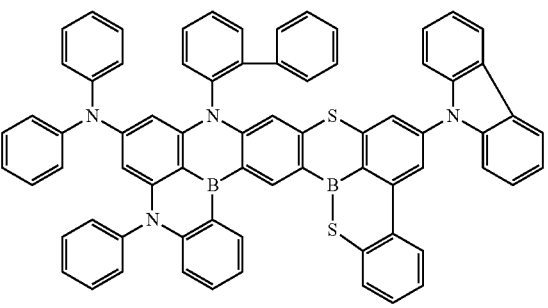
(B-14)
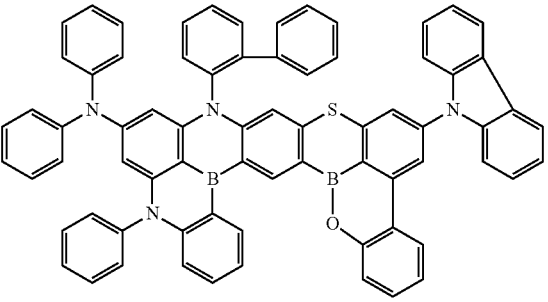

(B-15)
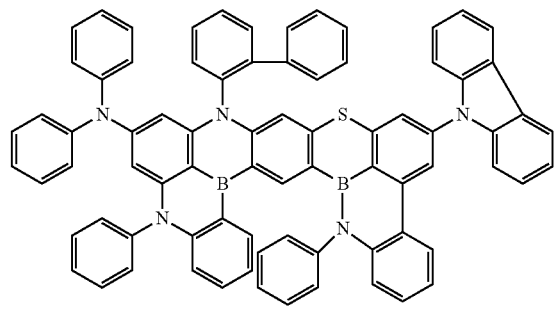
(C-1)
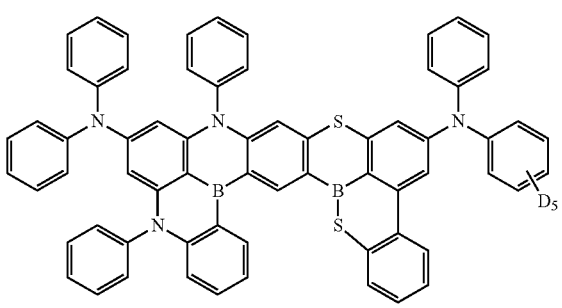
(C-2)
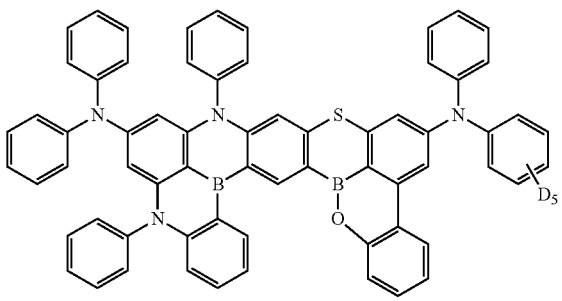
(C-3)
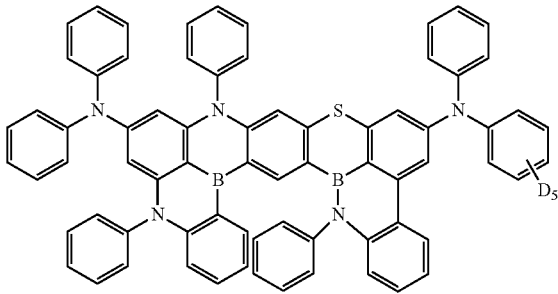
(C-4)
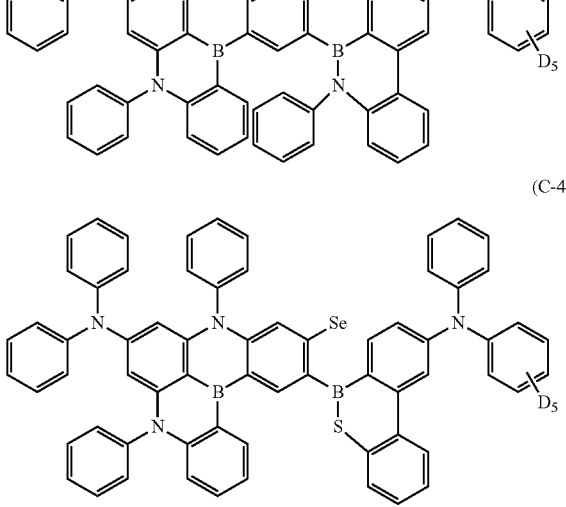
(C-5)
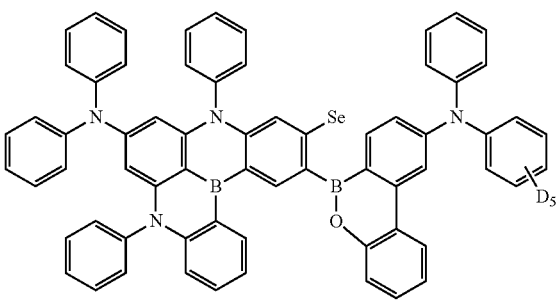
(C-6)
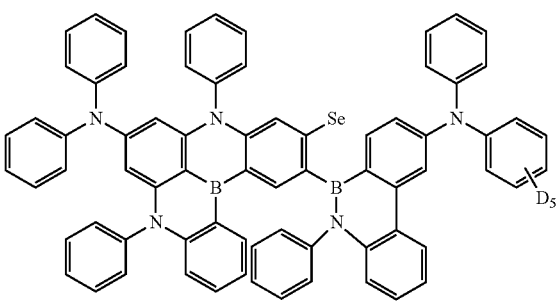
(C-7)
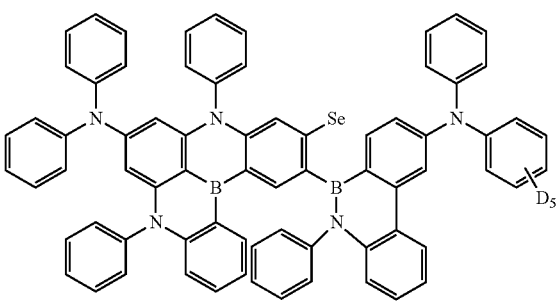
(C-8)
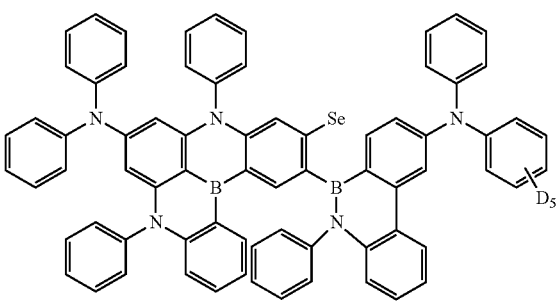
(C-9)
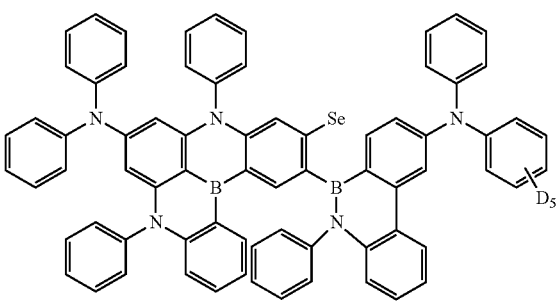

(C-10)
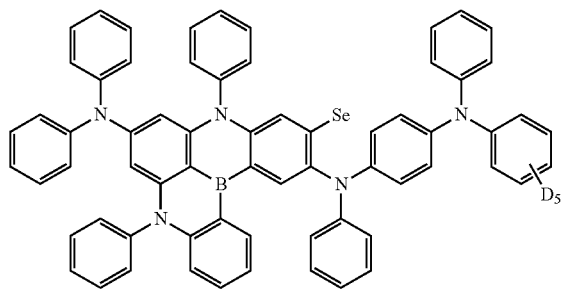

(C-11)
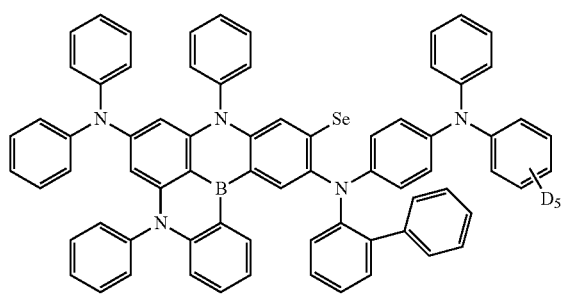

(C-12)
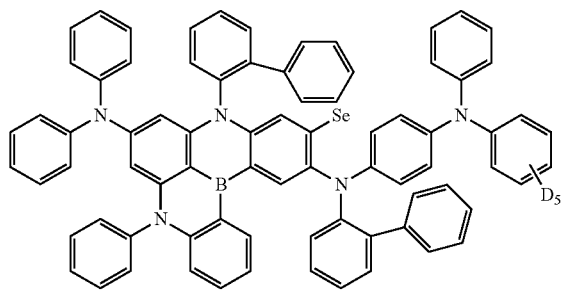

(C-13)
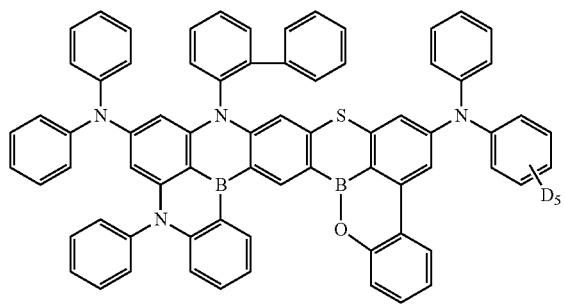

(C-14)

(C-15)
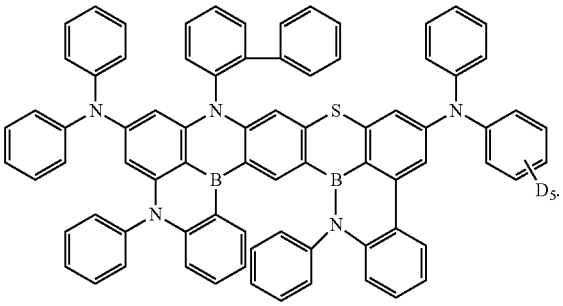

A light emitting diode according to the present disclosure includes: a first electrode; a second electrode opposite the first electrode; an emission layer between the first electrode and the second electrode, the emission layer including a polycyclic compound represented by Formula 1, and a hole transport region between the first electrode and the second electrode and including a compound represented by Formula E-2b:

Formula E-2b

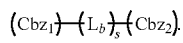

In Formula E-2b, Cbz1 and Cbz2 may be each independently a substituted or unsubstituted carbazole group; $L_b$ may be a direct linkage, a substituted or unsubstituted arylene group of 6 to 30 ring-forming carbon atoms, or a substituted or unsubstituted heteroarylene group of 2 to 30 ring-forming carbon atoms; and "s" is an integer of 0 to 10.

Formula 1

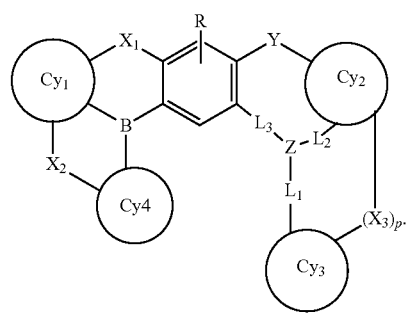

In Formula 1, $X_1$, $X_2$, and $X_3$ may be each independently a direct linkage, *—O—*, *—S—*, *—CO—*, *—SO$_2$—*, or *—NAr$_a$—*; Y may be *—S—* or *—Se—*; Z may be *—B—* or *—N—*; $L_1$, $L_2$ and $L_3$ may be each independently a direct linkage, *—O—*, *—S—*, or *—NAr$_b$—*, where if Z is *—N—*, $L_1$, $L_2$ and $L_3$ are each a direct linkage, and if Z is *—B—*, any two selected from among $L_1$, $L_2$ and $L_3$ are direct linkages, and the remaining one may be *—O—*, *—S—*, or *—NAr$_b$—*; p may be 0 or 1, where if Z is *—B—*, p is 1, and if Z is *—N—*, p is 0; $Cy_1$, $Cy_2$, $Cy_3$, and $Cy_4$ may be each independently a substituted or unsubstituted aromatic hydrocarbon ring of 6 to 30 ring-forming carbon atoms, or a substituted or unsubstituted aromatic heterocycle of 2 to 30 ring-forming carbon atoms; $Ar_a$ and $Ar_b$ may be each independently a substituted or unsubstituted aryl group of 6 to 30 ring-forming carbon atoms, or a substituted or unsubstituted heteroaryl group of 2 to 30 ring-forming carbon atoms; and R may be a hydrogen atom, a deuterium atom, a halogen atom, a cyano group, a substituted or unsubstituted nitro group, a substituted or unsubstituted amine group, a substituted or unsubstituted alkoxy group of 1 to 20 carbon atoms, a substituted or unsubstituted alkyl group of 1 to 30 carbon atoms, a substituted or unsubstituted alkenyl group of 2 to 30 carbon atoms, a substituted or unsubstituted aryl group of 6 to 50 ring-forming carbon atoms, or a substituted or unsubstituted heteroaryl group of 2 to 50 ring-forming carbon atoms, and/or may be combined with an adjacent group to form a ring.

In one or more embodiments, the emission layer may include a dopant and a host, and the dopant may include the polycyclic compound represented by Formula 1.

In one or more embodiments, the emission layer may emit blue light.

In one or more embodiments, the emission layer may emit thermally activated delayed fluorescence (TADF).

In one or more embodiments, the hole transport region may include a hole transport layer and a hole injection layer, and the hole transport layer may include the compound represented by Formula E-2b.

A light emitting diode according to the present disclosure includes: a first electrode; a second electrode opposite the first electrode; and at least one functional layer between the first electrode and the second electrode, the at least one functional layer including a polycyclic compound represented by Formula A or Formula B, wherein the first electrode and the second electrode each independently includes at least one selected among Ag, Mg, Cu, Al, Pt, Pd, Au, Ni, Nd, Ir, Cr, Li, Ca, LiF, Mo, Ti, W, In, Sn, Zn, compounds thereof, and mixtures thereof.

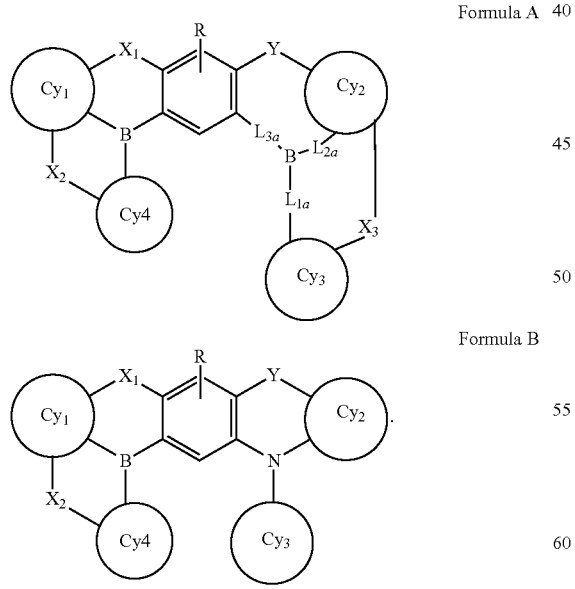

Formula A

Formula B

In Formula A and Formula B, $X_1$, $X_2$, and $X_3$ may be each independently a direct linkage, *—O—*, *—S—*, *—CO—*, *—SO$_2$—*, or *—NAr$_a$—*; Y may be *—S—* or *—Se—*; $L_{1a}$, $L_{2a}$ and $L_{3a}$ may be each independently a direct linkage, *—O—*, *—S—*, or *—NAr$_b$—*, where any two selected from among $L_{1a}$, $L_{2a}$ and $L_{3a}$ are direct linkages, and the remaining one may be *—O—*, *—S—*, or *—NAr$_b$—*; $Cy_1$, $Cy_2$, $Cy_3$, and $Cy_4$ may be each independently a substituted or unsubstituted aromatic hydrocarbon ring of 6 to 30 ring-forming carbon atoms, or a substituted or unsubstituted aromatic heterocycle of 2 to 30 ring-forming carbon atoms; $Ar_a$ and $Ar_b$ may be each independently a substituted or unsubstituted aryl group of 6 to 30 ring-forming carbon atoms, or a substituted or unsubstituted heteroaryl group of 2 to 30 ring-forming carbon atoms; and R may be a hydrogen atom, a deuterium atom, a halogen atom, a cyano group, a substituted or unsubstituted nitro group, a substituted or unsubstituted amine group, a substituted or unsubstituted alkoxy group of 1 to 20 carbon atoms, a substituted or unsubstituted alkyl group of 1 to 30 carbon atoms, a substituted or unsubstituted alkenyl group of 2 to 30 carbon atoms, a substituted or unsubstituted aryl group of 6 to 50 ring-forming carbon atoms, or a substituted or unsubstituted heteroaryl group of 2 to 50 ring-forming carbon atoms, and/or may be combined with an adjacent group to form a ring.

In one or more embodiments, the polycyclic compound represented by Formula A may be represented by Formula A-1 or Formula A-2:

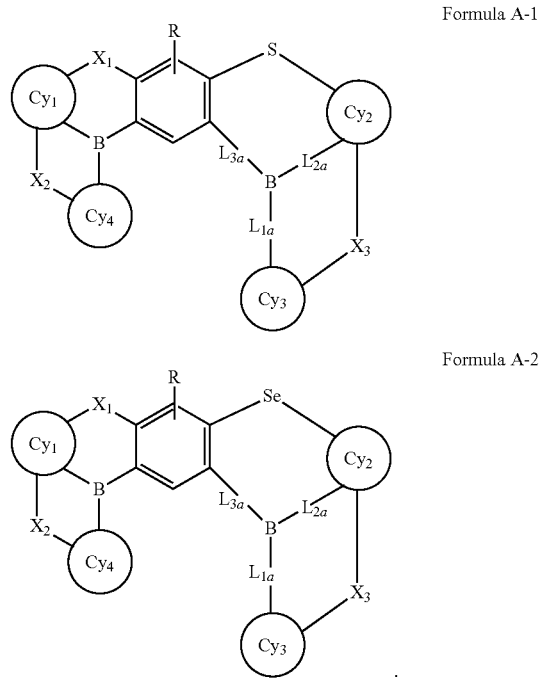

Formula A-1

Formula A-2

In Formula A-1 and Formula A-2, $X_1$, $X_2$, $X_3$, $L_{1a}$, $L_{2a}$, $L_{3a}$, $Cy_1$, $Cy_2$, $Cy_3$, $Cy_4$, and R are the same as defined in Formula A and Formula B.

In one or more embodiments, the polycyclic compound represented by Formula B may be represented by Formula B-1 or Formula B-2:

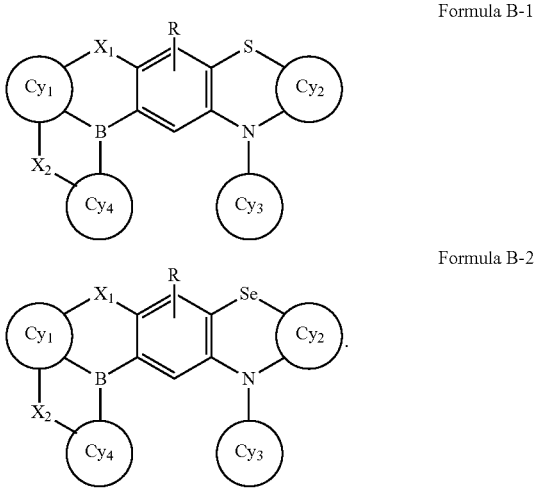

Formula B-1

Formula B-2

In Formula B-1 and Formula B-2, $X_1$, $X_2$, $Cy_1$, $Cy_2$, $Cy_3$, $Cy_4$, and R are the same as defined in Formula A and Formula B.

BRIEF DESCRIPTION OF THE FIGURES

The accompanying drawings are included to provide a further understanding of the present disclosure and are incorporated in and constitute a part of this specification. The drawings illustrate embodiments of the present disclosure and, together with the description, serve to explain principles of the present disclosure. In the drawings.

DETAILED DESCRIPTION

Figure 1:
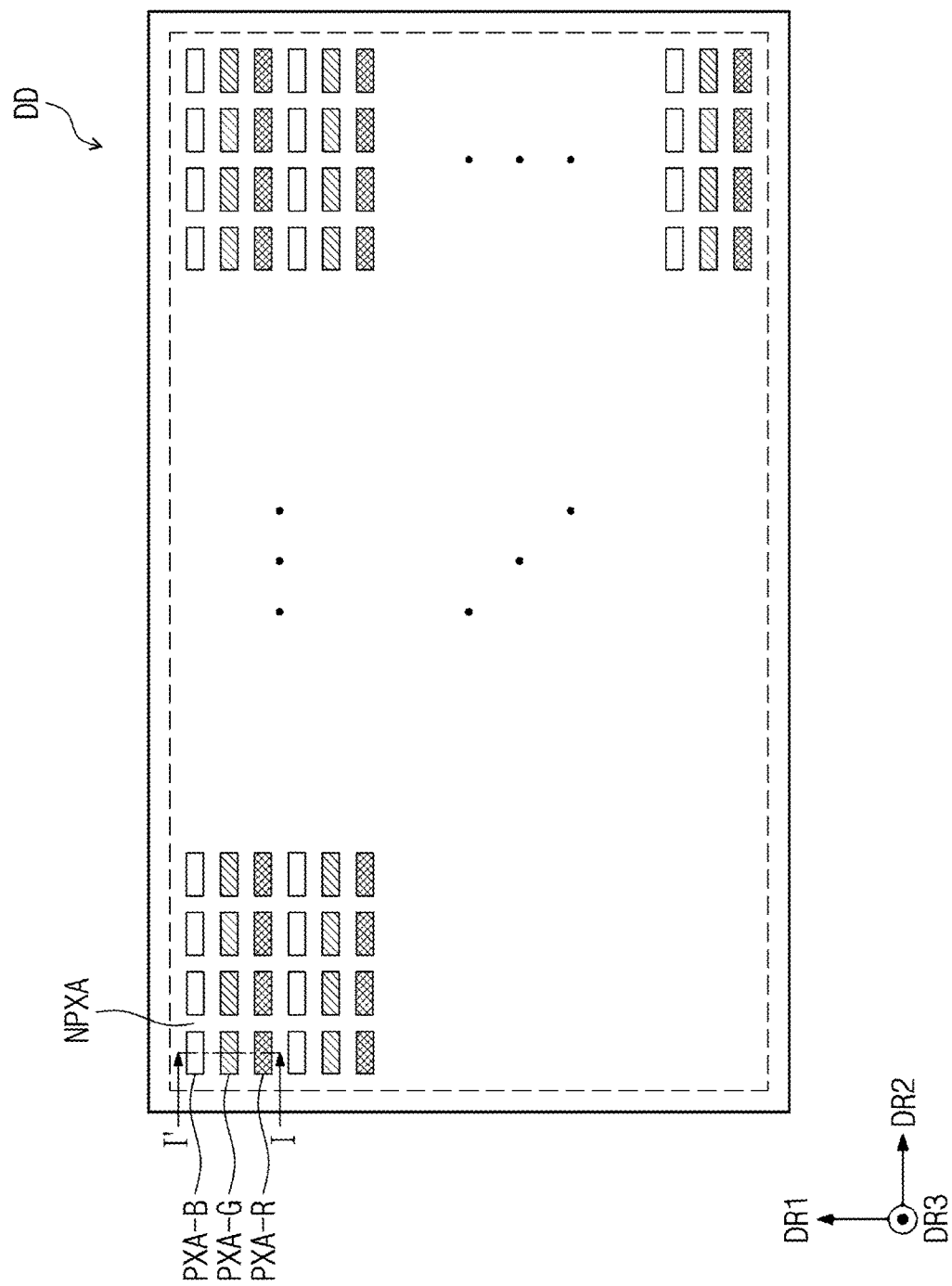
FIG. 1 is a plan view showing a display apparatus of one or more embodiments.

The present disclosure may have various modifications and may be embodied in different forms, and example embodiments will be explained in more detail with reference to the accompany drawings. The present disclosure may, however, be embodied in different forms and should not be construed as limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

In the description, it will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

In the description, when a layer, a film, a region, a plate, etc. is referred to as being "on" or "above" another part, it can be "directly on" the other part (e.g., without any intervening layers therebetween), or intervening layers may also be present. When a layer, a film, a region, a plate, etc. is referred to as being "under" or "below" another part, it can be "directly under" the other part (e.g., without any intervening layers therebetween), or intervening layers may also be present. Also, when an element is referred to as being disposed "on" another element, it can be disposed under the other element.

In the description, the term "substituted or unsubstituted" corresponds to a group that is unsubstituted or that is substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the exemplified substituents may itself be substituted or unsubstituted. For example, a biphenyl group may be interpreted as an aryl group or a phenyl group substituted with a phenyl group.

In the description, the term "forming a ring via the combination with an adjacent group" may mean forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocycles or polycycles. In addition, the ring formed via the combination with an adjacent group may be combined with another ring to form a spiro structure.

In the description, the term "adjacent group" may mean a pair of substituent groups where the first substituent is connected to an atom which is directly connected to another atom substituted with the second substituent; a pair of substituent groups connected to the same atom; or a pair of substituent groups where the first substituent is sterically positioned at the nearest position to the second substituent. For example, in 1,2-dimethylbenzene, two methyl groups may be interpreted as "adjacent groups" to each other, and in 1,1-diethylcyclopentane, two ethyl groups may be interpreted as "adjacent groups" to each other. In addition, in 4,5-dimethylphenanthrene, two methyl groups may be interpreted as "adjacent groups" to each other.

In the description, a halogen atom may be a fluorine atom, a chlorine atom, a bromine atom, and/or an iodine atom.

In the description, an alkyl group may be a linear, branched, or cyclic alkyl group. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, a cycloalkyl group may mean a cyclic alkyl group. The carbon number of the cycloalkyl group may be 3 to 50, 3 to 30, 3 to 20, or 3 to 10. Examples of the cycloalkyl group may include a cyclopropyl group, a cyclobutyl group, a cyclopentyl group, a cyclohexyl group, a 4-methylcyclohexyl group, a 4-t-butylcyclohexyl group, a cycloheptyl group, a cyclooctyl group, a cyclononyl group, a cyclodecyl group, a norbornyl group, a 1-adamantyl group, a 2-adamantyl group, an isobornyl group, a bicycloheptyl group, etc., without limitation.

In the description, an alkenyl group means a hydrocarbon group including one or more carbon-carbon double bonds in the middle and/or at the terminal of an alkyl group having a carbon number of 2 or more. The alkenyl group may be a linear chain or a branched chain. The carbon number of the alkenyl group is not specifically limited, but may be 2 to 30, 2 to 20, or 2 to 10. Examples of the alkenyl group may include a vinyl group, a 1-butenyl group, a 1-pentenyl group, a 1,3-butadienyl group, a styrenyl group, a styrylvinyl group, etc., without limitation.

In the description, an alkynyl group means a hydrocarbon group including one or more carbon-carbon triple bonds in the middle and/or at the terminal of an alkyl group having a carbon number of 2 or more. The alkynyl group may be a linear chain or a branched chain. The carbon number of the alkynyl group is not specifically limited, but may be 2 to 30, 2 to 20, or 2 to 10. Examples of the alkynyl group may include an ethynyl group, a propynyl group, etc., without limitation.

In the description, a hydrocarbon ring group means an optional functional group or substituent derived from an aliphatic hydrocarbon ring. The hydrocarbon ring group may be a saturated hydrocarbon ring group of 5 to 20 ring-forming carbon atoms.

In the description, an aryl group means an optional functional group or substituent derived from an aromatic hydrocarbon ring. The aryl group may be a monocyclic aryl group or a polycyclic aryl group. The carbon number for forming rings in the aryl group may be 6 to 50, 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the description, a fluorenyl group may be substituted, and two substituents may be combined with each other to form a spiro structure. Examples of a substituted fluorenyl group may be as follows, but one or more embodiments of the present disclosure are not limited thereto:

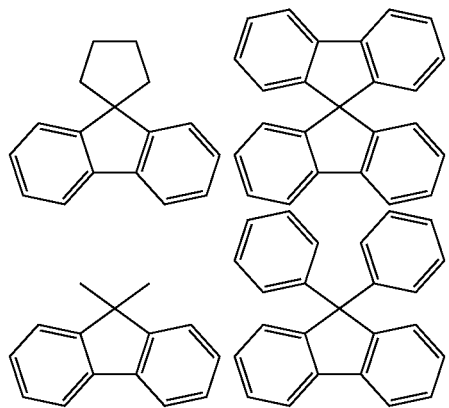

In the description, a heterocyclic group means an optional functional group or substituent derived from a ring including one or more selected from among B, O, N, P, Si, S and Se as heteroatom(s). The heterocyclic group includes an aliphatic heterocyclic group and an aromatic heterocyclic group. The aromatic heterocyclic group may be a heteroaryl group. The aliphatic heterocyclic group and the aromatic heterocyclic group may each independently be a monocycle or a polycycle. If the heterocyclic group includes two or more heteroatoms, two or more heteroatoms may be the same or different. The heterocyclic group may be a monocyclic heterocyclic group or a polycyclic heterocyclic group, and has the concept including a heteroaryl group. The carbon number for forming rings of the heterocyclic group may be 6 to 50, 2 to 30, 2 to 20, and 2 to 10.

In the description, an aliphatic heterocyclic group may include one or more selected from among B, O, N, P, Si, S and Se as heteroatoms. The number of ring-forming carbon atoms of the aliphatic heterocyclic group may be 6 to 50, 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the description, a heteroaryl group may include one or more selected from among B, O, N, P, Si, S and Se as heteroatoms. If the heteroaryl group includes two or more heteroatoms, two or more heteroatoms may be the same or different. The heteroaryl group may be a monocyclic heterocyclic group or a polycyclic heterocyclic group. The carbon number for forming rings of the heteroaryl group may be 6 to 50, 2 to 30, 2 to 20, or 2 to 10. Examples of the heteroaryl group may include thiophene group, furan group, pyrrole group, imidazole group, triazole group, pyridine group, bipyridine group, pyrimidine group, triazine group, triazole group, acridyl group, pyridazine group, pyrazinyl group, quinoline group, quinazoline group, quinoxaline group, phenoxazine group, phthalazine group, pyrido pyrimidine group, pyrido pyrazine group, pyrazino pyrazine group, isoquinoline group, indole group, carbazole group, N-arylcarbazole group, N-heteroarylcarbazole group, N-alkylcarbazole group, benzoxazole group, benzoimidazole group, benzothiazole group, benzocarbazole group, benzothiophene group, dibenzothiophene group, thienothiophene group, benzofuran group, phenanthroline group, thiazole group, isooxazole group, oxazole group, oxadiazole group, thiadiazole group, phenothiazine group, dibenzosilole group, dibenzofuran group, etc., without limitation.

In the description, the explanation for the aryl group may be applied to an arylene group except that the arylene group is a divalent group. The explanation for the heteroaryl group may be applied to a heteroarylene group except that the heteroarylene group is a divalent group.

In the description, a silyl group includes an alkyl silyl group and an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the description, the carbon number of an amino group is not specifically limited, but may be 1 to 30. The amino group may include an alkyl amino group, an aryl amino group, and a heteroaryl amino group. Examples of the amino group may include a methylamino group, a dimethylamino group, a phenylamino group, a diphenylamino group, a naphthylamino group, a 9-methyl-anthracenylamino group, etc., without limitation.

In the description, the carbon number of a carbonyl group is not specifically limited, but the carbon number may be 1 to 40, 1 to 30, or 1 to 20. For example, the carbonyl group may have the structures below, but is not limited thereto:

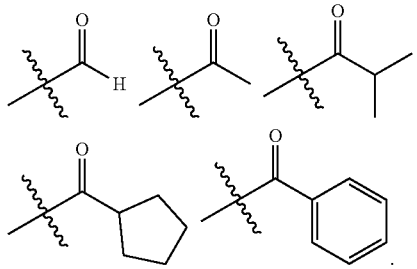

In the description, the carbon number of a sulfinyl group and sulfonyl group is not specifically limited, but may be 1 to 30. The sulfinyl group may include an alkyl sulfinyl group and an aryl sulfinyl group. The sulfonyl group may include an alkyl sulfonyl group and an aryl sulfonyl group.

In the description, a thio group may include an alkyl thio group and an aryl thio group. The thio group may mean the above-defined alkyl group or aryl group combined with a sulfur atom. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the description, an oxy group may mean the above-defined alkyl group or aryl group which is combined with an oxygen atom. The oxy group may include an alkoxy group and an aryl oxy group. The alkoxy group may be a linear, branched or cyclic chain. The carbon number of the alkoxy group is not specifically limited but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. However, one or more embodiments of the present disclosure are not limited thereto.

In the description, a boron group may mean the above-defined alkyl group or aryl group which is combined with a boron atom. The boron group includes an alkyl boron group and an aryl boron group. Examples of the boron group may include a dimethylboron group, a diethylboron group, a t-butylmethylboron group, a diphenylboron group, a phenylboron group, etc., without limitation.

In the description, the carbon number of an amine group is not specifically limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, etc., without limitation.

In the description, the alkyl group in the alkoxy group, alkylthio group, alkylsulfoxy group, alkylaryl group, alkylamino group, alkyl boron group, alkyl silyl group, and alkyl amine group may be the same as the examples of the above-described alkyl group.

In the description, the aryl group in the aryloxy group, arylthio group, arylsulfoxy group, aryl amino group, aryl boron group, aryl silyl group and aryl amine group may be the same as the examples of the above-described aryl group.

In the description, a direct linkage may mean a single bond.

In the description

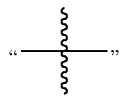

and "———✱" mean positions to be connected (e.g., binding sites to a corresponding formula).

As used herein, "disposed" may mean positioned and/or provided.

Hereinafter, embodiments of the present disclosure will be explained referring to the drawings.

Figure 2:
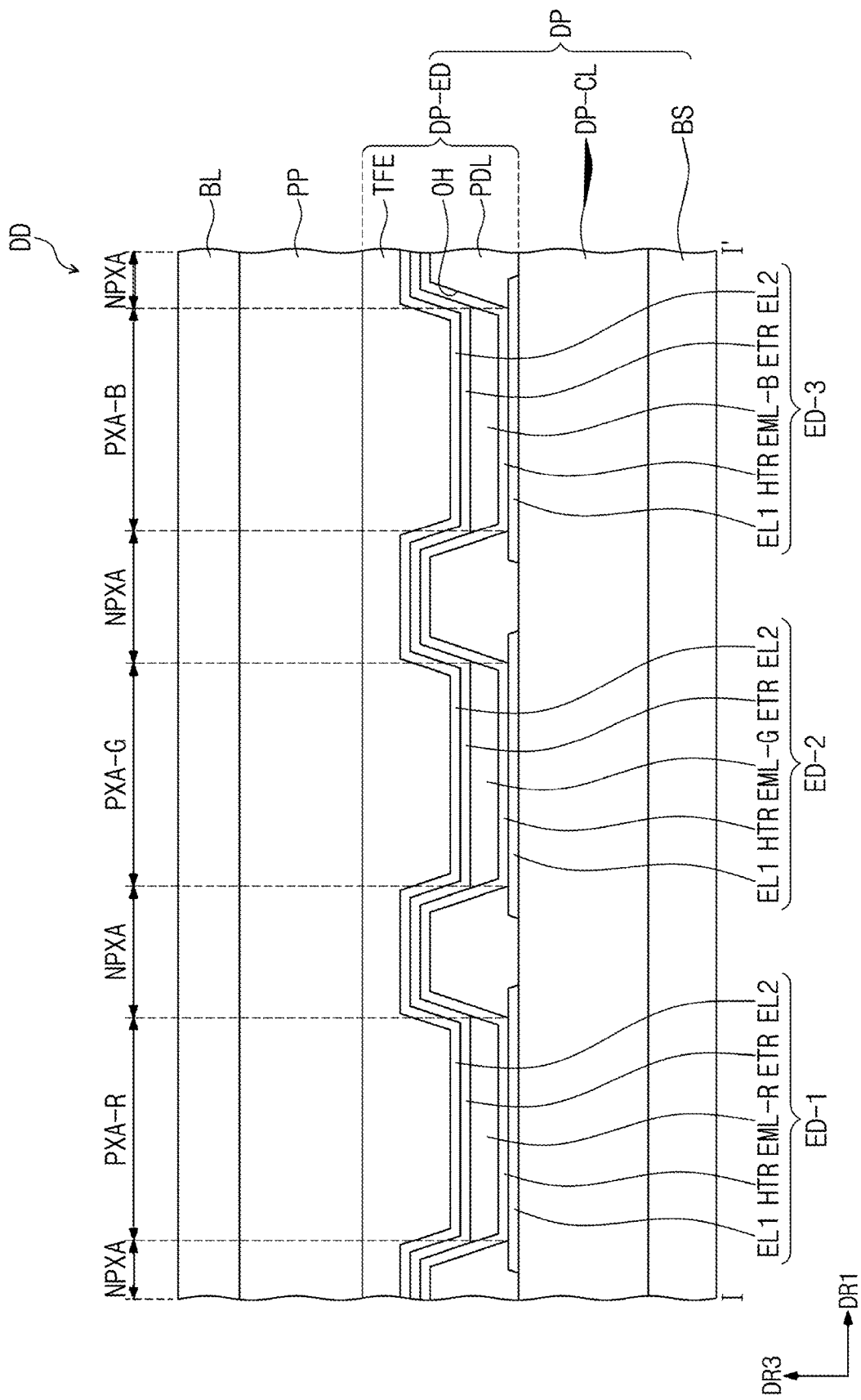
FIG. 2 is a cross-sectional view of a display apparatus according to one or more embodiments.

FIG. 1 is a plan view showing one or more embodiments of a display apparatus DD. FIG. 2 is a cross-sectional view of a display apparatus DD of one or more embodiments. FIG. 2 is a cross-sectional view showing a part corresponding to line I-I' in FIG. 1.

The display apparatus DD may include a display panel DP and an optical layer PP disposed on the display panel DP. The display panel DP includes light emitting diodes ED-1, ED-2 and ED-3. The display apparatus DD may include multiple light emitting diodes ED-1, ED-2 and ED-3. The optical layer PP may be disposed on the display panel DP and control reflected light by external light at the display panel DP. The optical layer PP may include, for example, a polarization layer and/or a color filter layer. In one or more embodiments, the optical layer PP may be omitted in the display apparatus DD of one or more embodiments.

On the optical layer PP, a base substrate BL may be disposed. The base substrate BL may be a member providing a base surface where the optical layer PP is disposed. The base substrate BL may be a glass substrate, a metal substrate, a plastic substrate, etc. However, embodiments of the present disclosure are not limited thereto, and the base substrate BL may be an inorganic layer, an organic layer, or a composite material layer (e.g., including an organic material and an inorganic material). In addition, different from the drawings, the base substrate BL may be omitted in one or more embodiments.

The display apparatus DD according to one or more embodiments may further include a filling layer. The filling layer may be disposed between a display device layer DP-ED and a base substrate BL. The filling layer may be an organic layer. The filling layer may include at least one selected from among an acrylic resin, a silicone-based resin and an epoxy-based resin.

The display panel DP may include a base layer BS, a circuit layer DP-CL provided on the base layer BS and a display device layer DP-ED. The display device layer DP-ED may include a pixel definition layer PDL, light emitting diodes ED-1, ED-2 and ED-3 disposed between the pixel definition layer PDL, and an encapsulating layer TFE disposed on the light emitting diodes ED-1, ED-2 and ED-3.

The base layer BS may be a member providing a base surface where the display device layer DP-ED is disposed. The base layer BS may be a glass substrate, a metal substrate, a plastic substrate, etc. However, one or more embodiments of the present disclosure are not limited thereto, and the base layer BS may be an inorganic layer, an organic layer or a composite material layer.

In one or more embodiments, the circuit layer DP-CL is disposed on the base layer BS, and the circuit layer DP-CL may include multiple transistors. Each of the multiple transistors may include a control electrode, an input electrode, and an output electrode. For example, the circuit layer DP-CL may include switching transistors and driving transistors for driving the light emitting diodes ED-1, ED-2 and ED-3 of the display device layer DP-ED.

Each of the light emitting diodes ED-1, ED-2 and ED-3 may have the structures of light emitting diodes ED of embodiments according to FIG. 3 to FIG. 6, which will be explained herein below. Each of the light emitting diodes ED-1, ED-2 and ED-3 may include a first electrode EL1, a hole transport region HTR, emission layers EML-R, EML-G and EML-B, an electron transport region ETR, and a second electrode EL2.

FIG. 2 illustrates one or more embodiments where the emission layers EML-R, EML-G and EML-B of light emitting diodes ED-1, ED-2 and ED-3 are positioned in opening portions OH defined in a pixel definition layer PDL, and a hole transport region HTR, an electron transport region ETR and a second electrode EL2 are provided as common layers in (e.g., over) all of the light emitting diodes ED-1, ED-2 and ED-3. However, one or more embodiments of the present disclosure are not limited thereto. In one or more embodiments, the hole transport region HTR and the electron transport region ETR may be patterned and provided in the opening portions OH defined in the pixel definition layer PDL. For example, in one or more embodiments, the hole transport region HTR, the emission layers EML-R, EML-G and EML-B, and the electron transport region ETR of the light emitting diodes ED-1, ED-2 and ED-3 may be patterned by an ink jet printing method and provided.

An encapsulating layer TFE may cover the light emitting diodes ED-1, ED-2 and ED-3. The encapsulating layer TFE may encapsulate elements (such as the light emitting diodes ED-1, ED-2 and ED-3) of the display device layer DP-ED. The encapsulating layer TFE may be a thin film encapsulating layer. The encapsulating layer TFE may be one layer or a stacked layer of multiple layers. The encapsulating layer TFE includes at least one insulating layer. The encapsulating layer TFE according to one or more embodiments may include at least one inorganic layer (hereinafter, encapsulating inorganic layer). In some embodiments, the encapsulating layer TFE according to one or more embodiments may include at least one organic layer (hereinafter, encapsulating organic layer) and at least one encapsulating inorganic layer.

The encapsulating inorganic layer protects the display device layer DP-ED from moisture/oxygen, and the encapsulating organic layer protects the display device layer DP-ED from foreign materials such as dust particles. The encapsulating inorganic layer may include silicon nitride, silicon oxy nitride, silicon oxide, titanium oxide, and/or aluminum oxide, without specific limitation. The encapsulating organic layer may include an acrylic-based compound, an epoxy-based compound, etc. The encapsulating organic layer may include a photopolymerizable organic material, without specific limitation.

The encapsulating layer TFE may be disposed on the second electrode EL2 and may be disposed while filling the opening portion(s) OH.

Referring to FIG. 1 and FIG. 2, the display apparatus DD may include a non-luminous area NPXA and luminous areas PXA-R, PXA-G and PXA-B. The luminous areas PXA-R, PXA-G and PXA-B may be areas emitting (e.g., to emit) light produced from the light emitting diodes ED-1, ED-2 and ED-3, respectively. The luminous areas PXA-R, PXA-G and PXA-B may be separated from each other on a plane (e.g., in a plan view).

The luminous areas PXA-R, PXA-G and PXA-B may be areas separated by the pixel definition layer PDL. The non-luminous areas NPXA may be areas between neighboring (e.g., adjacent) luminous areas PXA-R, PXA-G and PXA-B and may be areas corresponding to the pixel definition layer PDL. In one or more embodiments, each of the luminous areas PXA-R, PXA-G and PXA-B may correspond to each pixel. The pixel definition layer PDL may divide the light emitting diodes ED-1, ED-2 and ED-3. The emission layers EML-R, EML-G and EML-B of the light emitting diodes ED-1, ED-2 and ED-3 may be disposed and divided in the opening portions OH defined in the pixel definition layer PDL.

The luminous areas PXA-R, PXA-G and PXA-B may be divided into multiple groups according to the color of light produced from the light emitting diodes ED-1, ED-2 and ED-3. In the display apparatus DD of one or more embodiments shown in FIG. 1 and FIG. 2, three luminous areas PXA-R, PXA-G and PXA-B emitting (e.g., to emit) red light, green light and blue light are illustrated. For example, the display apparatus DD of one or more embodiments may include a red luminous area PXA-R, a green luminous area PXA-G and a blue luminous area PXA-B, which are separated from each other.

In the display apparatus DD according to one or more embodiments, multiple light emitting diodes ED-1, ED-2 and ED-3 may emit light having different wavelength regions. For example, in one or more embodiments, the display apparatus DD may include a first light emitting diode ED-1 emitting (e.g., to emit) red light, a second light emitting diode ED-2 emitting (e.g., to emit) green light, and a third light emitting diode ED-3 emitting (e.g., to emit) blue light. For example, the red luminous area PXA-R, the green luminous area PXA-G, and the blue luminous area PXA-B of the display apparatus DD may correspond to the first light emitting diode ED-1, the second light emitting diode ED-2, and the third light emitting diode ED-3, respectively.

However, one or more embodiments of the present disclosure are not limited thereto, and the first to third light emitting diodes ED-1, ED-2 and ED-3 may emit light in the same wavelength region, or at least one thereof may emit light in a different wavelength region. For example, all of the first to third light emitting diodes ED-1, ED-2 and ED-3 may emit blue light.

The luminous areas PXA-R, PXA-G and PXA-B in the display apparatus DD according to one or more embodiments may be arranged in a stripe shape or pattern. Referring to FIG. 1, multiple red luminous areas PXA-R may be arranged with each other along a second directional axis DR2, multiple green luminous areas PXA-G may be arranged with each other along a second directional axis DR2, and multiple blue luminous areas PXA-B may be arranged with each other along a second directional axis DR2. In addition, the red luminous area PXA-R, the green luminous area PXA-G and the blue luminous area PXA-B may be arranged by turns (e.g., alternatingly) with each other along a first directional axis DR1.

In FIG. 1 and FIG. 2, the areas of the luminous areas PXA-R, PXA-G and PXA-B are shown to be the same, but one or more embodiments of the present disclosure are not limited thereto. The areas of the luminous areas PXA-R, PXA-G and PXA-B may be different from each other according to the wavelength region of light emitted. In one or more embodiments, the areas of the luminous areas PXA-R, PXA-G and PXA-B may mean areas on a plane defined by the first directional axis DR1 and the second directional axis DR2 (e.g., in a plan view).

In one or more embodiments, the arrangement structure of the luminous areas PXA-R, PXA-G and PXA-B is not limited to the configuration shown in FIG. 1, and the arrangement order of the red luminous areas PXA-R, the green luminous areas PXA-G and the blue luminous areas PXA-B may be provided in various suitable combinations according to the properties of display quality required (or desired) for the display apparatus DD. For example, the arrangement of the luminous areas PXA-R, PXA-G and PXA-B may be a pentile (PENTILE™) arrangement, or a diamond (Diamond Pixel™) arrangement, without limitation.

In one or more embodiments, the areas of the luminous areas PXA-R, PXA-G and PXA-B may be different from each other. For example, in one or more embodiments, the area of the green luminous area PXA-G may be smaller than the area of the blue luminous area PXA-B, but one or more embodiments of the present disclosure are not limited thereto.

Hereinafter, FIG. 3 to FIG. 6 are cross-sectional views schematically showing light emitting diodes ED according to embodiments. The light emitting diode ED according to one or more embodiments may include a first electrode EL1, a hole transport region HTR, an emission layer EML, an electron transport region ETR, and a second electrode EL2 stacked in order.

Figure 3:
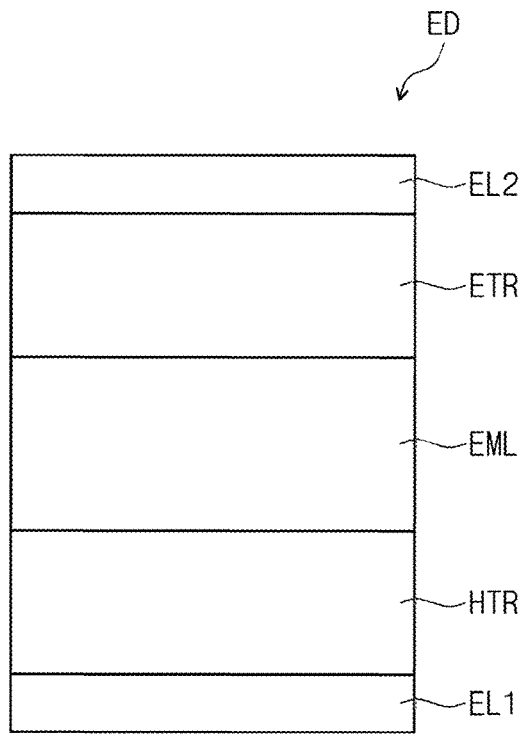
FIG. 3 is a cross-sectional view schematically showing a light emitting diode according to one or more embodiments.
Figure 4:
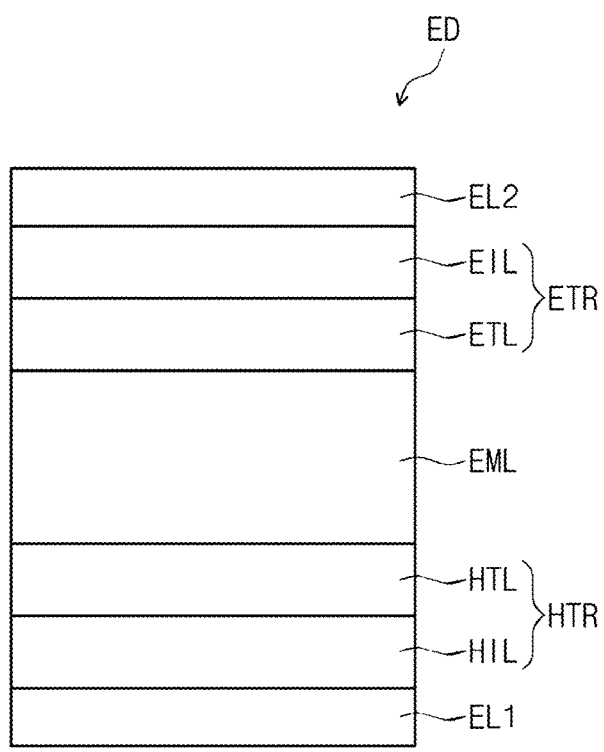
FIG. 4 is a cross-sectional view schematically showing a light emitting diode according to one or more embodiments.
Figure 5:
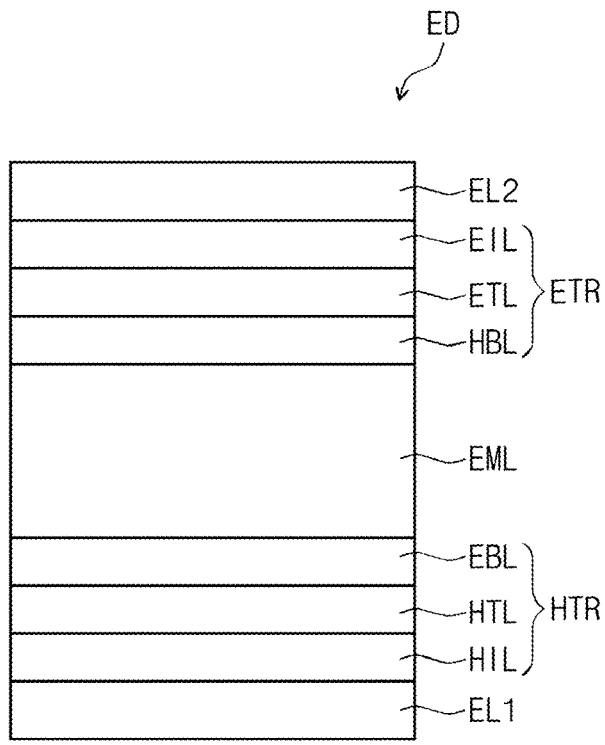
FIG. 5 is a cross-sectional view schematically showing a light emitting diode according to one or more embodiments.
Figure 6:
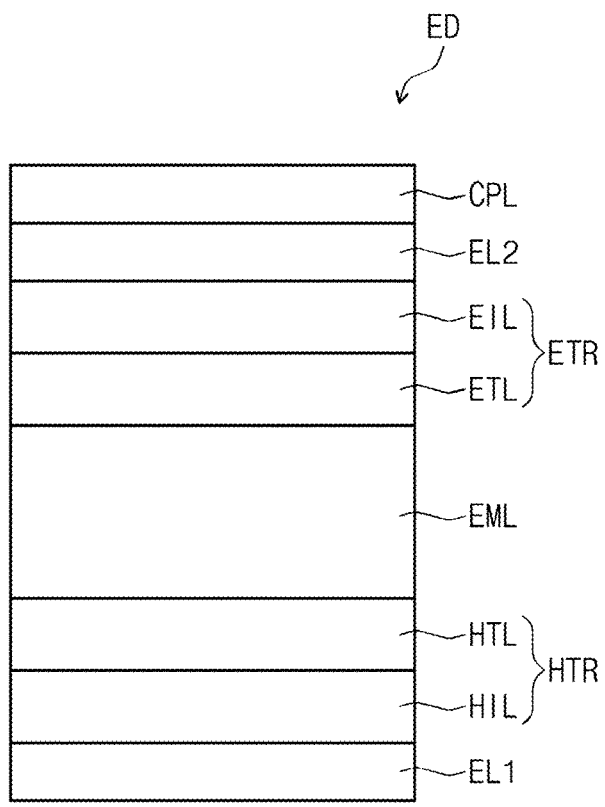
FIG. 6 is a cross-sectional view schematically showing a light emitting diode according to one or more embodiments.

When compared with FIG. 3, FIG. 4 shows the cross-sectional view of a light emitting diode ED of one or more embodiments, wherein a hole transport region HTR includes a hole injection layer HIL and a hole transport layer HTL, and an electron transport region ETR includes an electron injection layer EIL and an electron transport layer ETL. When compared with FIG. 3, FIG. 5 shows the cross-sectional view of a light emitting diode ED of one or more embodiments, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 4, FIG. 6 shows the cross-sectional view of a light emitting diode ED of one or more embodiments, further including a capping layer CPL disposed on the second electrode EL2.

The first electrode EL1 has conductivity. The first electrode EL1 may be formed using a metal material, a metal alloy, or any suitable conductive compound. The first electrode EL1 may be an anode or a cathode. However, one or more embodiments of the present disclosure are not limited thereto. In one or more embodiments, the first electrode EL1 may be a pixel electrode. The first electrode EL1 may be a transmissive electrode, a transflective electrode, or a reflective electrode. If the first electrode EU is the transmissive electrode, the first electrode EL1 may include a transparent metal oxide such as indium tin oxide (ITO), indium zinc oxide (IZO), zinc oxide (ZnO), and/or indium tin zinc oxide (ITZO). If the first electrode EU is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, compounds thereof, or mixtures thereof (for example, a mixture of Ag and Mg). In one or more embodiments, the first electrode EL1 may have a structure including multiple layers including a reflective layer or a transflective layer formed using any of the above materials, and a transmissive conductive layer formed using ITO, IZO, ZnO, and/or ITZO. For example, the first electrode EL1 may include a three-layer structure of ITO/Ag/ITO. However, one or more embodiments of the present disclosure are not limited thereto. The first electrode EL1 may include the above-described metal materials, combinations of two or more metal materials selected from the above-described metal materials, and/or oxides of the above-described metal materials. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a buffer layer, an emission auxiliary layer, or an electron blocking layer EBL. The thickness of the hole transport region HTR may be from about 50 Å to about 15,000 Å.

The hole transport region HTR may have a single layer formed using a single material, a single layer formed using multiple different materials, or a multilayer structure including multiple layers formed using multiple different materials.

For example, the hole transport region HTR may have the structure of a single layer of a hole injection layer HIL or a hole transport layer HTL, and may have a structure of a single layer formed using a hole injection material or a hole transport material. In one or more embodiments, the hole transport region HTR may have a structure of a single layer formed using multiple different materials, or a structure stacked from the first electrode EU of hole injection layer HIL/hole transport layer HTL, hole injection layer HIL/hole transport layer HTL/buffer layer, hole injection layer HIL/buffer layer, hole transport layer HTL/buffer layer, or hole injection layer HIL/hole transport layer HTL/electron blocking layer EBL, without limitation.

The hole transport region HTR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1 below:

Formula H-1

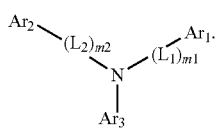

In Formula H-1 above, $L_1$ and $L_2$ may be each independently a direct linkage, a substituted or unsubstituted arylene group of 6 to 30 ring-forming carbon atoms, or a substituted or unsubstituted heteroarylene group of 2 to 30 ring-forming carbon atoms. "m1" and "m2" may be each independently an integer of 0 to 10. In one or more embodiments, if "m1" or "m2" is an integer of 2 or more, multiple $L_1$ and $L_2$ may be each independently a substituted or unsubstituted arylene group of 6 to 30 ring-forming carbon atoms, or a substituted or unsubstituted heteroarylene group of 2 to 30 ring-forming carbon atoms.

In Formula H-1, $Ar_1$ and $Ar_2$ may be each independently a substituted or unsubstituted aryl group of 6 to 30 ring-forming carbon atoms, or a substituted or unsubstituted heteroaryl group of 2 to 30 ring-forming carbon atoms. In Formula H-1, $Ar_3$ may be a substituted or unsubstituted aryl group of 6 to 30 ring-forming carbon atoms.

The compound represented by Formula H-1 may be a monoamine compound. In one or more embodiments, the compound represented by Formula H-1 may be a diamine compound in which at least one selected from among $Ar_1$ to $Ar_3$ includes an amine group as a substituent. In one or more embodiments, the compound represented by Formula H-1 may be a carbazole-based compound in which at least one selected from among $Ar_1$ to $Ar_3$ includes a substituted or unsubstituted carbazole group, or a fluorene-based compound in which at least one selected from among $Ar_1$ to $Ar_3$ includes a substituted or unsubstituted fluorene group.

The compound represented by Formula H-1 may be represented by any one selected from among the compounds in Compound Group H below. However, the compounds shown in Compound Group H are only illustrations, and the compound represented by Formula H-1 is not limited to the compounds represented in Compound Group H below.

Compound Group H

H-1-1

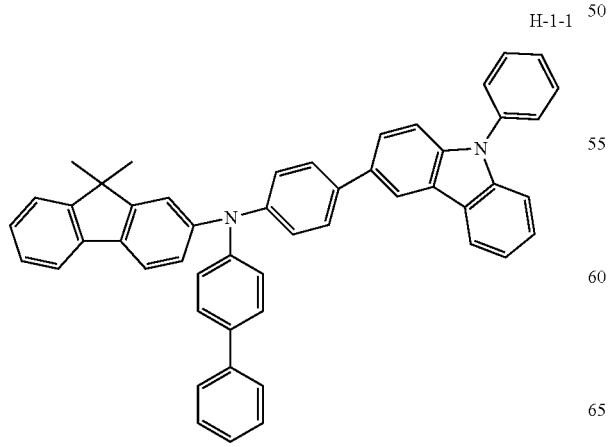

H-1-2

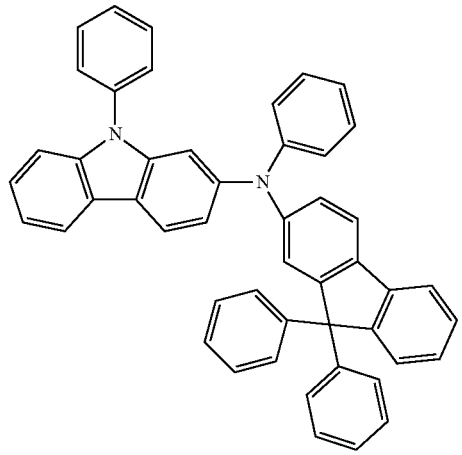

H-1-3

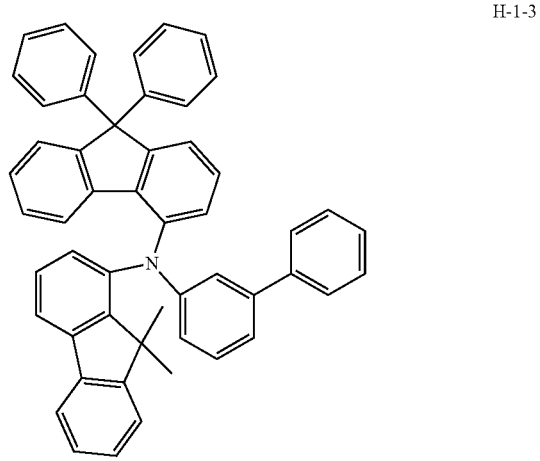

H-1-4

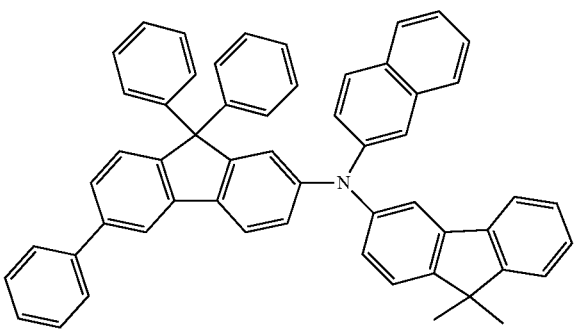

H-1-5

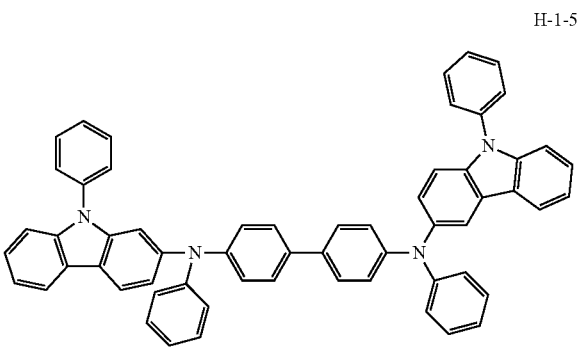

-continued
H-1-6
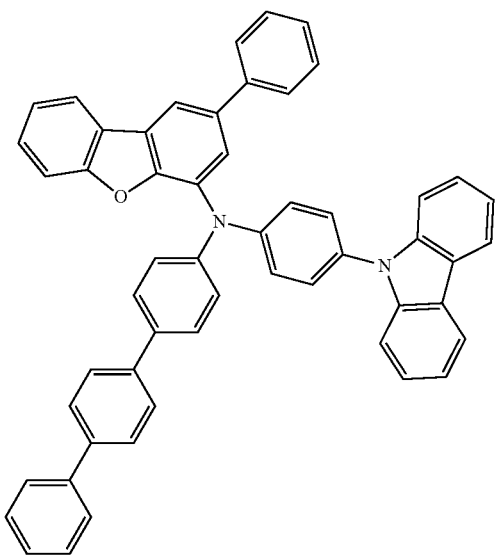
H-1-7
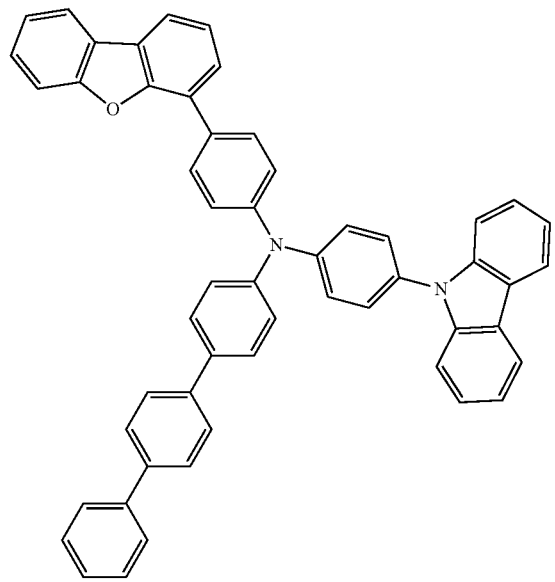
H-1-8
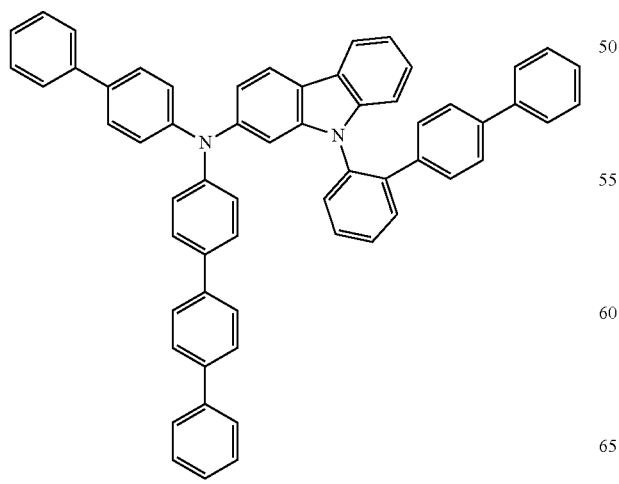
-continued
H-1-9
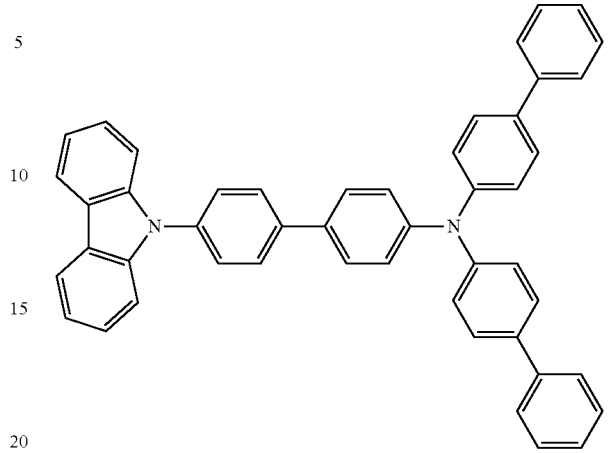
H-1-10
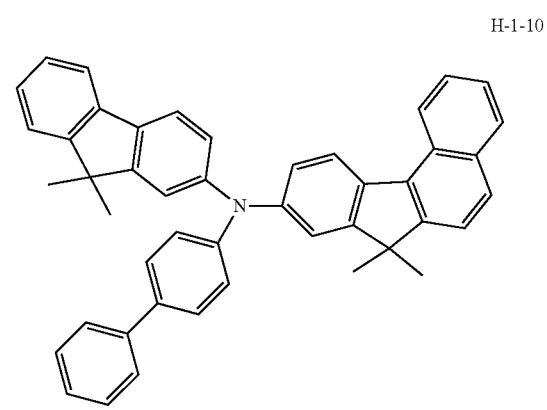
H-1-11
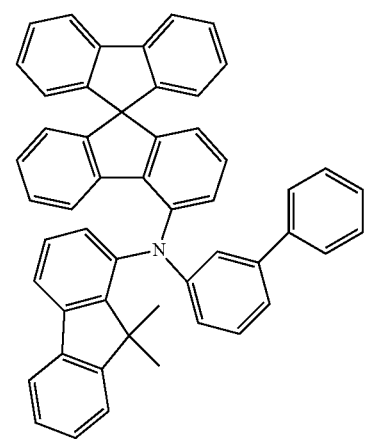

H-1-12
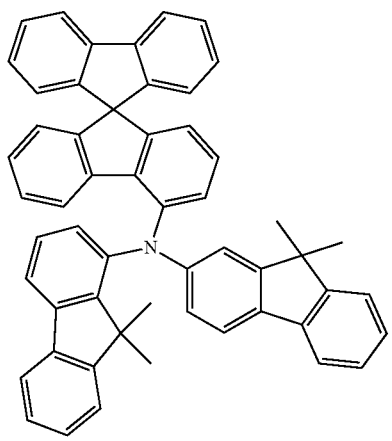
H-1-13
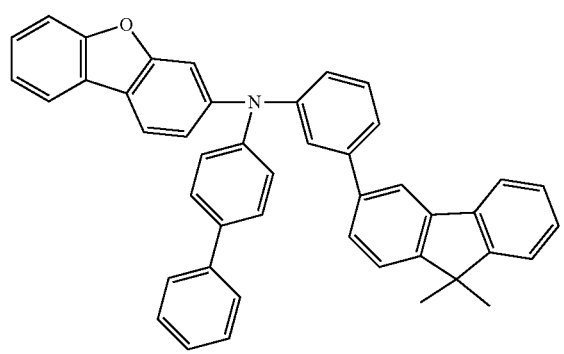
H-1-14
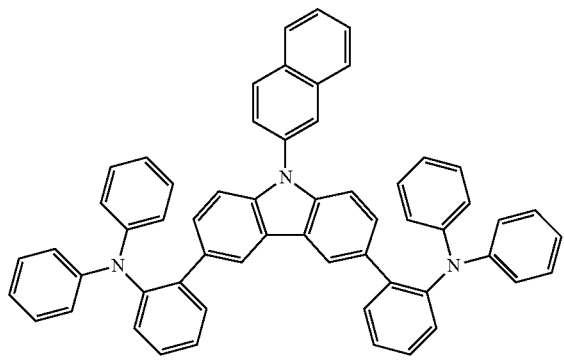
H-1-15
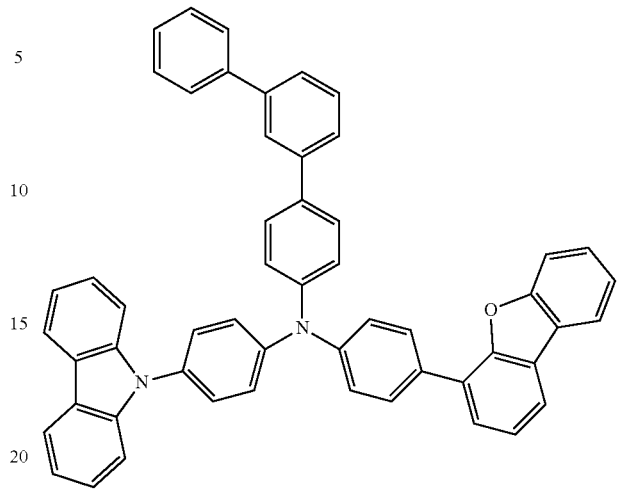
H-1-16
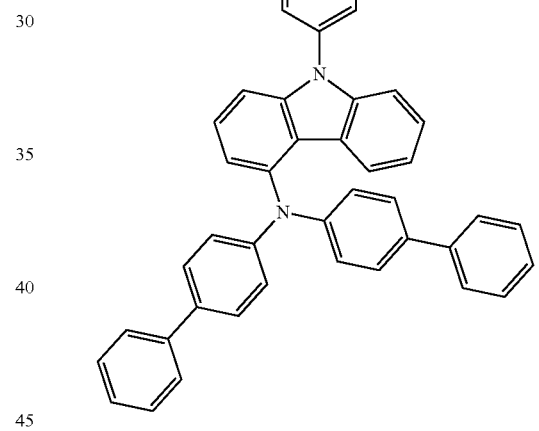
H-1-17
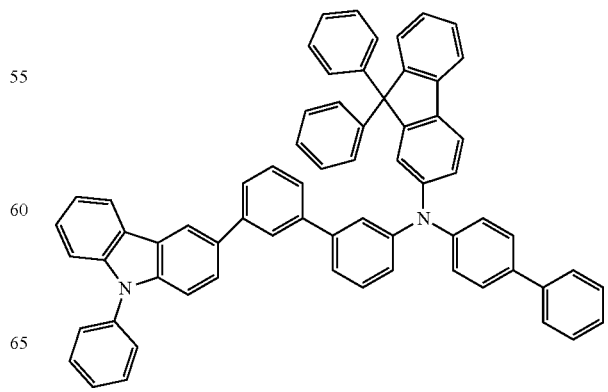

H-1-18

H-1-19

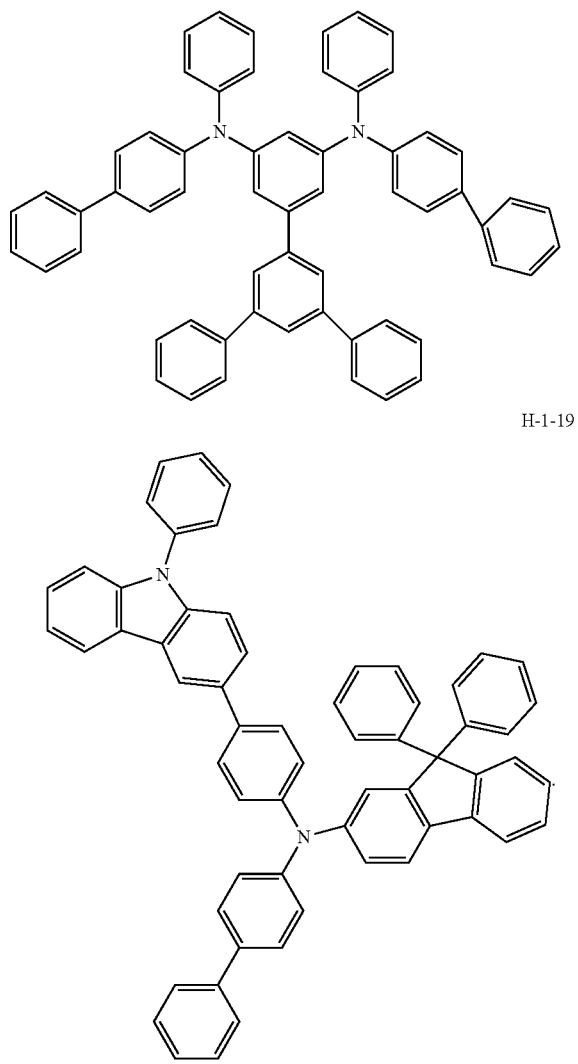

The hole transport region HTR may include a phthalocyanine compound (such as copper phthalocyanine), N¹,N¹'-([1,1'-biphenyl]-4,4'-diyl)bis(N¹-phenyl-N⁴,N⁴-di-m-tolylbenzene-1,4-diamine) (DNTPD), 4,4',4"-[tris(3-methylphenyl)phenylamino] triphenylamine (m-MTDATA), 4,4',4"-tris(N,N-diphenylamino)triphenylamine (TDATA), 4,4',4"-tris[N-(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and/or dipyrazino[2,3-f:2',3'-h] quinoxaline-2,3,6,7,10,11-hexacarbonitrile (HAT-CN).

The hole transport region HTR may include carbazole derivatives (such as N-phenyl carbazole and/or polyvinyl carbazole), fluorene-based derivatives, N,N'-bis(3-methylphenyl)-N,N'-diphenyl-[1,1'-biphenyl]-4,4'-diamine (TPD), triphenylamine-based derivatives (such as 4,4',4"-tris(N-carbazolyl)triphenylamine (TCTA)), N,N'-di(naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 1,3-bis(N-carbazolyl)benzene (mCP), etc.

In one or more embodiments, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region HTR in at least one selected from among the hole injection layer HIL, hole transport layer HTL, and electron blocking layer EBL.

The thickness of the hole transport region HTR may be from about 100 Å to about 10,000 Å, for example, from about 100 Å to about 5,000 Å. In case where the hole transport region HTR includes a hole injection layer HIL, the thickness of the hole injection layer HIL may be, for example, from about 30 Å to about 1,000 Å. In case where the hole transport region HTR includes a hole transport layer HTL, the thickness of the hole transport layer HTL may be from about 30 Å to about 1,000 Å. For example, in case where the hole transport region HTR includes an electron blocking layer EBL, the thickness of the electron blocking layer EBL may be from about 10 Å to about 1,000 Å. If the thicknesses of the hole transport region HTR, the hole injection layer HIL, the hole transport layer HTL, and/or the electron blocking layer EBL satisfy their respective above-described ranges, satisfactory (or suitable) hole transport properties may be achieved without a substantial increase of a driving voltage.

The hole transport region HTR may further include a charge generating material to increase conductivity, in addition to the above-described materials. The charge generating material may be dispersed uniformly or non-uniformly in the hole transport region HTR. The charge generating material may be, for example, a p-dopant. The p-dopant may include at least one selected from metal halide compounds, quinone derivatives, metal oxides, and cyano group-containing compounds, without limitation. For example, the p-dopant may include metal halide compounds (such as CuI and/or RbI), quinone derivatives (such as tetracyanoquinodimethane (TCNQ) and/or 2,3,5,6-tetrafluoro-7,7',8,8'-tetracyanoquinodimethane (F4-TCNQ)), metal oxides (such as tungsten oxide and/or molybdenum oxide), cyano group-containing compounds (such as dipyrazino[2,3-f: 2',3'-h] quinoxaline-2,3,6,7,10,11-hexacarbonitrile (HAT-CN) and/or 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9)), etc., without limitation.

As described above, the hole transport region HTR may further include at least one selected from among a buffer layer and an electron blocking layer EBL, in addition to the hole injection layer HIL and the hole transport layer HTL. The buffer layer may compensate resonance distance according to the wavelength of light emitted from an emission layer EML and may increase emission efficiency. As materials included in the buffer layer, any of the materials which may be included in the hole transport region HTR may be used. The electron blocking layer EBL is a layer playing the role of blocking or reducing the injection of electrons from the electron transport region ETR to the hole transport region HTR.

The emission layer EML is provided on the hole transport region HTR. The emission layer EML may have a thickness of, for example, about 100 Å to about 1,000 Å, or about 100 Å to about 300 Å. The emission layer EML may have a single layer formed using a single material, a single layer formed using multiple different materials, or a multilayer structure having multiple layers formed using multiple different materials.

The emission layer EML of the light emitting diode ED of one or more embodiments may include a polycyclic compound represented by Formula 1:

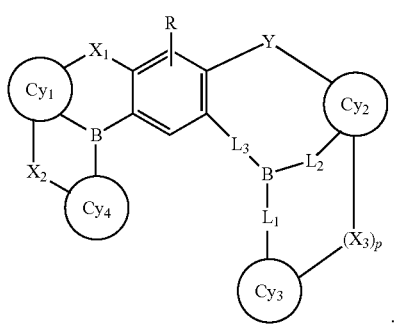

Formula 1

In Formula 1, $X_1$, $X_2$, and $X_3$ may be each independently a direct linkage, *—O—*, *—S—*, *—CO—*, *—SO$_2$—*, or *—NAr$_a$—*. For example, $X_1$ and $X_2$ may be each independently *—NAr$_a$—*, and $X_3$ may be a direct linkage. However, one or more embodiments of the present disclosure are not limited thereto.

Y may be *—S—* or *—Se—*.

Z may be *—B—* or *—N—*. In Formula 1, Y is connected at the ortho position with respect to Z. if Z is *—B—*, the polycyclic compound of this application may include a boron atom (hereinafter, first boron atom) connected to a central benzene ring, $Cy_1$ and $Cy_4$, and a boron atom (hereinafter, a second boron atom) connected to the central benzene ring, $Cy_2$ and $Cy_3$. In the description, the central benzene ring may mean a benzene ring with which $X_1$, the first boron atom, Y, and $L_3$ are directly connected.

The first boron atom is directly connected with a central benzene ring, $Cy_1$, and $Cy_4$, and the second boron atom is connected with a central benzene ring, $Cy_2$, and $Cy_3$ via $L_1$, $L_2$, and/or $L_3$ as linkers. Accordingly, the first boron atom and the second boron atom may be differentiated from each other.

The polycyclic compound of the present disclosure includes S or Se (at the Y position) connected with the central benzene ring, and S or Se is at the para position with respect to the first boron atom. Accordingly, heavy-atom effects may be generated, and intramolecular spin-orbital interaction may increase to increase a reverse intersystem crossing rate. Accordingly, the life characteristics of the light emitting diode ED including the polycyclic compound of the present disclosure in an emission layer may be improved.

$L_1$, $L_2$ and $L_3$ are each independently a direct linkage, *—O—*, *—S—*, or *—NAr$_b$—*, where if Z is *—N—*, $L_1$, $L_2$ and $L_3$ are all direct linkages, and if Z is *—B—*, any two selected from among $L_1$, $L_2$ and $L_3$ are direct linkages, and the remaining one is *—O—*, *—S—*, or *—NAr$_b$—*. For example, if Z is *—B—*, $L_1$ may be *—O—*, *—S—*, or *—NAr$_a$—*, and $L_2$ and $L_3$ may be both direct linkages.

However, one or more embodiments of the present disclosure are not limited thereto, and if Z is *—B—*, $L_1$ may be a direct linkage, any one selected from among $L_2$ and $L_3$ may be a direct linkage, and the remaining one may be *—O—*, *—S—*, or *—NAr$_b$—*.

"p" is 0 or 1, where if Z is *—B—*, "p" is 1, and if Z is *—N—*, "p" is 0. For example, if Z is *—B—*, $X_3$ may be a linker connecting between $Cy_2$ and $Cy_3$. If Z is *—B—*, Z may form a fused ring composed of $Cy_2$, $X_3$, $Cy_3$, $L_1$ and $L_2$.

For example, if Z is *—N—*, $X_3$ may not be present, and a separate bond may not be present between $Cy_2$ and $Cy_3$.

$Cy_1$, $Cy_2$, $Cy_3$, and $Cy_4$ may be each independently a substituted or unsubstituted aromatic hydrocarbon ring of 6 to 30 ring-forming carbon atoms, or a substituted or unsubstituted aromatic heterocycle of 2 to 30 ring-forming carbon atoms. For example, $Cy_1$, $Cy_2$, $Cy_3$, and $Cy_4$ may be each independently a substituted or unsubstituted aromatic hydrocarbon ring of 6 to 20 ring-forming carbon atoms, and in one or more embodiments, $Cy_1$, $Cy_2$, $Cy_3$, and $Cy_4$ may be all substituted benzene rings.

$Ar_a$ and $Ar_b$ may be each independently a substituted or unsubstituted aryl group of 6 to 30 ring-forming carbon atoms, or a substituted or unsubstituted heteroaryl group of 2 to 30 ring-forming carbon atoms. For example, $Ar_a$ may be a substituted or unsubstituted phenyl group, or a substituted or unsubstituted biphenyl group, and $Ar_b$ may be a substituted or unsubstituted phenyl group. However, one or more embodiments of the present disclosure are not limited thereto.

R is a hydrogen atom, a deuterium atom, a halogen atom, a cyano group, a substituted or unsubstituted nitro group, a substituted or unsubstituted amine group, a substituted or unsubstituted alkoxy group of 1 to 20 carbon atoms, a substituted or unsubstituted alkyl group of 1 to 30 carbon atoms, a substituted or unsubstituted alkenyl group of 2 to 30 carbon atoms, a substituted or unsubstituted aryl group of 6 to 50 ring-forming carbon atoms, or a substituted or unsubstituted heteroaryl group of 2 to 50 ring-forming carbon atoms, and/or may be combined with an adjacent group to form a ring. For example, R may be a hydrogen atom.

In one or more embodiments, the polycyclic compound represented by Formula 1 may be represented by Formula 2-1 or Formula 2-2:

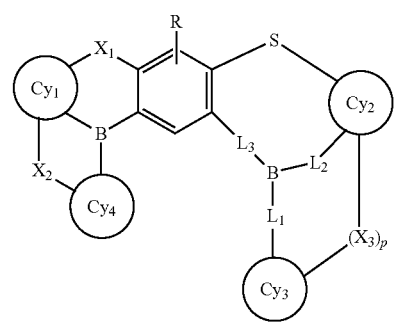

Formula 2-1

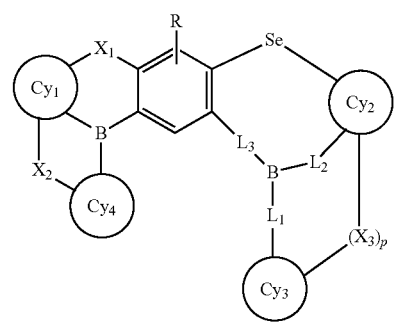

Formula 2-2

Formula 2-1 and Formula 2-2 correspond to Formula 1 where Y is embodied.

For example, Formula 2-1 corresponds to Formula 1 where Y is *—S—*.

Formula 2-2 corresponds to Formula 1 where Y is *—Se—*.

In Formula 2-1 and Formula 2-2, $X_1$, $X_2$, $X_3$, Z, $L_1$, $L_2$, $L_3$, "p", $Cy_1$, $Cy_2$, $Cy_3$, $Cy_4$ and R are the same as defined in Formula 1.

In one or more embodiments, the polycyclic compound represented by Formula 1 may be represented by Formula 3:

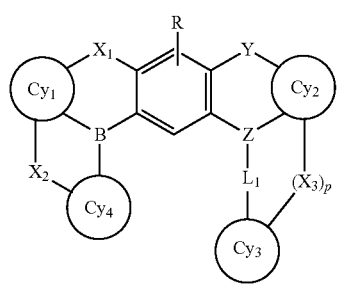

Formula 3

Formula 3 is an embodiment of Formula 1 where $L_2$ and $L_3$ are direct linkages.

In Formula 3, if Z is *—B—*, $L_1$ is *—O—*, *—S—*, or *—NAr$_b$—*, and if Z is *—N—*, $L_1$ is a direct linkage. $X_1$, $X_2$, $X_3$, Y, Z, "p", $L_1$, $Cy_1$, $Cy_2$, $Cy_3$, $Cy_4$ and R in Formula 3 are the same as defined in Formula 1.

In one or more embodiments, the polycyclic compound represented by Formula 1 may be represented by Formula 4-1 or Formula 4-2:

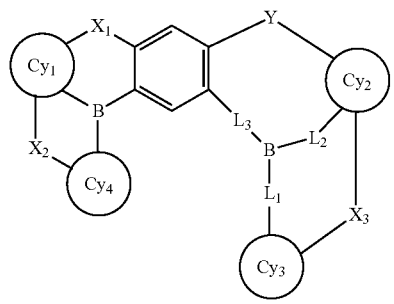

Formula 4-1

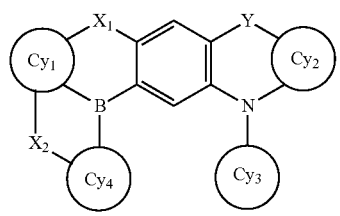

Formula 4-2

Formula 4-1 and Formula 4-2 are embodiments of Formula 1 where R is a hydrogen atom and Z is embodied.

For example, Formula 4-1 is a case of Formula 1 where Z is *—B—*, and R is a hydrogen atom. In Formula 4-1, any two selected from among $L_1$, $L_2$, and $L_3$ may be direct linkages, and the remaining one may be *—O—*, *—S—*, or *—NAr$_b$—*. For example, $L_1$ may be *—O—*, *—S—*, or *—NAr$_b$—*, and $L_2$, and $L_3$ may be both direct linkages. However, one or more embodiments of the present disclosure are not limited thereto.

Formula 4-2 is a case of Formula 1 where Z is *—N—*, R is a hydrogen atom, and $L_1$ to $L_3$ are direct linkages. In Formula 1, if Z is *—N—*, any two among $L_1$, $L_2$, and $L_3$ may be direct linkages, and the remaining one may be *—O—*, *—S—*, or *—NAr$_b$—*. For example, $L_1$ may be *—O—*, *—S—*, or *—NAr$_b$—*, and $L_2$, and $L_3$ may be both direct linkages. However, one or more embodiments of the present disclosure are not limited thereto.

In Formula 4-1 and Formula 4-2, $X_1$, $X_2$, $X_3$, Y, $L_1$, $L_2$, $L_3$, $Cy_1$, $Cy_2$, $Cy_3$, and $Cy_4$ are the same as defined in Formula 1.

In one or more embodiments, the polycyclic compound represented by Formula 1 may be represented by any one selected from among Formula 5-1 to Formula 5-3:

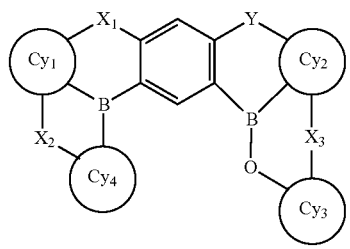

Formula 5-1

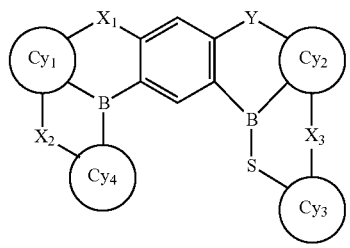

Formula 5-2

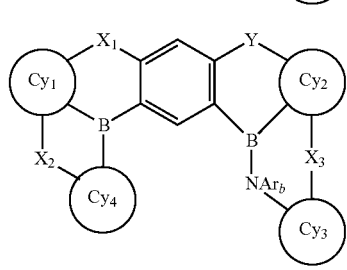

Formula 5-3

Formula 5-1 to Formula 5-3 correspond to Formula 1 where Z, $L_1$, $L_2$, $L_3$, and p are embodied.

Formula 5-1 to Formula 5-3 are embodiments of cases where $L_1$ is *—O—*, *—S—*, and *—NAr$_b$—*, respectively, in the case where Z is *—B—*, p is 1, and $L_2$ and $L_3$ are both direct linkages.

In one or more embodiments, Formula 5-1 to Formula 5-3 correspond to Formula 4-1 where $L_1$, $L_2$, $L_3$ are embodied.

The polycyclic compound of the present disclosure may include a fused ring formed by a boron atom, $Cy_2$, $X_3$, $Cy_3$, and $L_1$, in the case where Z of Formula 1 is *—B—*.

In Formula 5-1 to Formula 5-3, $X_1$, $X_2$, $X_3$, Y, $Cy_1$, $Cy_2$, $Cy_3$, $Cy_4$ and Ar$_b$ are the same as defined in Formula 1.

In one or more embodiments, the polycyclic compound represented by Formula 1 may be represented by Formula 6:

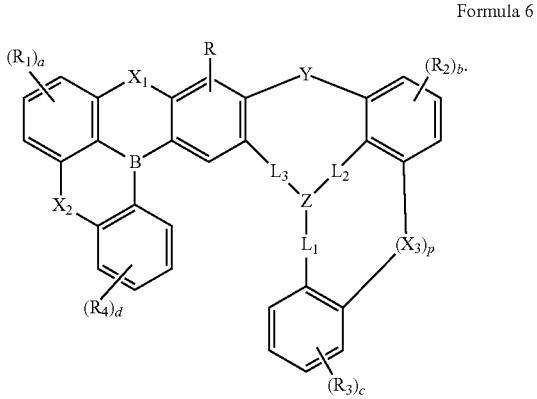

Formula 6

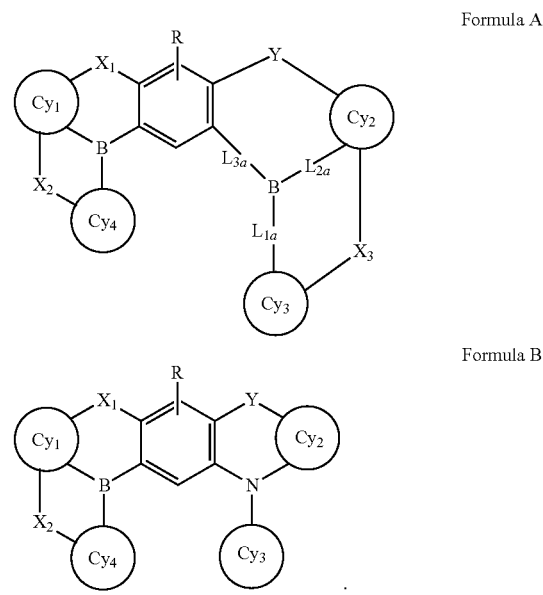

Formula A

Formula B

Formula 6 corresponds to Formula 1 where $Cy_1$, $Cy_2$, $Cy_3$, and $Cy_4$ are embodied. Particularly, Formula 6 corresponds to Formula 1 where $Cy_1$, $Cy_2$, $Cy_3$, and $Cy_4$ are all benzene rings.

$R_1$, $R_2$, $R_3$, and $R_4$ are each independently a hydrogen atom, a deuterium atom, a halogen atom, a cyano group, a substituted or unsubstituted nitro group, a substituted or unsubstituted amine group, a substituted or unsubstituted alkoxy group of 1 to 20 carbon atoms, a substituted or unsubstituted alkyl group of 1 to 30 carbon atoms, a substituted or unsubstituted alkenyl group of 2 to 30 carbon atoms, a substituted or unsubstituted aryl group of 6 to 50 ring-forming carbon atoms, or a substituted or unsubstituted heteroaryl group of 2 to 50 ring-forming carbon atoms, and/or may be combined with an adjacent group to form a ring.

For example, $R_1$ and $R_2$ may be each independently a substituted or unsubstituted amine group, or a substituted or unsubstituted heteroaryl group of 2 to 50 ring-forming carbon atoms. For example, $R_1$ and $R_2$ may be each independently a substituted or unsubstituted diphenylamine group, or a substituted or unsubstituted carbazole group. For example, $R_1$ and $R_2$ may be each independently a diphenylamine group substituted with a deuterium atom, an unsubstituted diphenyl amine group, or an unsubstituted carbazole group. However, one or more embodiments of the present disclosure are not limited thereto.

For example, $R_3$, and $R_4$ may be each independently a hydrogen atom or a deuterium atom.

"a" and "b" are each independently an integer of 0 to 3. For example both "a" and "b" may be 1.

"c" and "d" are each independently an integer of 0 to 4. For example, both "c" and "d" may be 0. A case where "c" is 0 may be the same as a case where "c" is 1, and $R_3$ is a hydrogen atom. A case where "d" is 0 may be the same as a case where "d" is 1, and $R_4$ is a hydrogen atom.

In one or more embodiments, the emission layer EML of the light emitting diode ED of one or more embodiments may include the polycyclic compound represented by Formula A or Formula B:

In Formula A and Formula B, $X_1$, $X_2$, and $X_3$ may be each independently a direct linkage, *—O—*, *—S—*, *—CO—*, *—SO$_2$—*, or *—NAr$_a$—*. For example, $X_1$ and $X_2$ may be each independently *—NAr$_a$—*, and $X_3$ may be a direct linkage. However, one or more embodiments of the present disclosure are not limited thereto.

Y may be *—S—* or *—Se—*.

$L_{1a}$, $L_{2a}$ and $L_{3a}$ are each independently a direct linkage, *—O—*, *—S—*, or *—NAr$_b$—*, where any two selected from among $L_{1a}$, $L_{2a}$ and $L_{3a}$ are direct linkages, and the remaining one is *—O—*, *—S—*, or *—NAr$_b$—*. For example, if Z is *—B—*, $L_{1a}$ may be *—O—*, *—S—*, or *—NAr$_b$—*. For example, $L_{1a}$ may be *—O—*, *—S—*, or *—NAr$_b$—*, and $L_{2a}$ and $L_{3a}$ may be both direct linkages. However, one or more embodiments of the present disclosure are not limited thereto, and $L_{1a}$ may be a direct linkage, any one selected from among $L_{2a}$ and $L_{3a}$ may be a direct linkage, and the remaining one may be *—O—, *—S—*, or *—NAr$_b$—*.

$Cy_1$, $Cy_2$, $Cy_3$, and $Cy_4$ may be each independently a substituted or unsubstituted aromatic hydrocarbon ring of 6 to 30 ring-forming carbon atoms, or a substituted or unsubstituted aromatic heterocycle of 2 to 30 ring-forming carbon atoms. For example, $Cy_1$, $Cy_2$, $Cy_3$, and $Cy_4$ may be each independently a substituted or unsubstituted aromatic hydrocarbon ring of 6 to 20 ring-forming carbon atoms, and for example, $Cy_1$, $Cy_2$, $Cy_3$, and $Cy_4$ may be all substituted benzene rings.

$Ar_a$ and $Ar_b$ may be each independently a substituted or unsubstituted aryl group of 6 to 30 ring-forming carbon atoms, or a substituted or unsubstituted heteroaryl group of 2 to 30 ring-forming carbon atoms. For example, $Ar_a$ may be a substituted or unsubstituted phenyl group, or a substituted or unsubstituted biphenyl group, and $Ar_b$ may be a substituted or unsubstituted phenyl group. However, one or more embodiments of the present disclosure are not limited thereto.

R is a hydrogen atom, a deuterium atom, a halogen atom, a cyano group, a substituted or unsubstituted nitro group, a substituted or unsubstituted amine group, a substituted or unsubstituted alkoxy group of 1 to 20 carbon atoms, a substituted or unsubstituted alkyl group of 1 to 30 carbon atoms, a substituted or unsubstituted alkenyl group of 2 to 30 carbon atoms, a substituted or unsubstituted aryl group of 6 to 50 ring-forming carbon atoms, or a substituted or unsubstituted heteroaryl group of 2 to 50 ring-forming carbon atoms, and/or may be combined with an adjacent group to form a ring. For example, R may be a hydrogen atom.

Formula A may correspond to Formula 1 including the above-described first boron atom and the second boron atom. The polycyclic compound of the present disclosure includes Y which is at the para position with respect to the first boron atom, and at the ortho position with respect to the second boron atom. Y is S or Se. Accordingly, due to heavy-atom effects, intramolecular spin-orbital interaction may increase, and the residence time of excitons at a triplet energy level (T1 energy level) may be reduced. If the polycyclic compound of this application is used as a TADF dopant material, the life of a light emitting diode may be improved.

In one or more embodiments, the polycyclic compound represented by Formula A may be represented by Formula A-1 or Formula A-2:

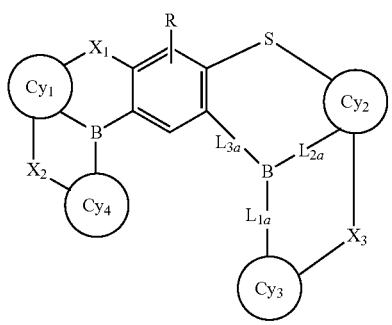

Formula A-1

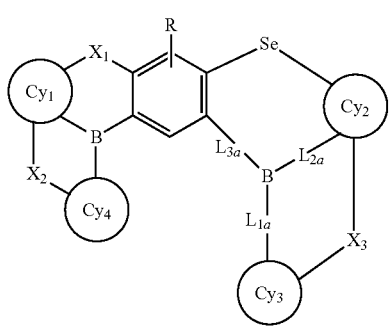

Formula A-2

Formula A-1 and Formula A-2 correspond to Formula A where Y is embodied.

For example, Formula A-1 corresponds to Formula A where Y is *—S—*. Formula A-2 corresponds to Formula A where Y is *—Se—*.

$X_1$, $X_2$, $X_3$, $L_{1a}$, $L_{2a}$, $L_{3a}$, $Cy_1$, $Cy_2$, $Cy_3$, $Cy_4$, and R are the same as defined in Formula A and Formula B.

In one or more embodiments, the polycyclic compound represented by Formula B may be represented by Formula B-1 or Formula B-2:

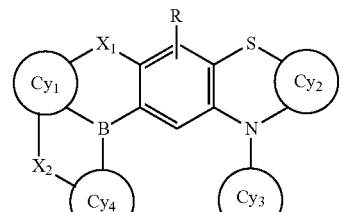

Formula B-1

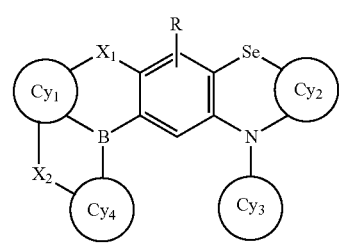

Formula B-2

Formula B-1 and Formula B-2 correspond to Formula B where Y is embodied.

For example, Formula B-1 corresponds to Formula B where Y is *—S—*. Formula B-2 corresponds to Formula B where Y is *—Se—*.

$X_1$, $X_2$, $Cy_1$, $Cy_2$, $Cy_3$, $Cy_4$, and R are the same as defined in Formula A and Formula B.

The polycyclic compound of the present disclosure includes a structure in which S or Se is directly connected with a central benzene ring and is at the para position to a boron atom that is also connected to the central benzene ring. Accordingly, the polycyclic compound of this application may increase multi-resonance effects, and due to the above-described heavy-atom effects, a reverse intersystem crossing rate may increase.

The light emitting diode including the polycyclic compound of the present disclosure in an emission layer may have improved life characteristics.

In one or more embodiments, the polycyclic compound represented by Formula 1 may include any one selected from among the polycyclic compounds shown in Compound Group 1.

In one or more embodiments, the polycyclic compound represented by Formula A or Formula B may include any one selected from among the polycyclic compounds in Compound Group 1.

Compound Group 1

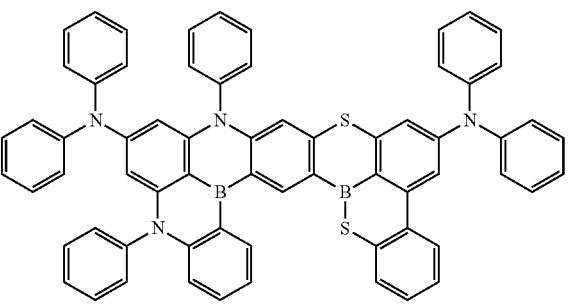

(A-1)

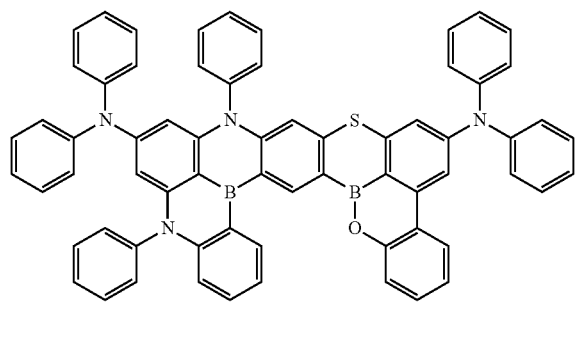
(A-2)
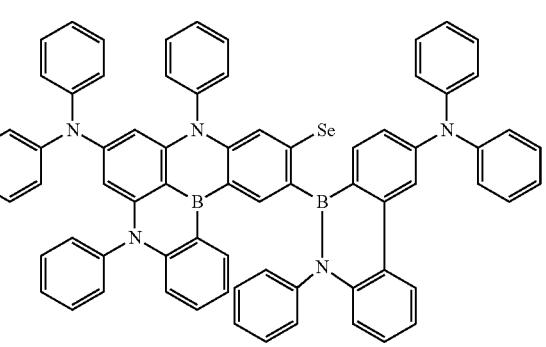
(A-6)
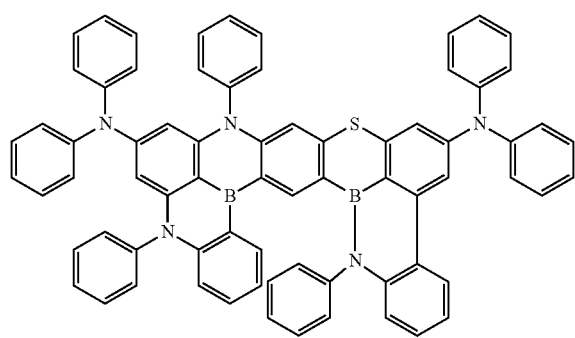
(A-3)
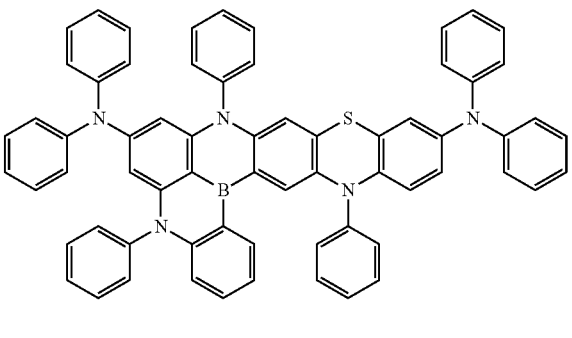
(A-7)
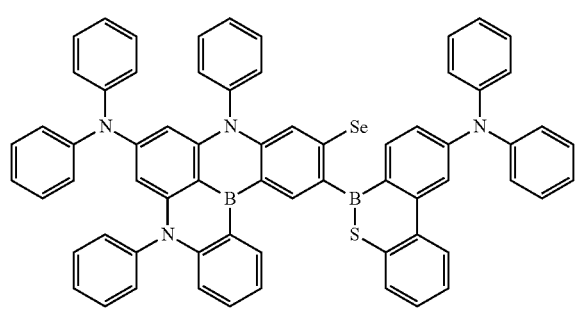
(A-4)
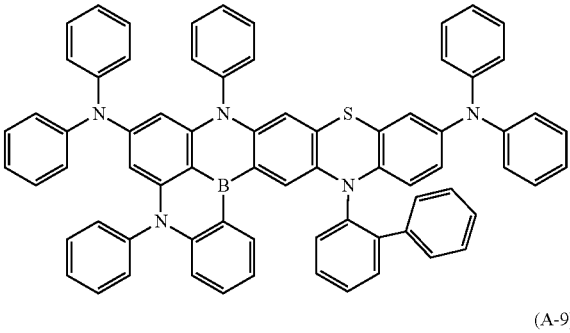
(A-8)
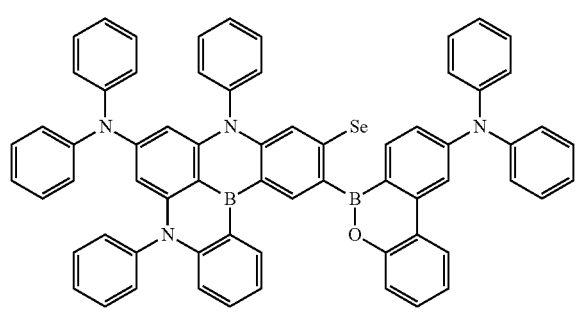
(A-5)
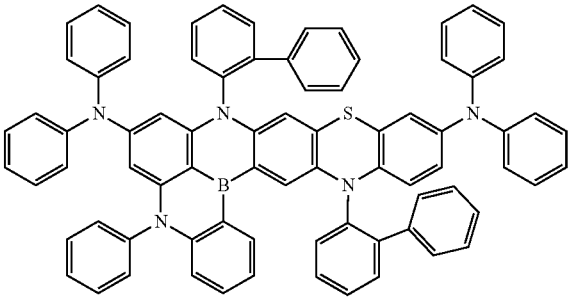
(A-9)

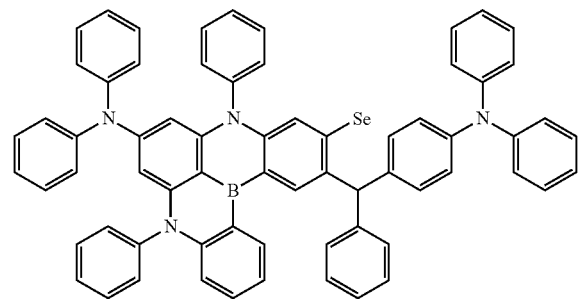
(A-10)
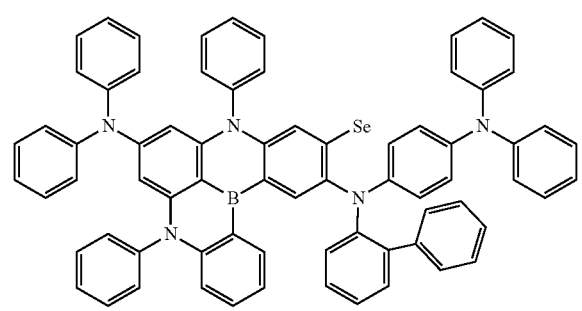
(A-11)
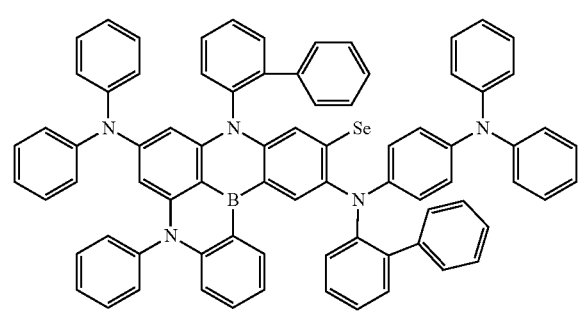
(A-12)
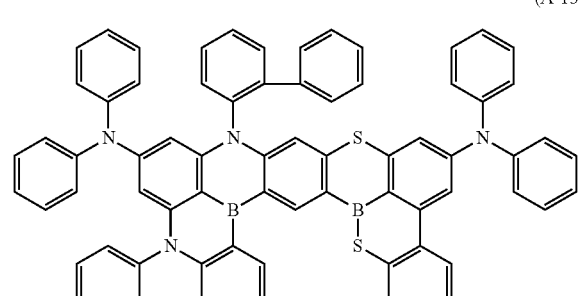
(A-13)
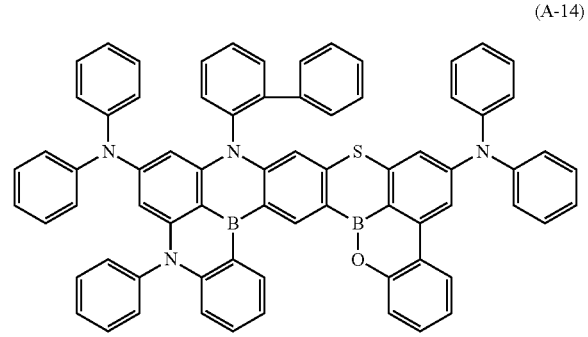
(A-14)
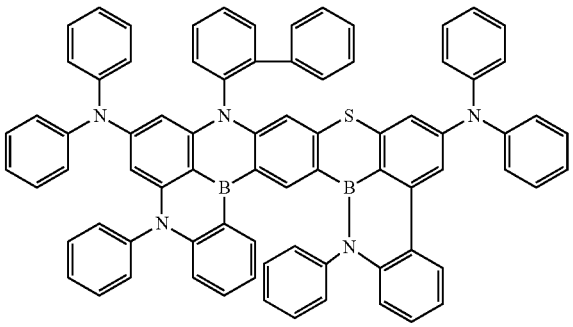
(A-15)
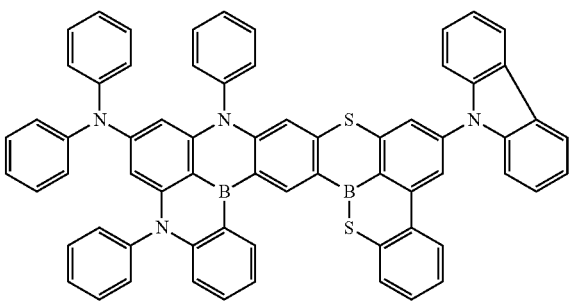
(B-1)
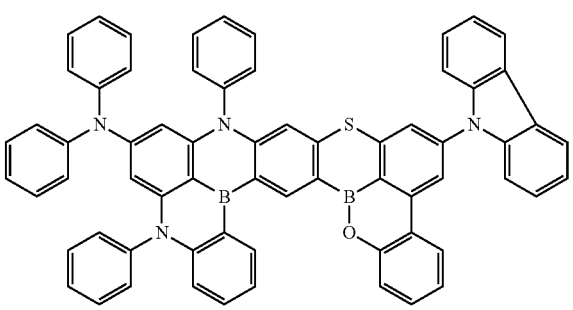
(B-2)
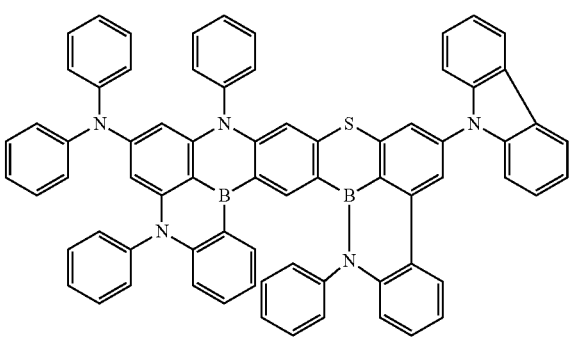
(B-3)

(B-4)
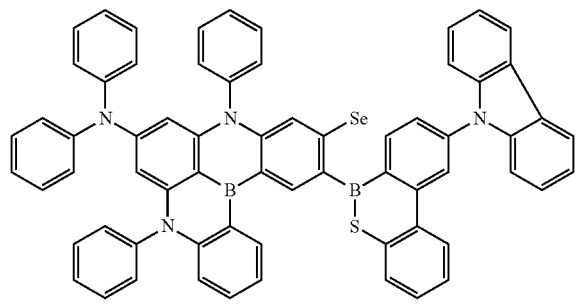
(B-5)
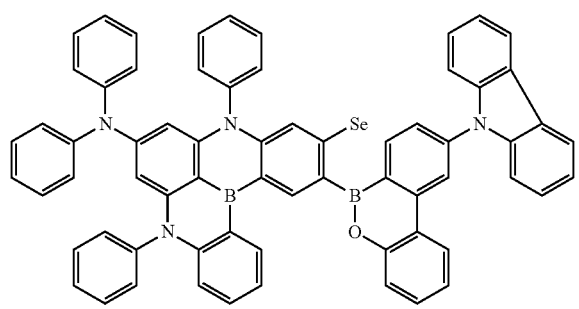
(B-6)
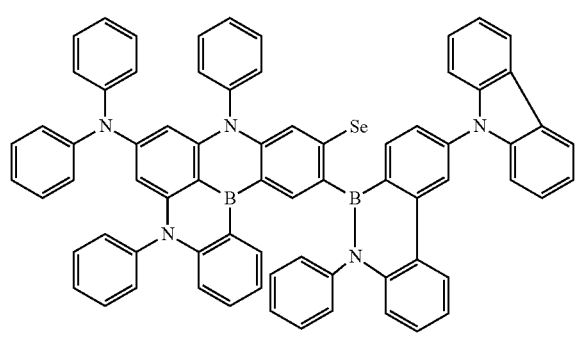
(B-7)
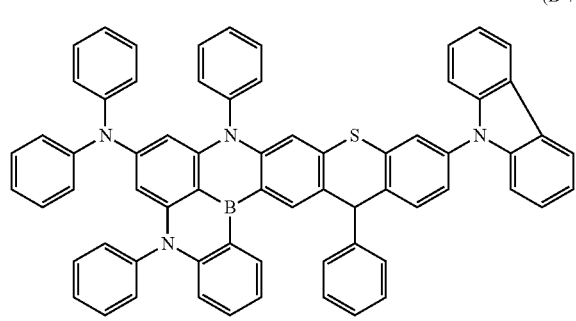
(B-8)
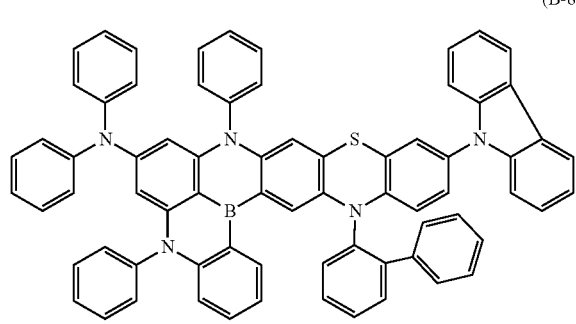
(B-9)
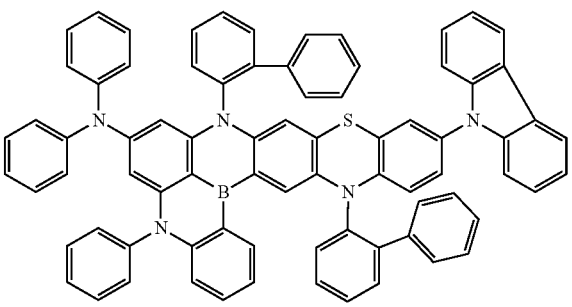
(B-10)
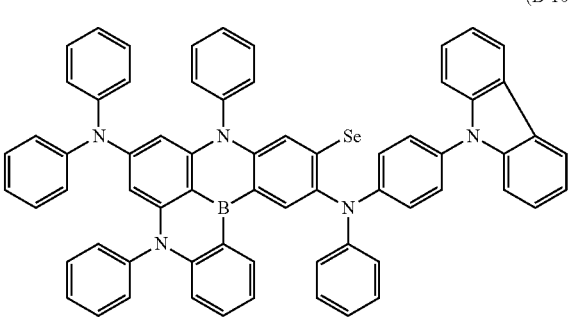
(B-11)
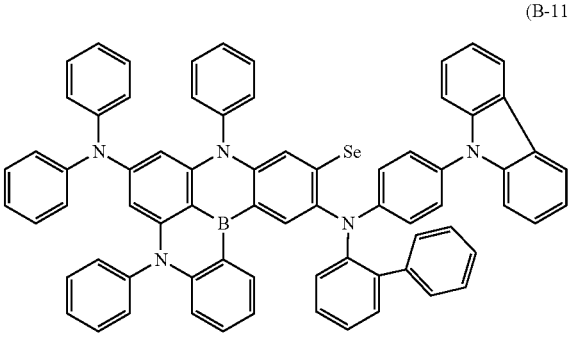
(B-12)
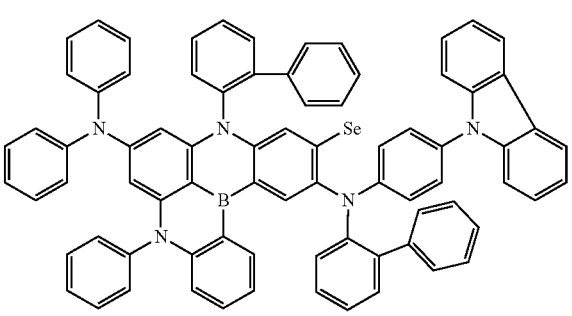
(B-13)
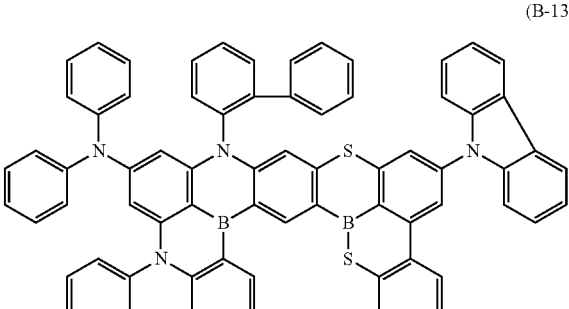

(B-14)
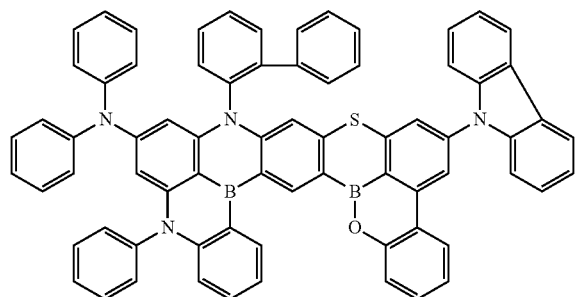
(B-15)
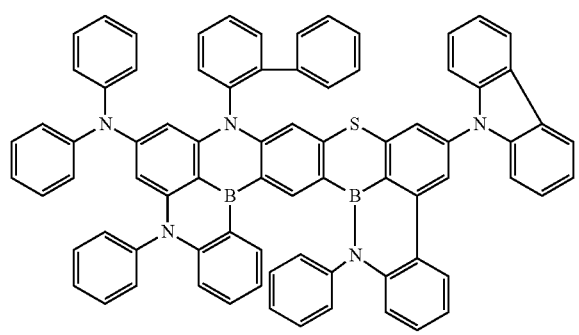
(C-1)
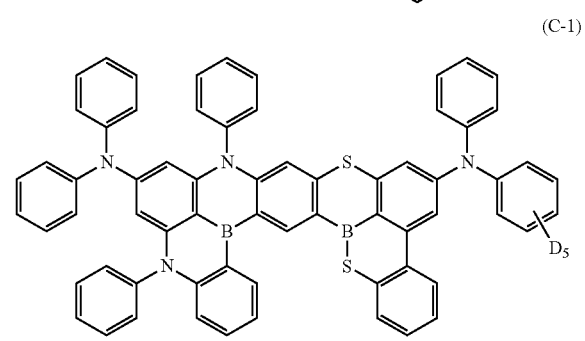
(C-2)
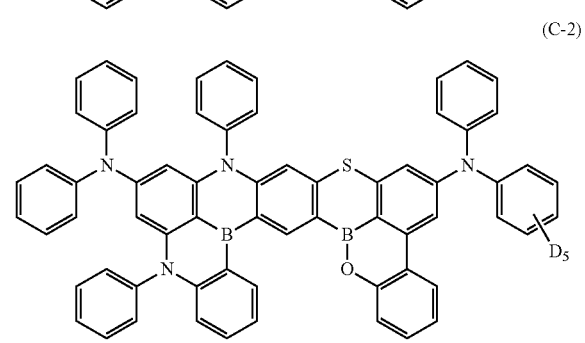
(C-3)
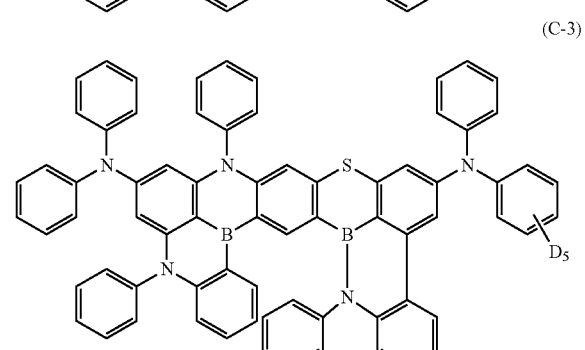
(C-4)
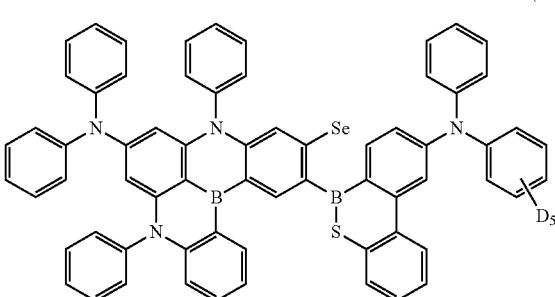
(C-5)
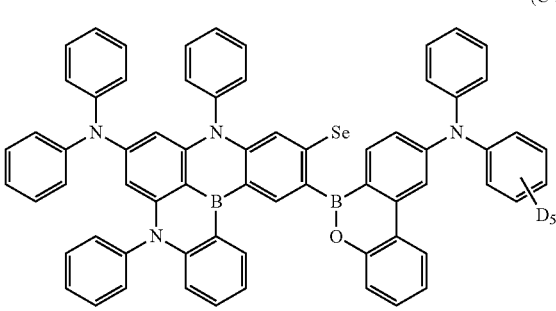
(C-6)
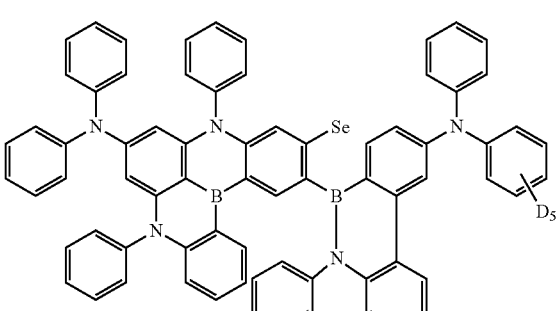
(C-7)
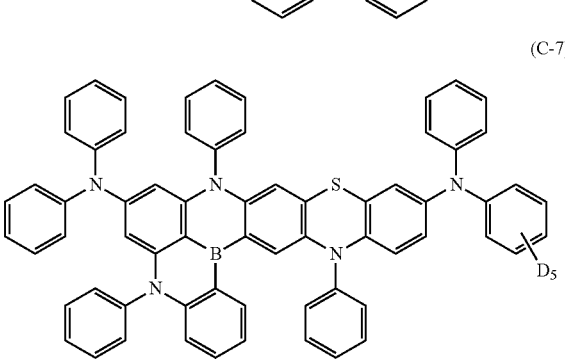
(C-8)
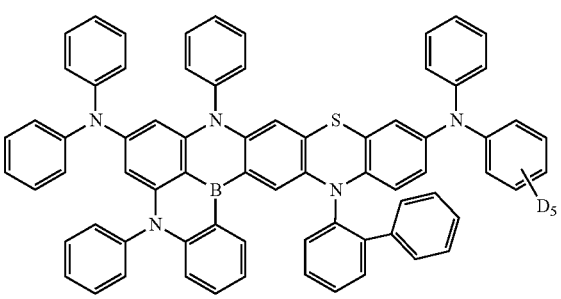

-continued (C-9)
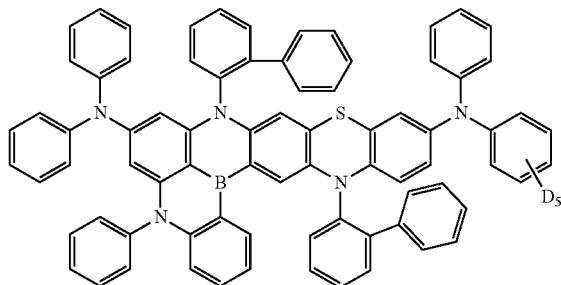

(C-10)
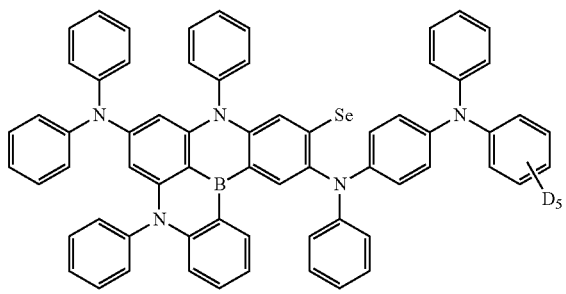

(C-11)
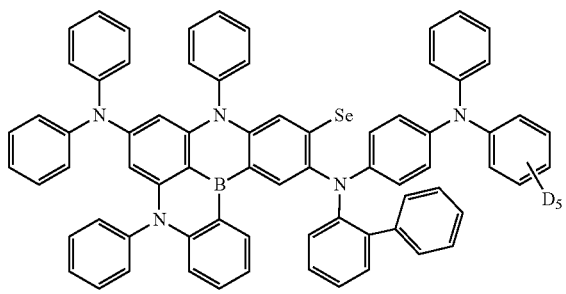

(C-12)
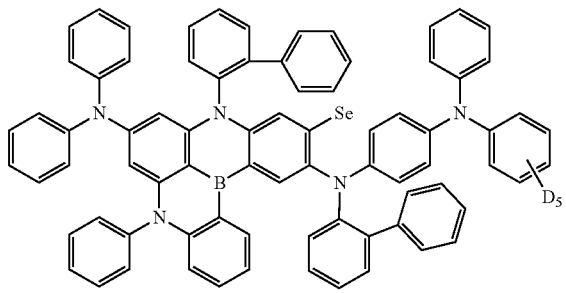

(C-13)
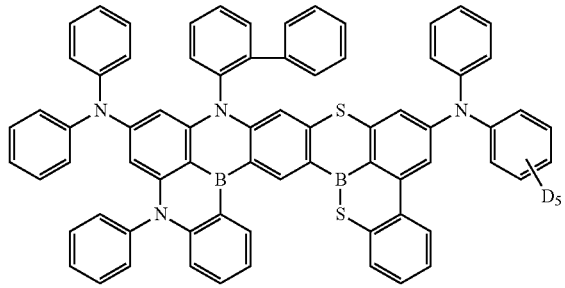

-continued (C-14)
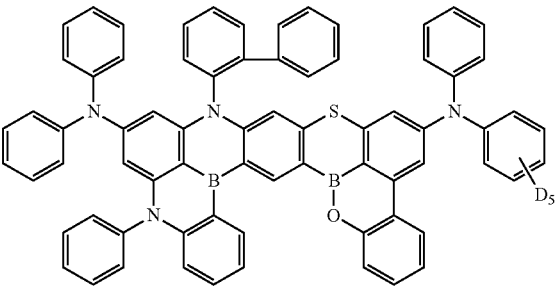

(C-15)
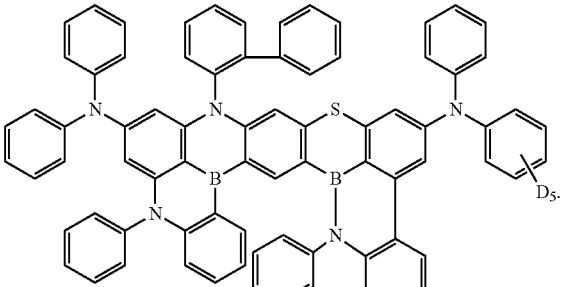

In the light emitting diode ED of one or more embodiments, the emission layer EML may include any suitable host material. For example, the emission layer EML may include anthracene derivatives, pyrene derivatives, fluoranthene derivatives, chrysene derivatives, dihydrobenzanthracene derivatives, and/or triphenylene derivatives. For example, the emission layer EML may include anthracene derivatives and/or pyrene derivatives.

In the light emitting diodes ED of embodiments, for example as shown in FIG. 3 to FIG. 6, the emission layer EML may include a host and a dopant, and the emission layer EML may include a compound represented by Formula E-1 below. The compound represented by Formula E-1 below may be used as a fluorescence host material:

Formula E-1

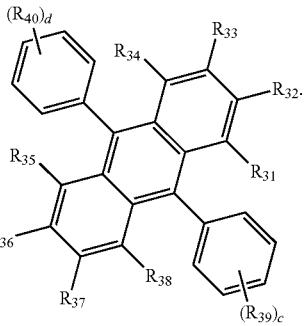

In Formula E-1, $R_{31}$ to $R_{40}$ may be each independently a hydrogen atom, a deuterium atom, a halogen atom, a substituted or unsubstituted silyl group, a substituted or unsubstituted thio group, a substituted or unsubstituted oxy group, a substituted or unsubstituted alkyl group of 1 to 10 carbon atoms, a substituted or unsubstituted alkenyl group of 2 to 10 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. In one or more embodiments, $R_{31}$ to $R_{40}$ may be combined with an adjacent group to form a saturated hydrocarbon ring, an unsaturated hydrocarbon ring, a saturated heterocycle, or an unsaturated heterocycle.

In Formula E-1, "c" and "d" may be each independently an integer of 0 to 5.

Formula E-1 may be represented by any one selected from among Compound E1 to Compound E19 below:

E1
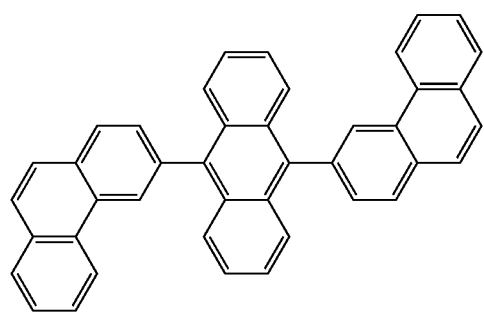

E2
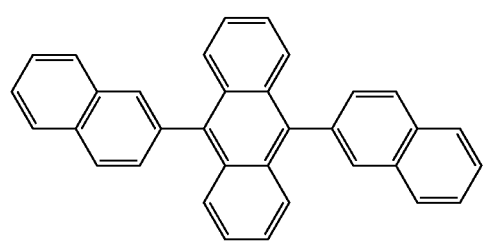

E3
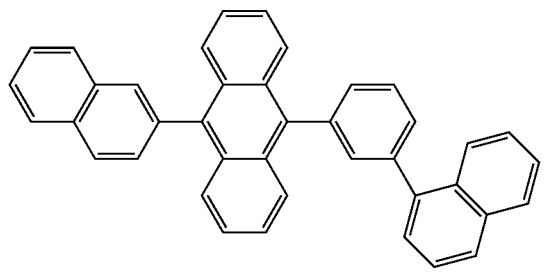

E4
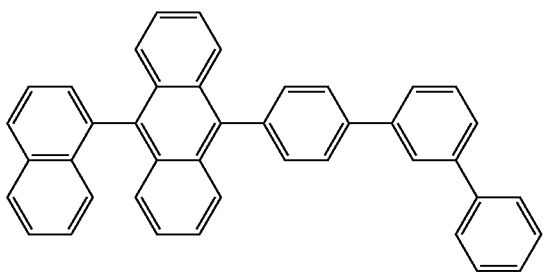

E5
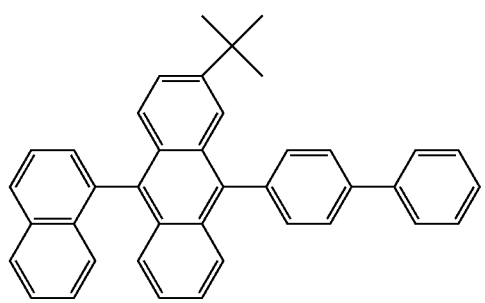

E6
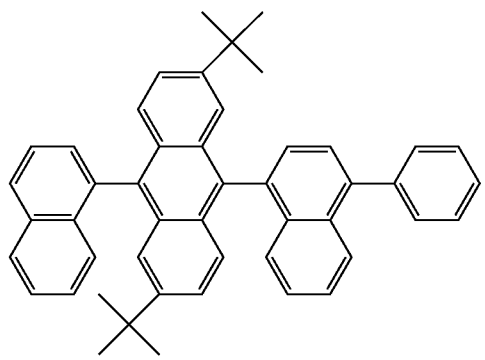

E7
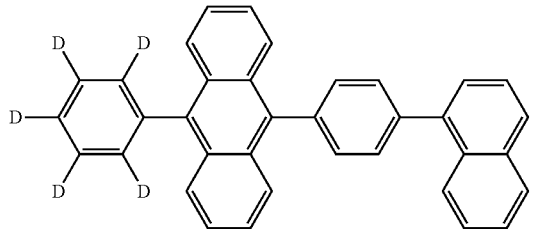

E8
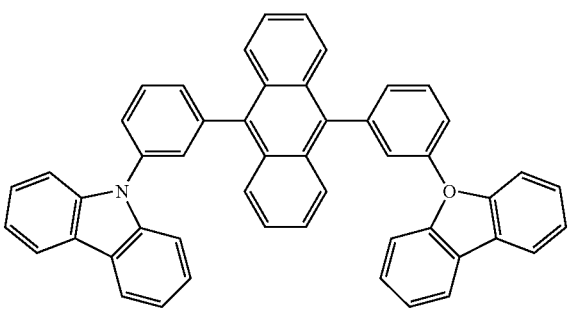

E9
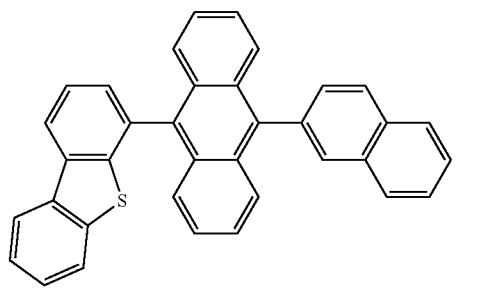

E10
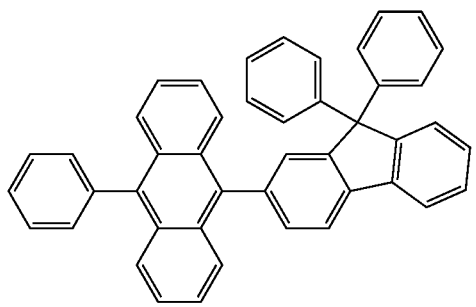
E11
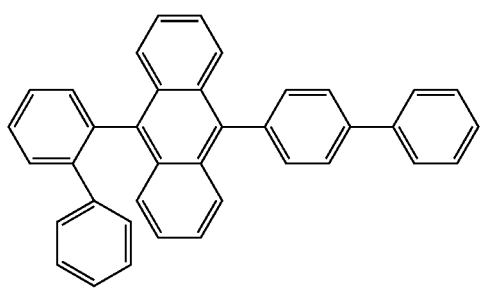
E12
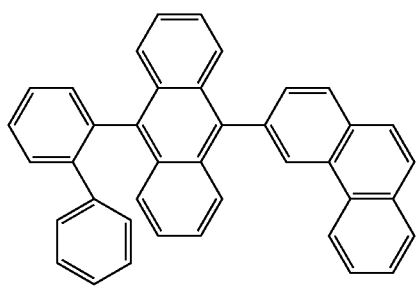
E13
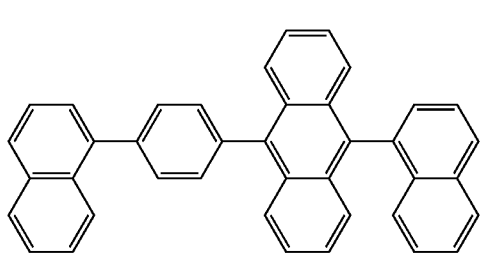
E14
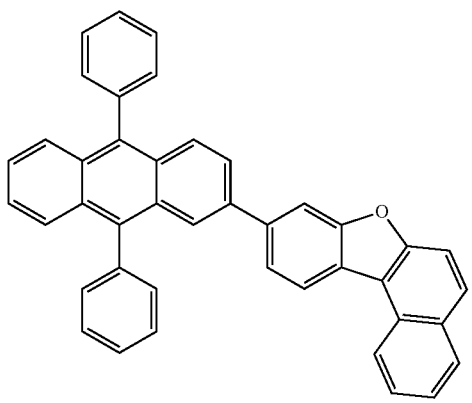
E15
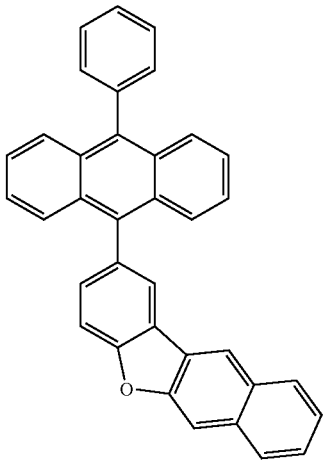
E16
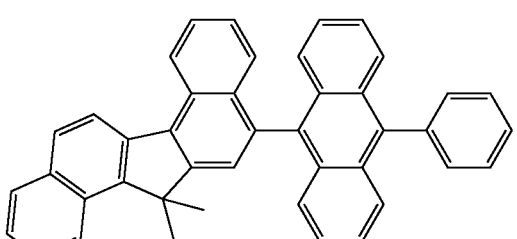
E17
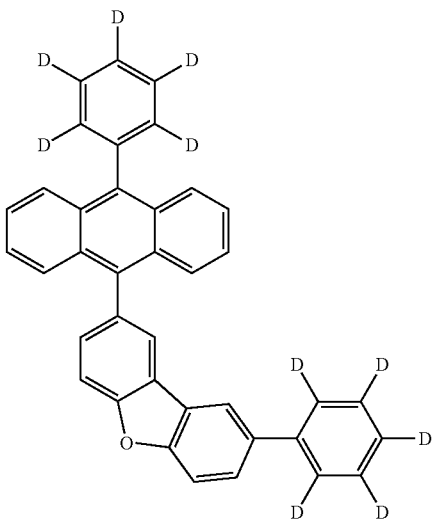
E18
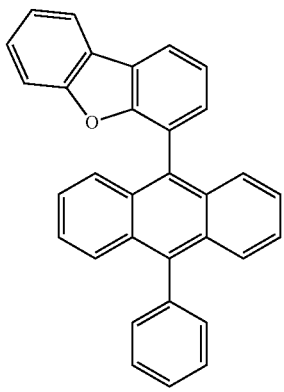

E19

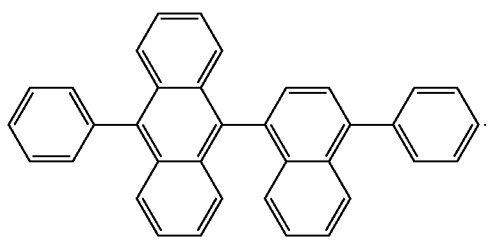

In one or more embodiments, the emission layer EML may include a compound represented by Formula E-2a or Formula E-2b below. The compound represented by Formula E-2a or Formula E-2b below may be used as a phosphorescence host material:

Formula E-2a

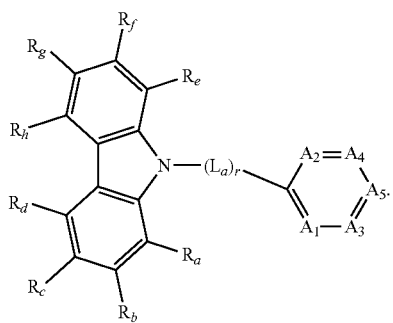

In Formula E-2a, "r" may be an integer of 0 to 10; $L_a$ may be a direct linkage, a substituted or unsubstituted arylene group of 6 to 30 ring-forming carbon atoms, or a substituted or unsubstituted heteroarylene group of 2 to 30 ring-forming carbon atoms. In one or more embodiments, if "r" is an integer of 2 or more, multiple $L_a$ may be each independently a substituted or unsubstituted arylene group of 6 to 30 ring-forming carbon atoms, or a substituted or unsubstituted heteroarylene group of 2 to 30 ring-forming carbon atoms.

In one or more embodiments, in Formula E-2a, $A_1$ to $A_5$ may be each independently N or $CR_i$. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. $R_a$ to $R_i$ may be combined with an adjacent group to form a hydrocarbon ring or a heterocycle including N, O, S, etc. as a ring-forming atom.

In one or more embodiments, in Formula E-2a, two or three selected from $A_1$ to $A_5$ may be N, and the remainder may be $CR_i$.

Formula E-2b (Cbz1)—(L$_b$)$_s$—(Cbz2).

In Formula E-2b, Cbz1 and Cbz2 may be each independently a substituted or unsubstituted carbazole group. For example, Cbz1 and Cbz2 may be each independently a carbazole group substituted with an aryl group of 6 to 30 ring-forming carbon atoms, or an unsubstituted carbazole group.

$L_b$ may be a direct linkage, a substituted or unsubstituted arylene group of 6 to 30 ring-forming carbon atoms, or a substituted or unsubstituted heteroarylene group of 2 to 30 ring-forming carbon atoms. "s" is an integer of 0 to 10, and if "s" is an integer of 2 or more, multiple $L_b$ may be each independently a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be represented by any one selected from among the compounds in Compound Group E-2 below. However, the compounds shown in Compound Group E-2 below are only illustrations, and the compound represented by Formula E-2a or Formula E-2b is not limited to the compounds represented in Compound Group E-2 below.

Compound Group E-2

E-2-1

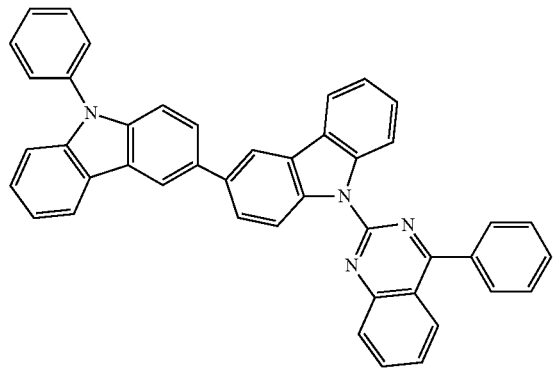

E-2-2

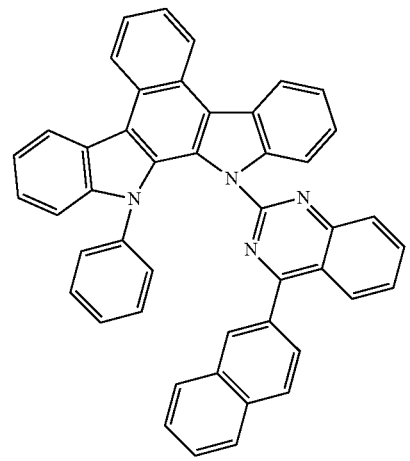

E-2-3
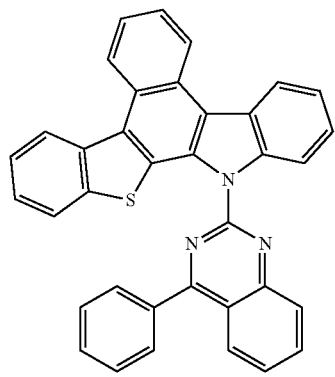
E-2-4
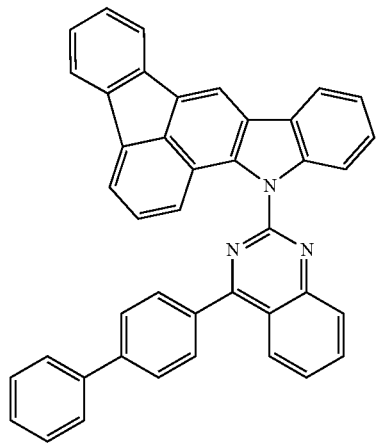
E-2-5
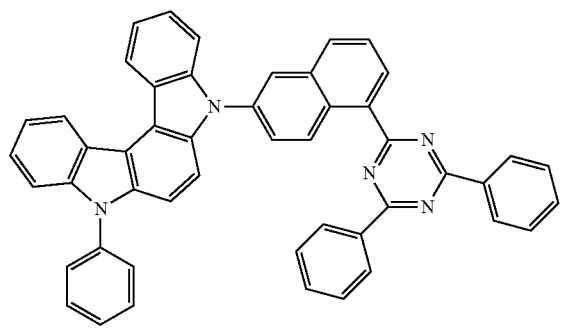
E-2-6
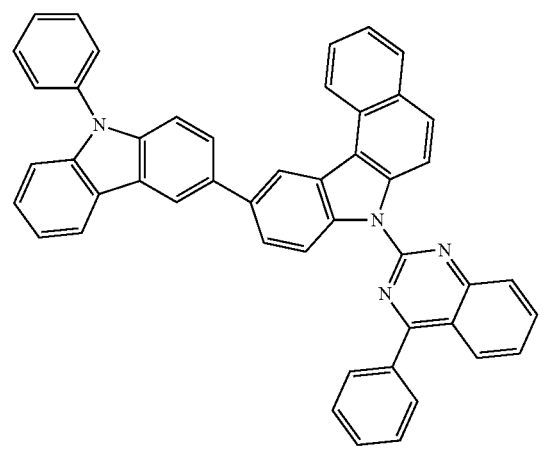
E-2-7
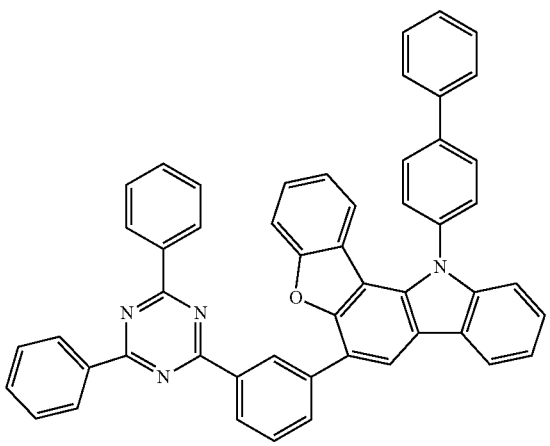
E-2-8
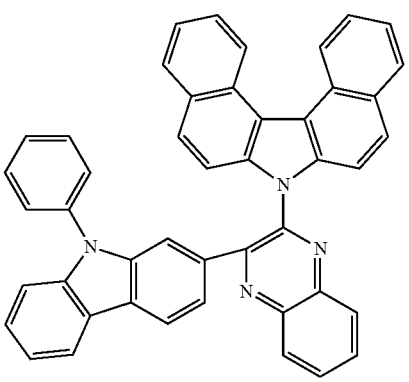
E-2-9
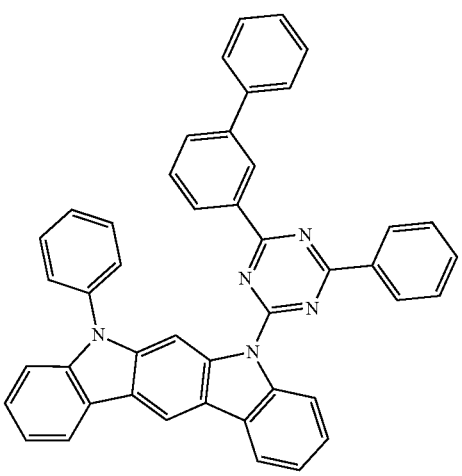

E-2-10
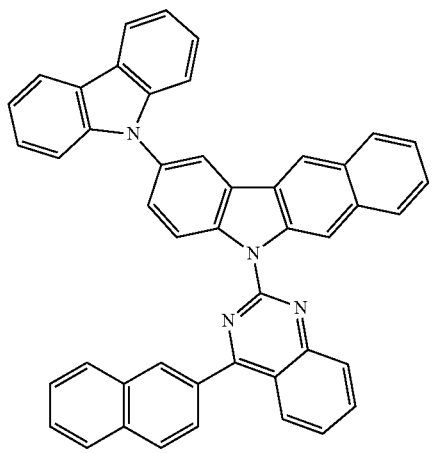
E-2-11
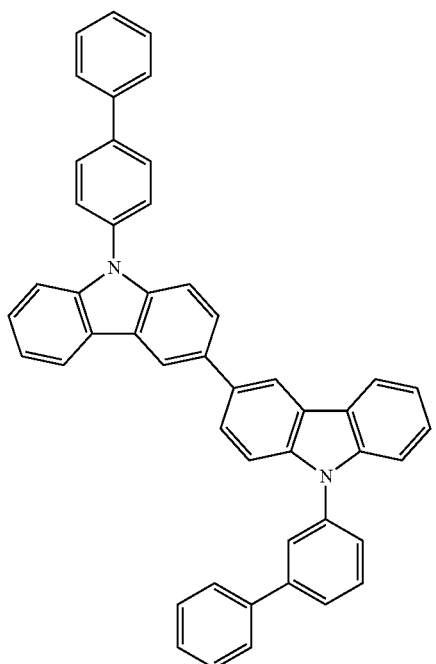
E-2-12
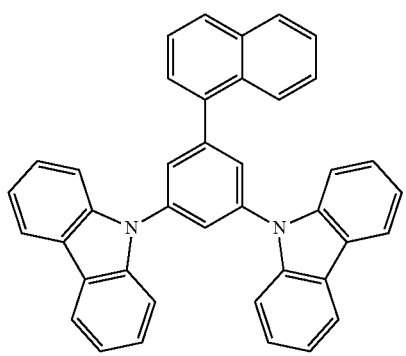
E-2-13
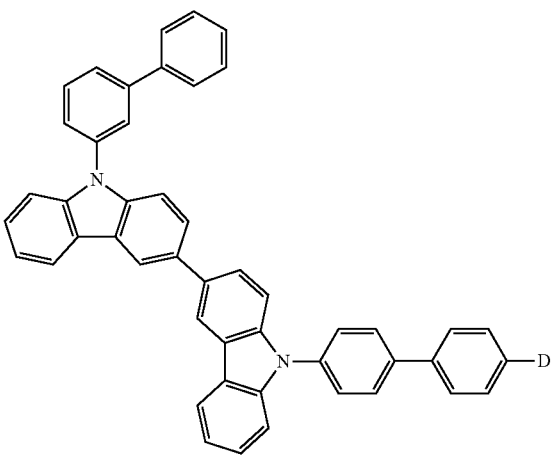
E-2-14
E-2-15
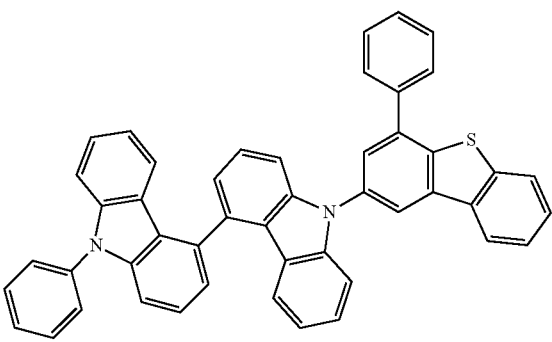

-continued
E-2-16
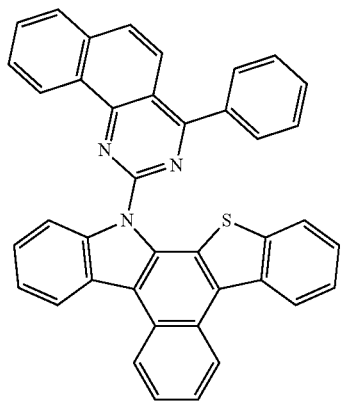
E-2-17
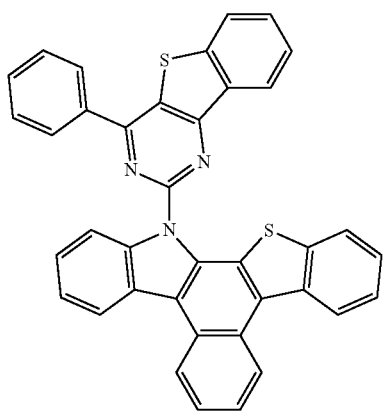
E-2-18
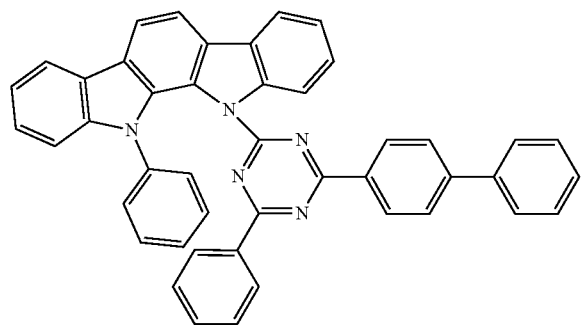
E-2-19
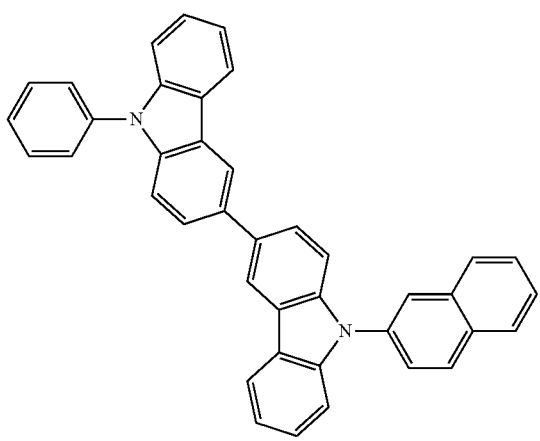
E-2-20
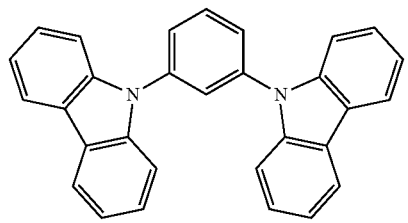
E-2-21
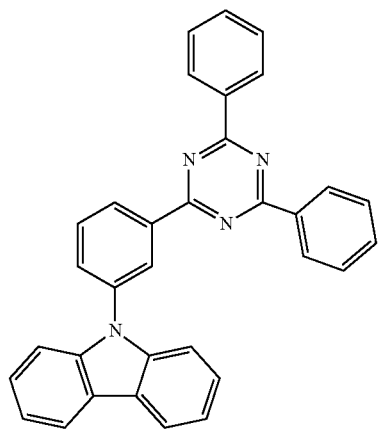
E-2-22
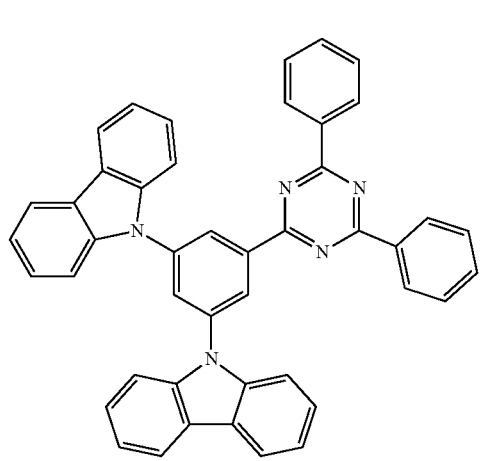
E-2-23
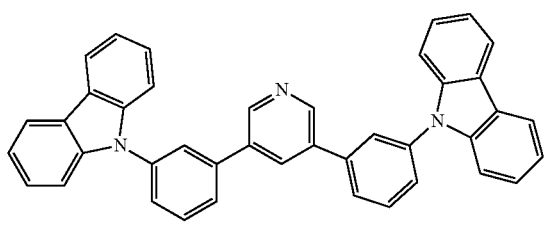

-continued

E-2-24

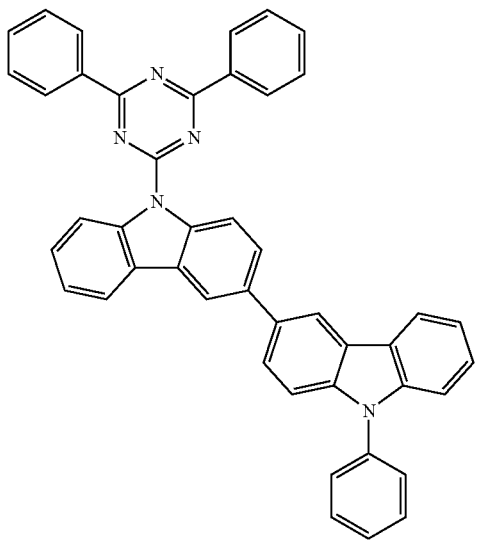

E-2-25

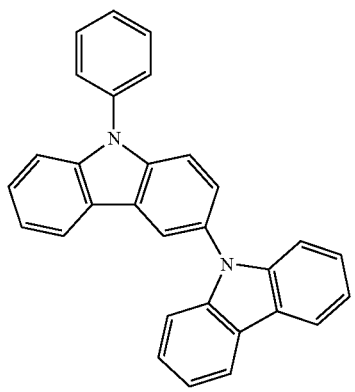

The emission layer EML may further include a suitable host material. For example, the emission layer EML may include, as a host material, at least one of bis (4-(9H-carbazol-9-yl) phenyl) diphenylsilane (BCPDS), (4-(1-(4-(diphenylamino) phenyl) cyclohexyl) phenyl) diphenylphosphine oxide (POPCPA), bis[2-(diphenylphosphino) phenyl] ether oxide (DPEPO), 4,4'-bis(carbazol-9-yl) biphenyl (CBP), 1,3-bis(N-carbazolyl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, one or more embodiments of the present disclosure are not limited thereto. For example, tris(8-hydroxyquinolino)aluminum ($Alq_3$), 9,10-di(naphthalene-2-yl)anthracene (ADN), 2-tert-butyl-9,10-di(naphth-2-yl) anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene ($UGH_2$), hexaphenylcyclotrisiloxane ($DPSiO_3$), octaphenylcyclotetra siloxane ($DPSiO_4$), etc. may be used as the host material.

The emission layer EML may include a compound represented by Formula M-a or Formula M-b below. The compound represented by Formula M-a or Formula M-b may be used as a phosphorescence dopant material:

Formula M-a

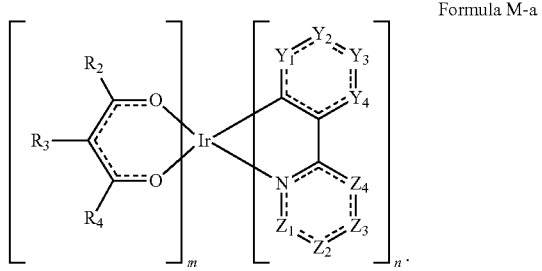

In Formula M-a, $Y_1$ to $Y_4$, and $Z_1$ to $Z_4$ may be each independently $CR_1$ or N, and $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. In Formula M-a, "m" is 0 or 1, and "n" is 2 or 3. In Formula M-a, if "m" is 0, "n" is 3, and if "m" is 1, "n" is 2.

The compound represented by Formula M-a may be used as a phosphorescence dopant.

The compound represented by Formula M-a may be represented by any one selected from among Compounds M-a1 to M-a25 below. However, Compounds M-a1 to M-a25 below are illustrations, and the compound represented by Formula M-a is not limited to the compounds represented by Compounds M-a1 to M-a25 below:

M-a1

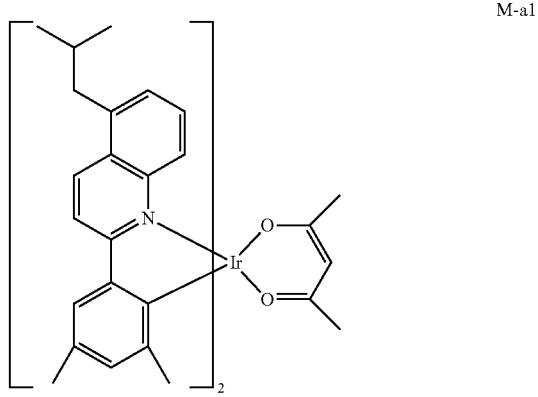

M-a2
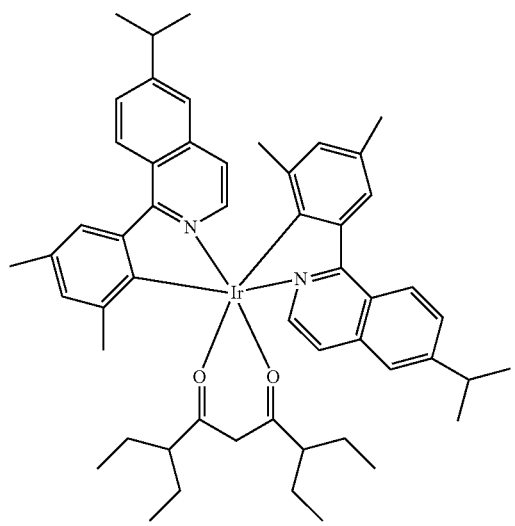
M-a3
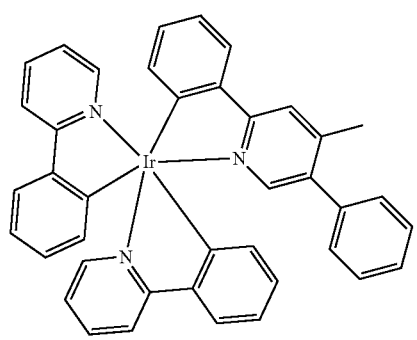
M-a4
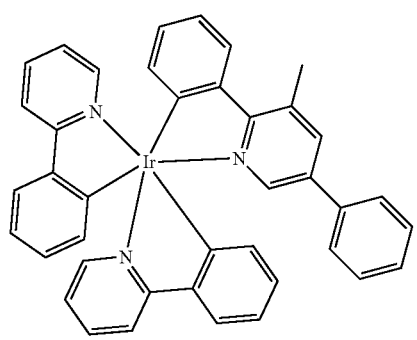
M-a5
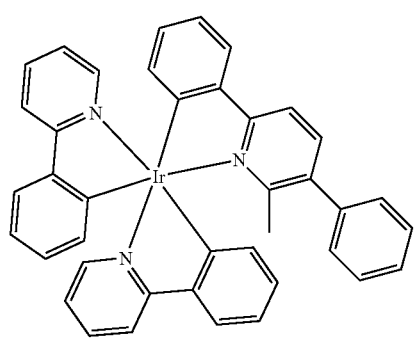
M-a6
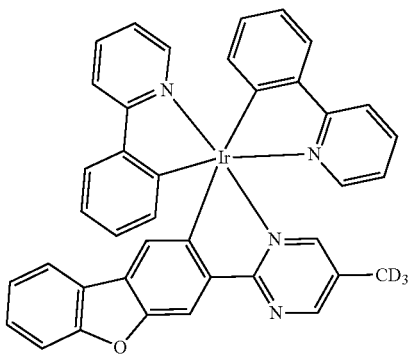
M-a7
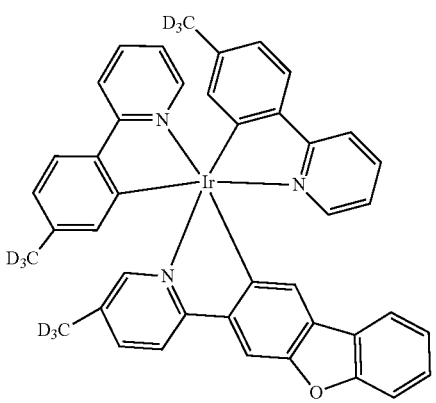
M-a8
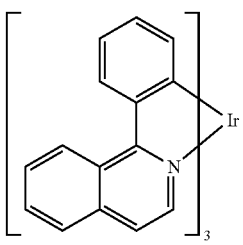
M-a9
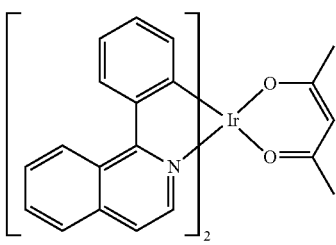
M-a10
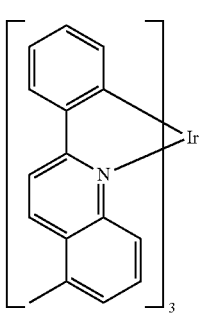

M-a11 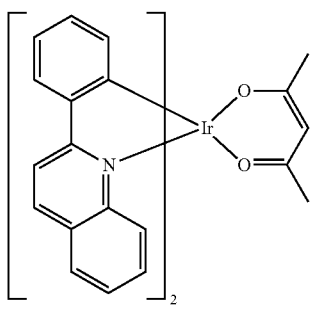
M-a16 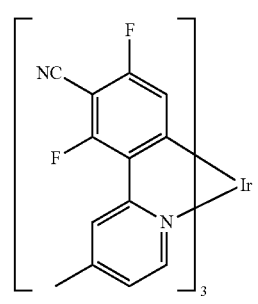
M-a12 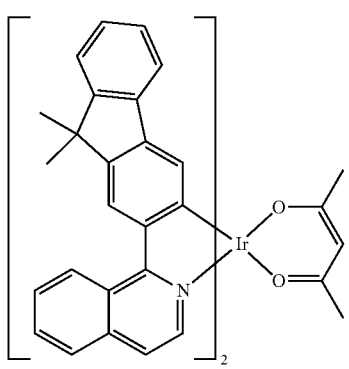
M-a17 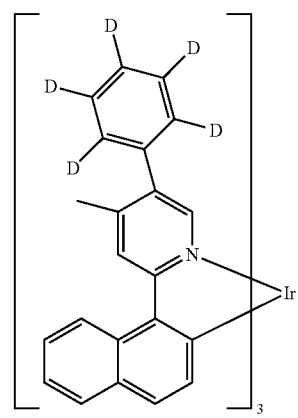
M-a13 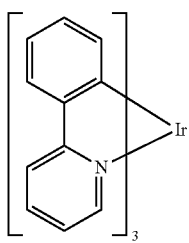
M-a18 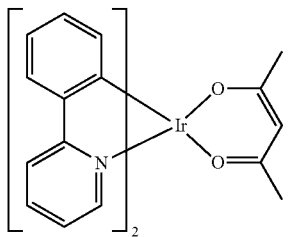
M-a14 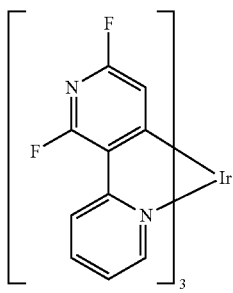
M-a15 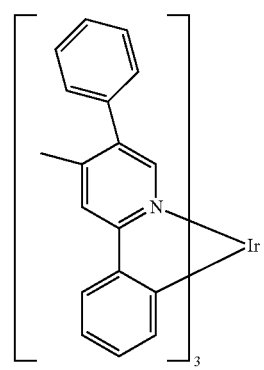
M-a19

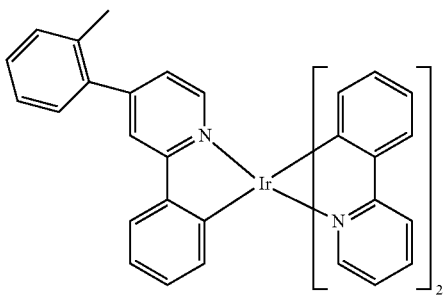

M-a20

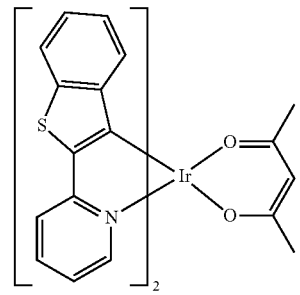

M-a25

Compound M-a1 and Compound M-a2 may be used as red dopant materials, and Compound M-a3 to Compound M-a7 may be used as green dopant materials.

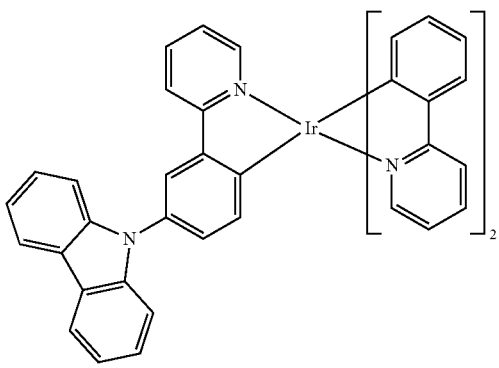

M-a21

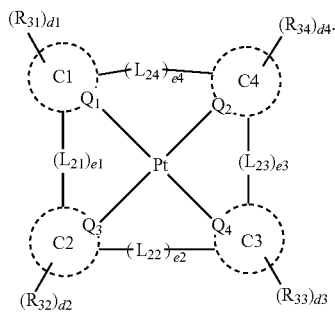

Formula M-b

In Formula M-b, $Q_1$ to $Q_4$ are each independently C or N, C1 to C4 are each independently a substituted or unsubstituted hydrocarbon ring of 5 to 30 ring-forming carbon atoms, or a substituted or unsubstituted heterocycle of 2 to 30 ring-forming carbon atoms. $L_{21}$ to $L_{24}$ are each independently a direct linkage,

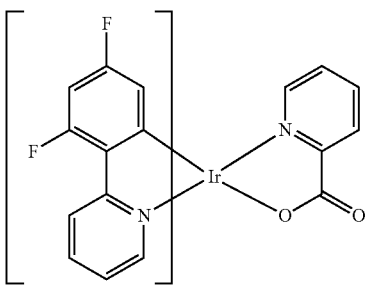

M-a22

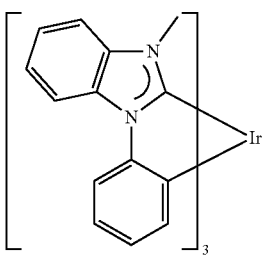

M-a23 a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring, and d1 to d4 are each independently an integer of 0 to 4.

The compound represented by Formula M-b may be used as a blue phosphorescence dopant or a green phosphorescence dopant.

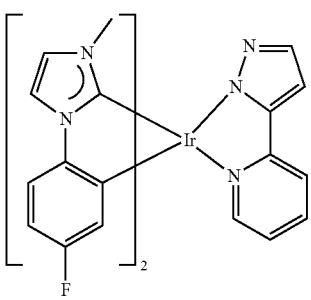

M-a24

The compound represented by Formula M-b may be represented by any one selected from among the compounds below. However, the compounds below are illustrations, and the compound represented by Formula M-b is not limited to the compounds represented below:
M-b-1
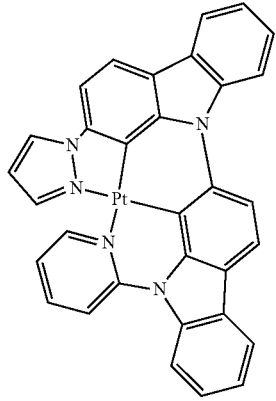
M-b-2
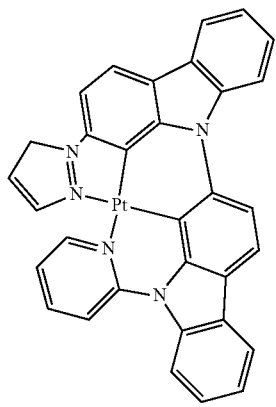
M-b-3
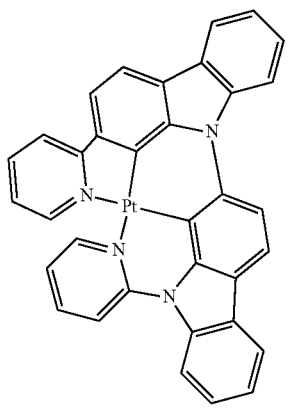
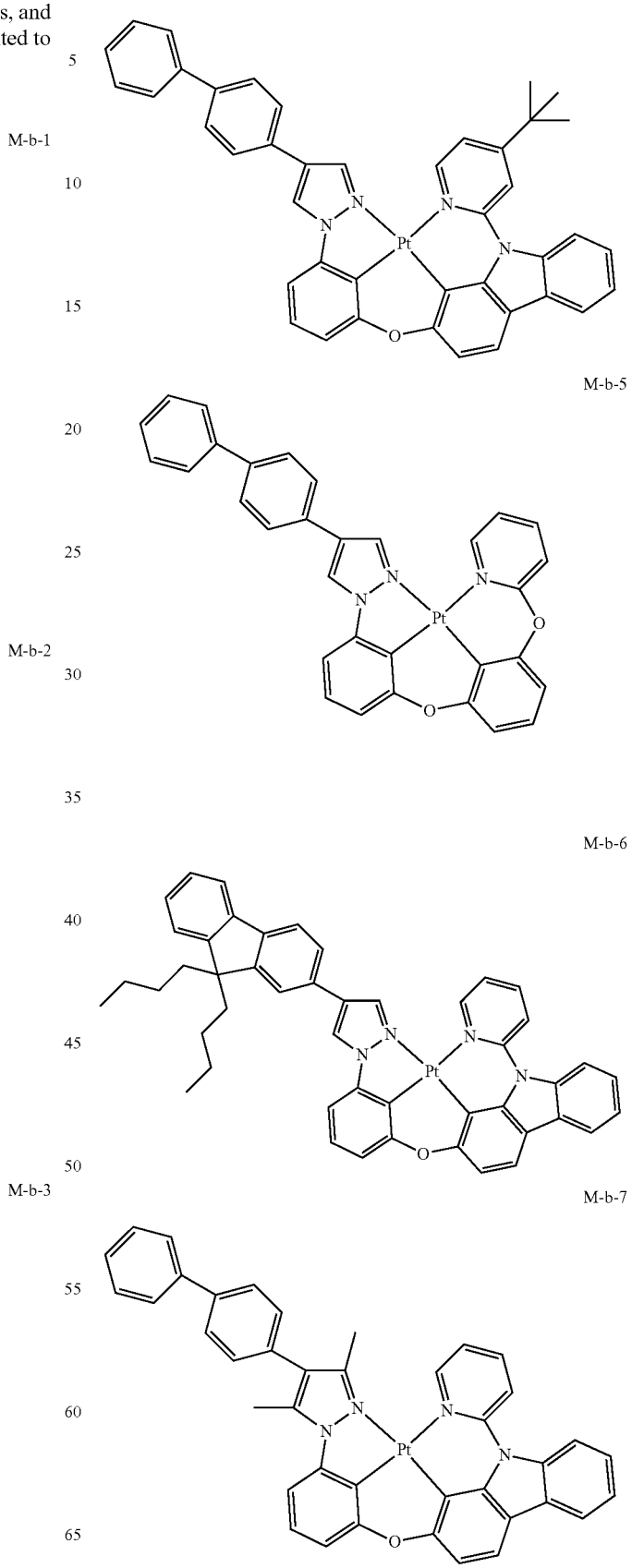

-continued

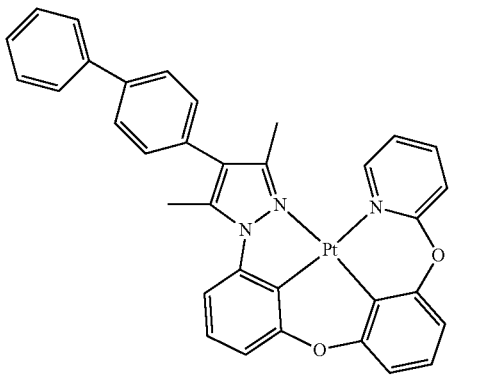
M-b-8

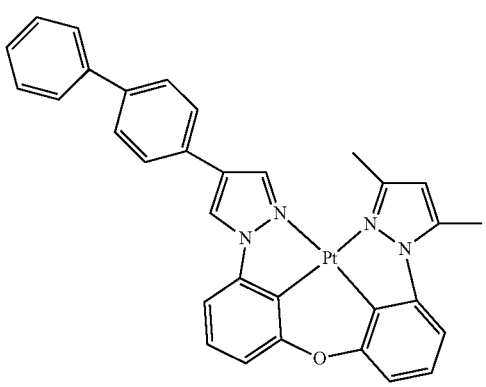
M-b-9

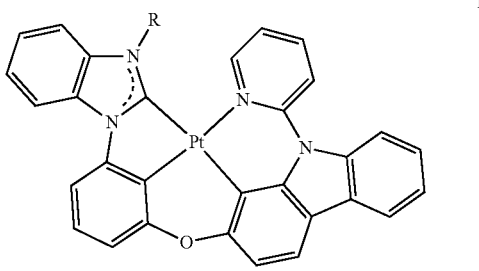
M-b-10

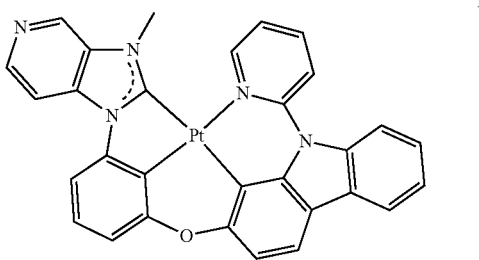
M-b-11

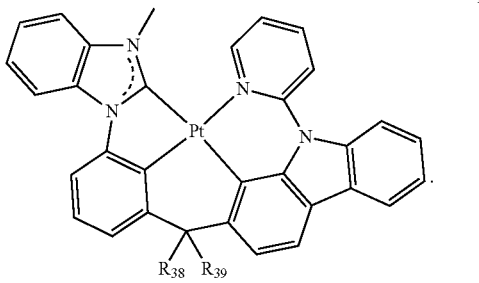
M-b-12

In the compounds above, R, $R_{38}$, and $R_{39}$ may be each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

The emission layer EML may include compounds represented by any one selected from among Formula F-a to Formula F-c below. The compounds represented by Formula F-a to Formula F-c below may be used as fluorescence dopant materials.

Formula F-a

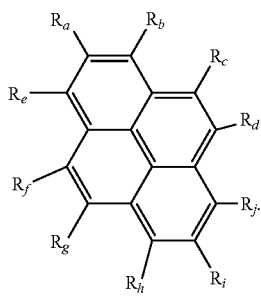

In Formula F-a, two selected from $R_a$ to $R_j$ may be each independently substituted with *———$NAr_1Ar_2$. The remainder not substituted with *———$NAr_1Ar_2$ among $R_a$ to $R_j$ may be each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In *———$NAr_1Ar_2$, $Ar_1$ and $Ar_2$ may be each independently a substituted or unsubstituted aryl group of 6 to 30 ring-forming carbon atoms, or a substituted or unsubstituted heteroaryl group of 2 to 30 ring-forming carbon atoms. For example, at least one selected from among $Ar_1$ and $Ar_2$ may be a heteroaryl group including O or S as a ring-forming atom.

The emission layer EML may include at least one selected from among Compounds FD1 to FD22 below as a fluorescence dopant:

FD1

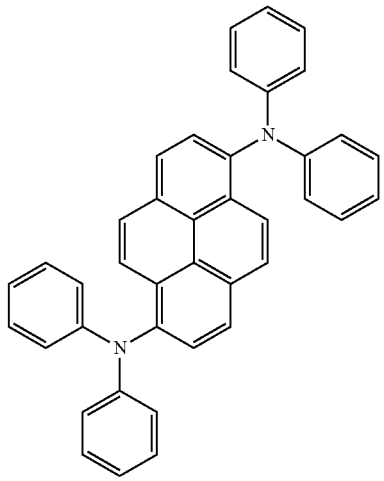

FD2
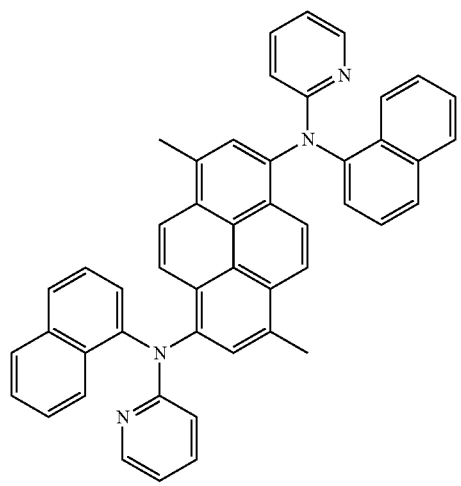
FD3
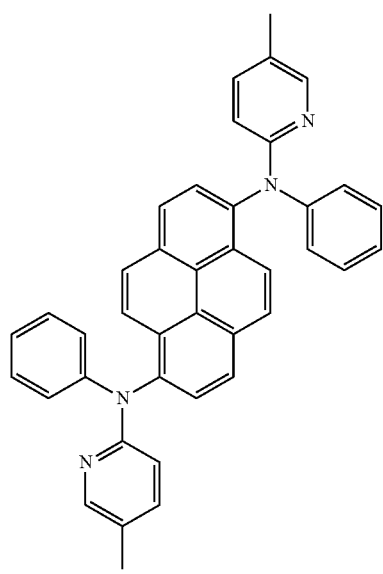
FD4
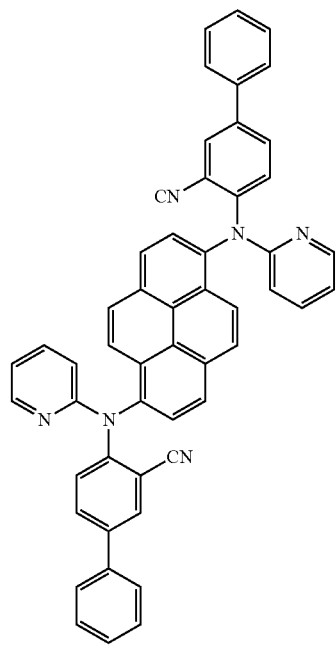
FD5
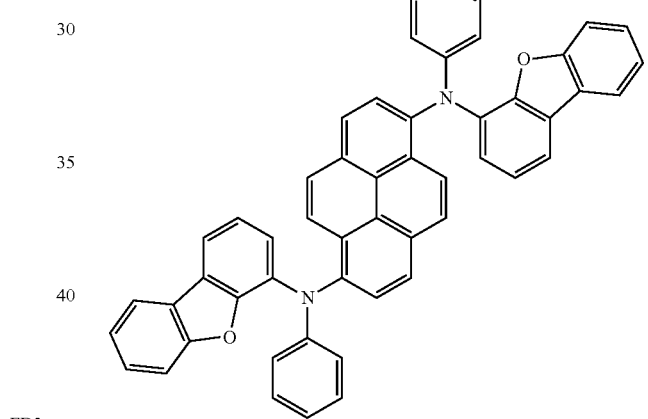
FD6
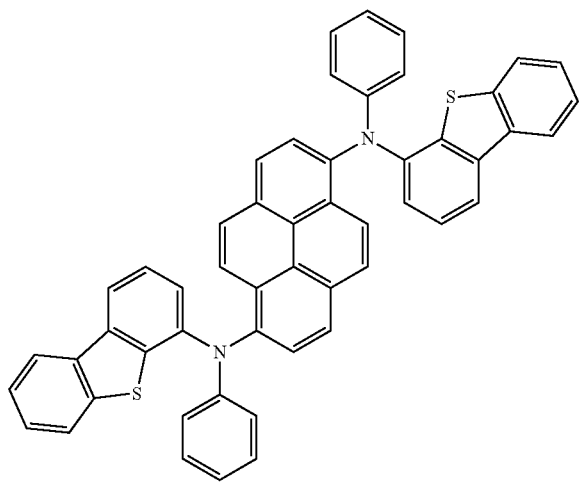

FD7
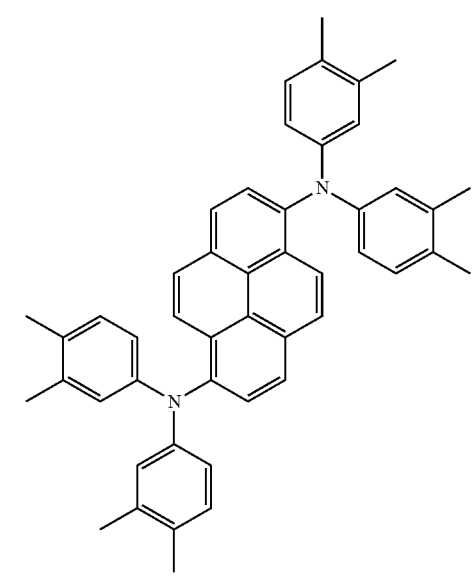
FD8
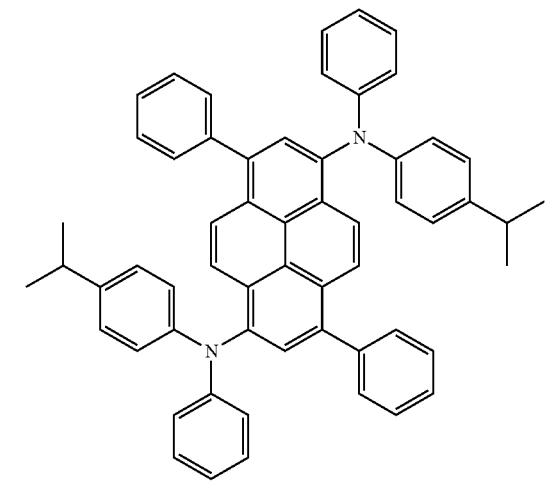
FD9
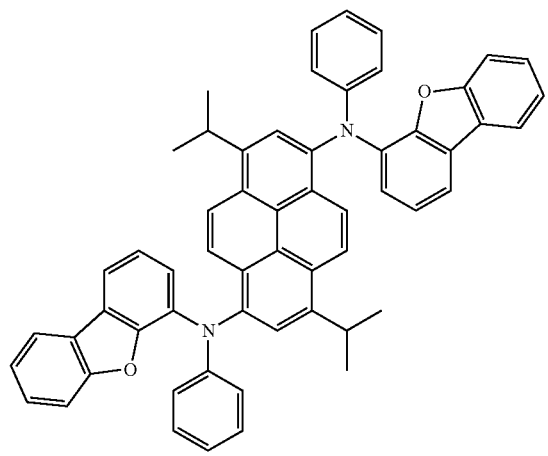
FD10
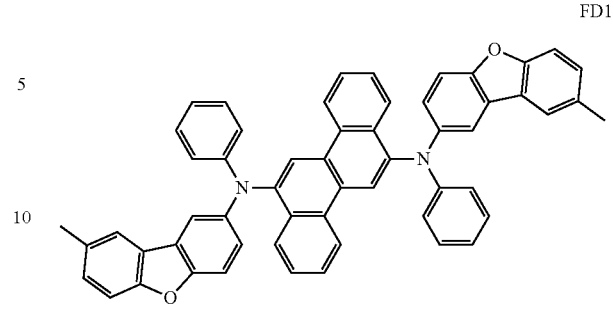
FD11
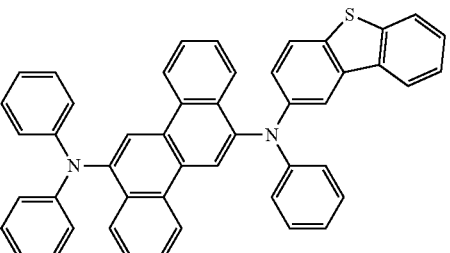
FD12
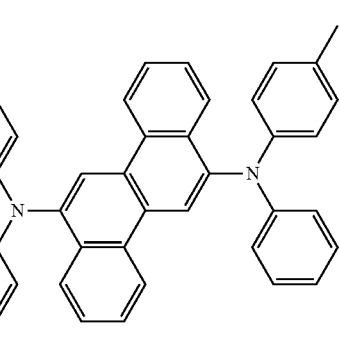
FD13
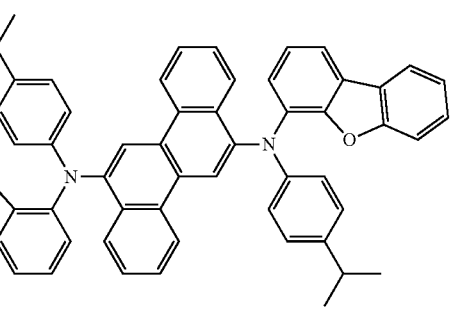
FD14
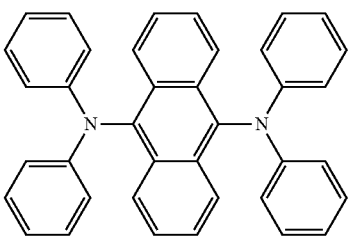

FD15
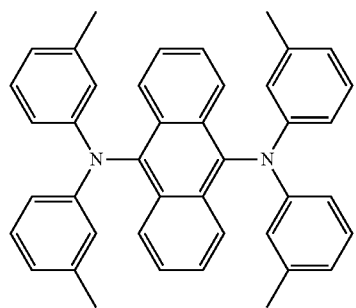
FD16
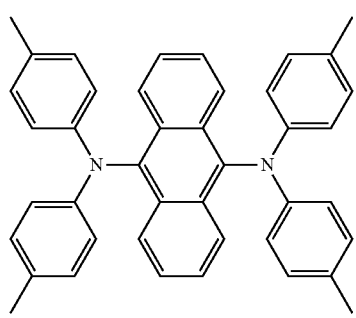
FD17
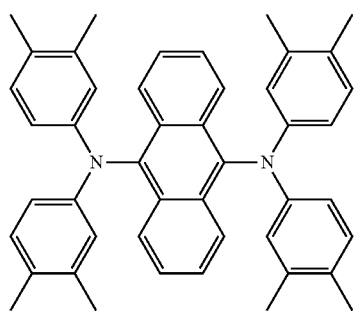
FD18
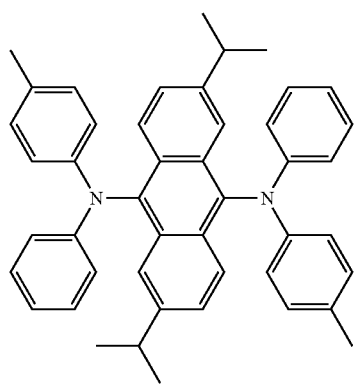
FD19
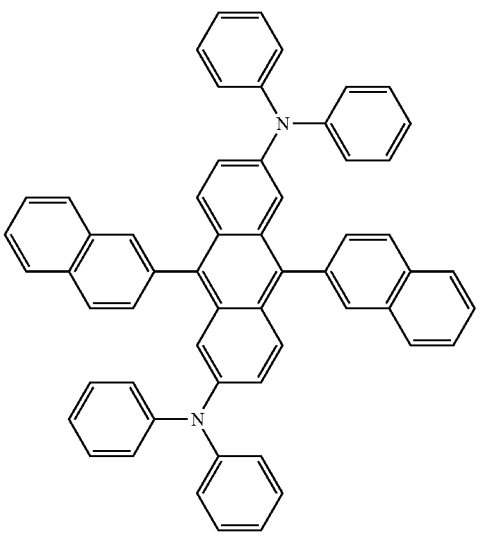
FD20
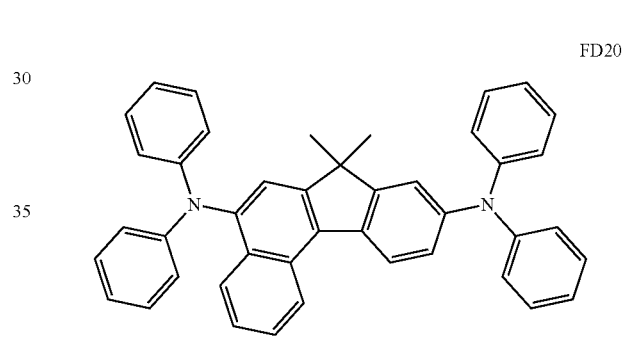
FD21
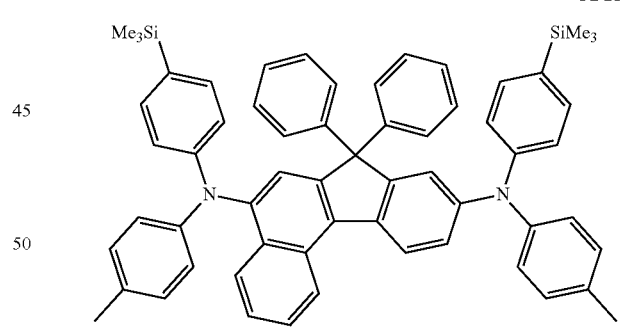
FD22
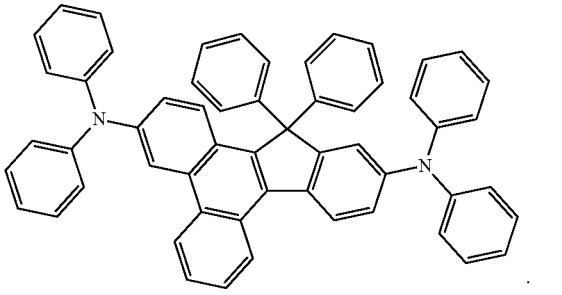

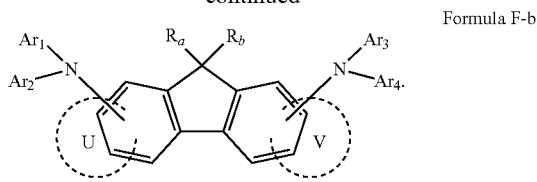

Formula F-b

In Formula F-b, $R_a$ and $R_b$ may be each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

In Formula F-b, $Ar_1$ to $Ar_4$ may be each independently a substituted or unsubstituted aryl group of 6 to 30 ring-forming carbon atoms, or a substituted or unsubstituted heteroaryl group of 2 to 30 ring-forming carbon atoms.

In Formula F-b, U and V may be each independently a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may be each independently 0 or 1. For example, in Formula F-b, if the number of U or V is 1, one ring forms a fused ring at the designated part by U or V, and if the number of U or V is 0, a ring is not present at the designated part by U or V. For example, if the number of U is 0, and the number of V is 1, or if the number of U is 1, and the number of V is 0, a fused ring having the fluorene core of Formula F-b may be a ring compound with four rings. If the number of both U and V is 0, the fused ring having the fluorene core of Formula F-b may be a ring compound with three rings. If the number of both U and V is 1, a fused ring having the fluorene core of Formula F-b may be a ring compound with five rings.

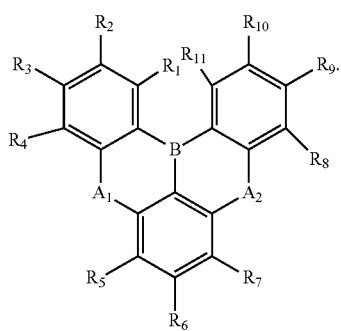

Formula F-c

In Formula F-c, $A_1$ and $A_2$ may be each independently O, S, Se, or $NR_m$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

In Formula F-c, $A_1$ and $A_2$ may be each independently combined with the substituents of an adjacent ring to form a fused ring. For example, if $A_1$ and $A_2$ are each independently $NR_m$, $A_1$ may be combined with $R_4$ or $R_5$ to form a ring. In one or more embodiments, $A_2$ may be combined with $R_7$ or $R_8$ to form a ring.

In one or more embodiments, the emission layer EML may include, as a suitable dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl] stilbene (DPAVB), N-(4-((E)-2-(6-((E)-4-(diphenylamino) styryl)naphthalen-2-yl)vinyl)phenyl)-N-phenylbenzenamine (N-BDAVBi), and/or 4,4'-bis[2-(4-(N,N-diphenylamino)phenyl)vinyl]biphenyl (DPAVBi)), perylene and/or the derivatives thereof (for example, 2,5,8,11-tetra-t-butylperylene (TBP)), pyrene and/or the derivatives thereof (for example, 1,1'-dipyrene, 1,4-dipyrenylbenzene, and/or 1,4-bis(N,N-diphenylamino)pyrene), etc.

The emission layer EML may include a suitable phosphorescence dopant material. For example, the phosphorescence dopant may use a metal complex including iridium (Ir), platinum (Pt), osmium (Os), gold (Au), titanium (Ti), zirconium (Zr), hafnium (Hf), europium (Eu), terbium (Tb), and/or thulium (Tm). For example, iridium(III) bis(4,6-difluorophenylpyridinato-N,C2')picolinato (FIrpic), bis(2,4-difluorophenylpyridinato)-tetrakis(1-pyrazolyl)borate iridium(III) (Fir$_6$), and/or platinum octaethyl porphyrin (PtOEP) may be used as the phosphorescence dopant. However, one or more embodiments of the present disclosure are not limited thereto.

The emission layer EML may include a quantum dot material. The core of the quantum dot may be selected from a II-VI group compound, a III-VI group compound, a group compound, a III-V group compound, a III-II-V group compound, a IV-VI group compound, a IV group element, a IV group compound, and combinations thereof.

The II-VI group compound may be selected from the group consisting of: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The III-VI group compound may include a binary compound such as In$_2$S$_3$, and/or In$_2$Se$_3$; a ternary compound such as InGaS$_3$ and/or InGaSe$_3$; or optional combinations thereof.

The I-III-VI group compound may be selected from a ternary compound selected from the group consisting of AgInS, AgInS$_2$, CuInS, CuInS$_2$, AgGaS$_2$, CuGaS$_2$, CuGaO$_2$, AgGaO$_2$, AgAlO$_2$ and mixtures thereof; and a quaternary compound such as AgInGaS$_2$ and/or CuInGaS$_2$.

The III-V group compound may be selected from the group consisting of a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In one or more embodiments, the III-V group compound may further include a II group metal. For example, InZnP, etc. may be selected as a III-II-V group compound.

The IV-VI group compound may be selected from the group consisting of a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof. The IV group element may be selected from the group consisting of Si, Ge, and a mixture thereof. The IV group compound may be a binary compound selected from the group consisting of SiC, SiGe, and a mixture thereof.

In one or more embodiments, the binary compound, the ternary compound, and/or the quaternary compound may be present at uniform concentration in a particle or may be present at a partially different concentration distribution state in the same particle. In addition, a core/shell structure in which one quantum dot wraps another quantum dot may be possible. The interface of the core and the shell may have a concentration gradient in which the concentration of an element present in the shell is decreased toward the center of the core.

In some embodiments, the quantum dot may have the above-described core/shell structure including a core including a nanocrystal and a shell wrapping (e.g., around) the core. The shell of the quantum dot may play the role of a protection layer for preventing or reducing the chemical deformation of the core to maintain semiconductor properties and/or a charging layer for imparting the quantum dot with electrophoretic properties. The shell may have a single layer or a multilayer. Examples of the shell of the quantum dot may include a metal oxide, a non-metal oxide, a semiconductor compound, and combinations thereof.

For example, the metal oxide and/or the non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO; or a ternary compound such as $MgAl_2O_4$, $CoFe_2O_4$, $NiFe_2O_4$ and/or $CoMn_2O_4$, but one or more embodiments of the present disclosure are not limited thereto.

Also, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but one or more embodiments of the present disclosure are not limited thereto.

The quantum dot may have a full width of half maximum (FWHM) of emission wavelength spectrum of about 45 nm or less, for example, about 40 nm or less, or about 30 nm or less. Within any of these ranges, color purity and/or color reproducibility may be improved. In addition, light emitted via such quantum dot is emitted in all directions, and light view angle properties may be improved.

The shape of the quantum dot may be any suitable shape in the art, without specific limitation. For example, the shape of spherical, pyramidal, multi-arm, and/or cubic nanoparticle, nanotube, nanowire, nanofiber, nanoplate, etc. may be used.

The quantum dot may control the color of light emitted according to the particle size, and accordingly, the quantum dot may have various emission colors such as blue, red and green.

In the light emitting diode ED of one or more embodiments, for example as shown in FIG. 3 to FIG. 6, the electron transport region ETR is provided on the emission layer EML. The electron transport region ETR may include at least one of a hole blocking layer HBL, an electron transport layer ETL, or an electron injection layer EIL. However, one or more embodiments of the present disclosure are not limited thereto.

The electron transport region ETR may have a single layer formed using a single material, a single layer formed using multiple different materials, or a multilayer structure having multiple layers formed using multiple different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure formed using multiple different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, from about 1,000 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The electron transport region ETR may include a compound represented by Formula ET-1 below:

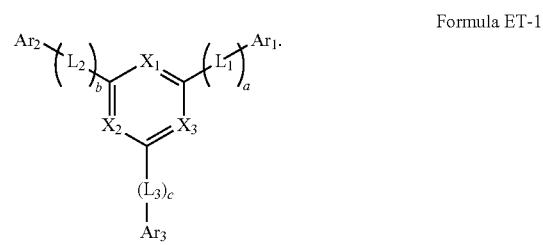

Formula ET-1

In Formula ET-1, at least one selected from among $X_1$ to $X_3$ is N, and the remainder are $CR_a$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $Ar_1$ to $Ar_a$ may be each independently a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, "a" to "c" may be each independently an integer of 0 to 10. In Formula ET-1, $L_1$ to $L_3$ may be each independently a direct linkage, a substituted or unsubstituted arylene group of 6 to 30 ring-forming carbon atoms, or a substituted or unsubstituted heteroarylene group of 2 to 30 ring-forming carbon atoms. In one or more embodiments, if "a" to "c" are integers of 2 or more, $L_1$ to $L_3$ may be each independently a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, one or more embodiments of the present disclosure are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) ($Bebq_2$), 9,10-di(naphthalene-2-yl)anthracene (ADN), 1,3-bis[3,5-di(pyridin-3-yl)phenyl]benzene (BmPyPhB), and/or mixture(s) thereof, without limitation.

The electron transport region ETR may include at least one selected from among Compounds ET1 to ET36 below:

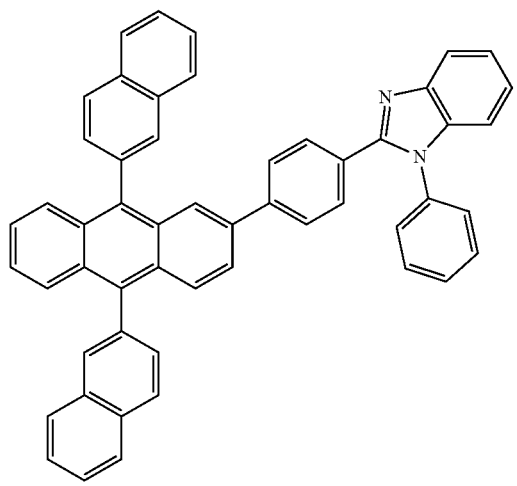

ET1

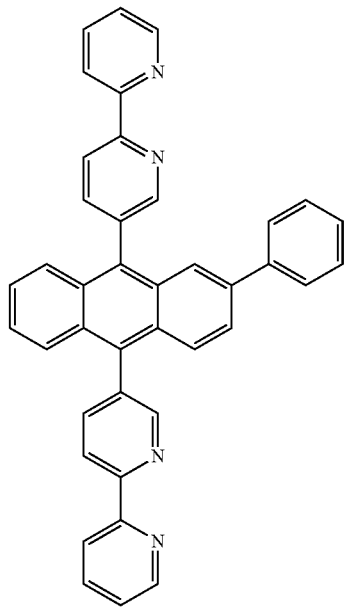

ET2

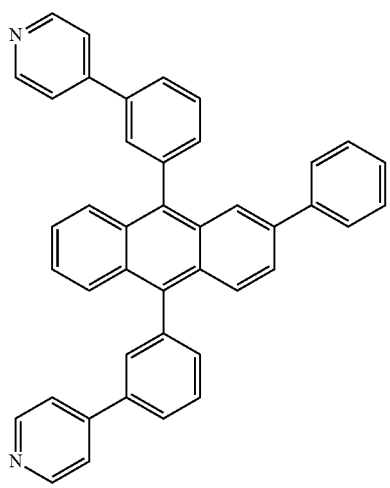

ET3

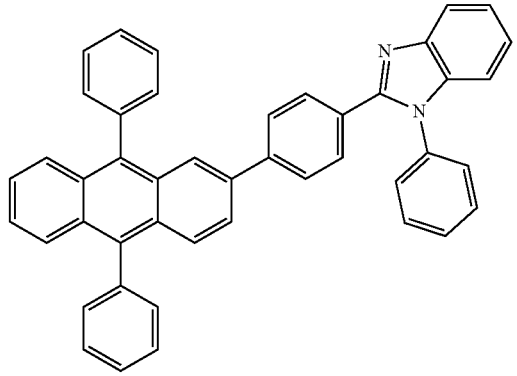

ET4

ET5
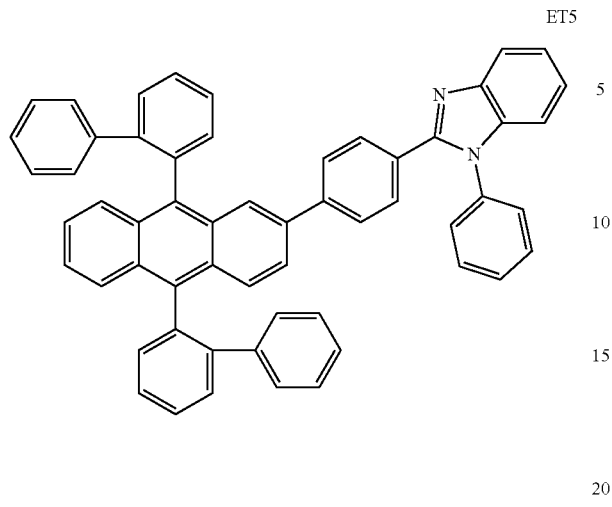
ET8
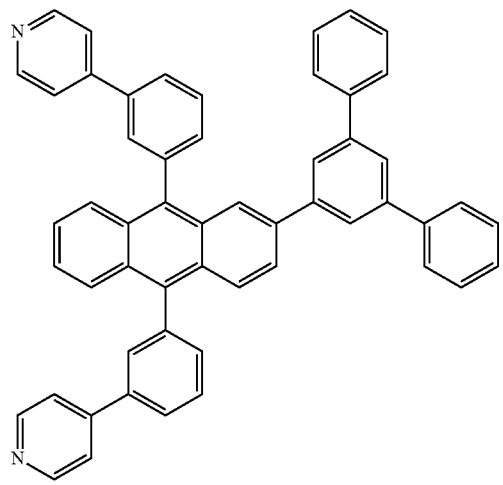
ET6
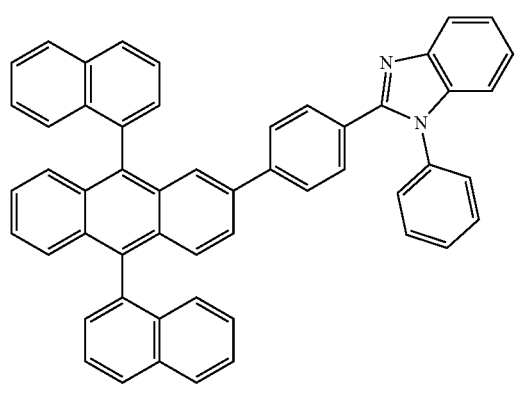
ET7
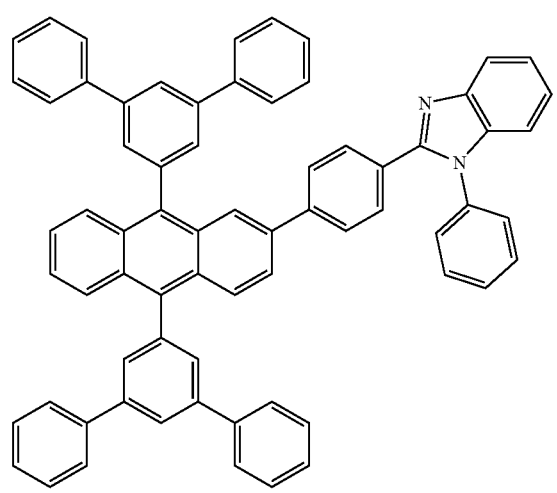
ET9
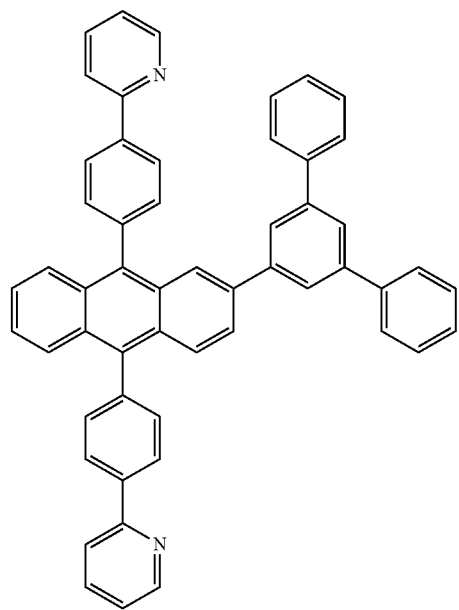

ET10
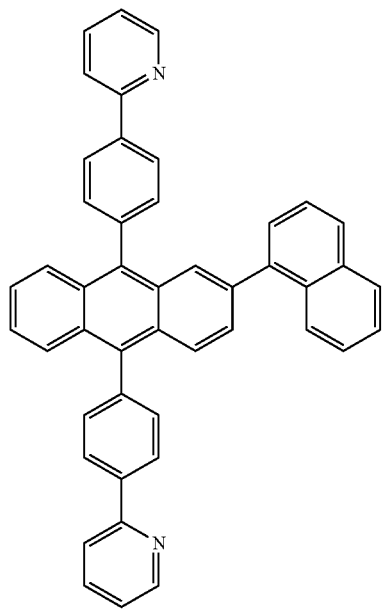
ET11
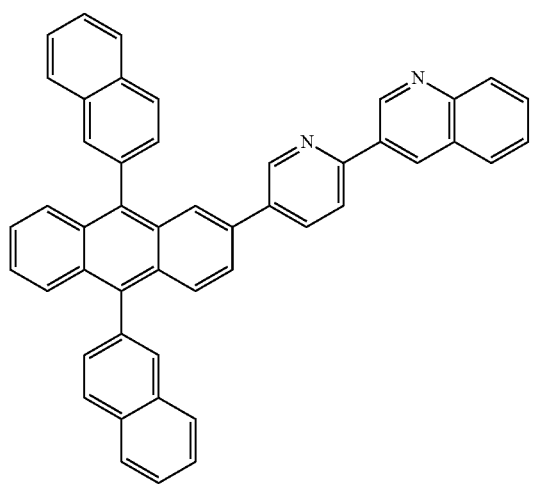
ET12
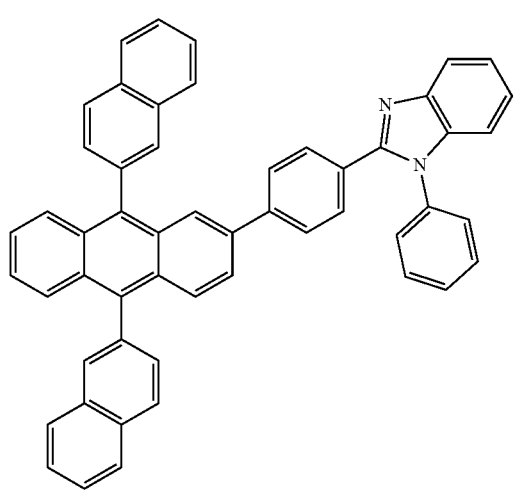
ET13
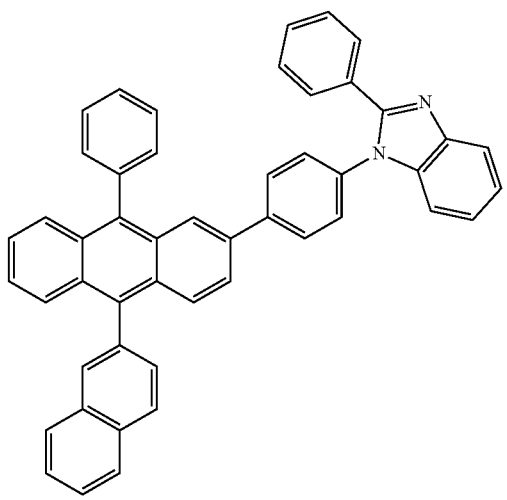
ET14
ET15
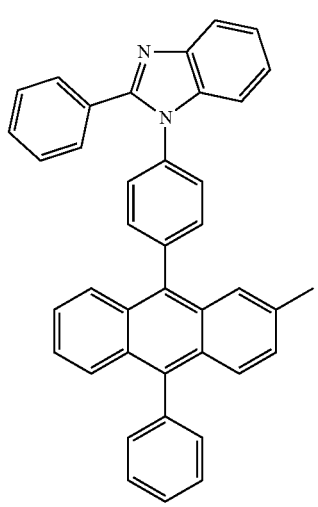

ET16
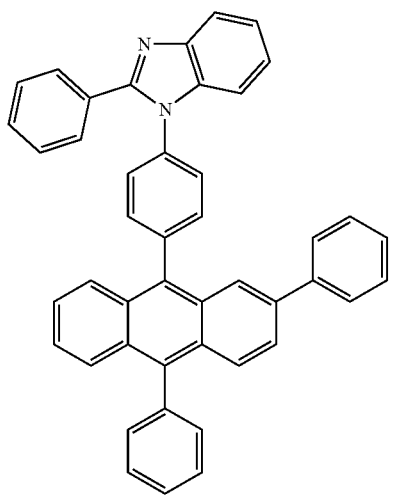
ET17
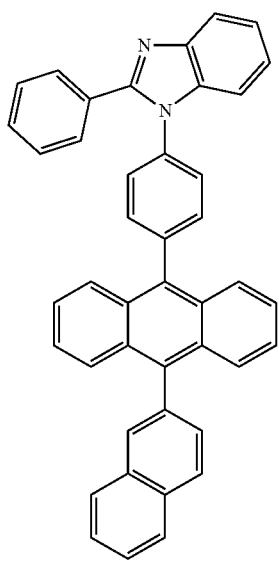
ET18
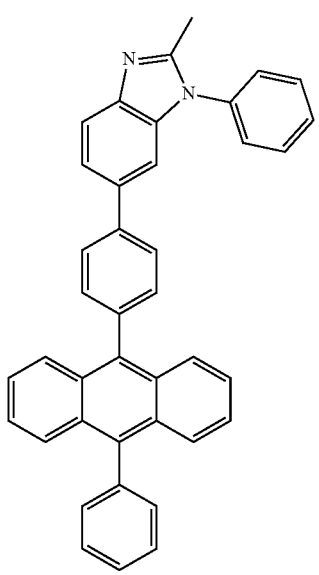
ET19
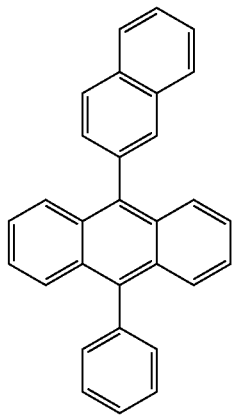
ET20
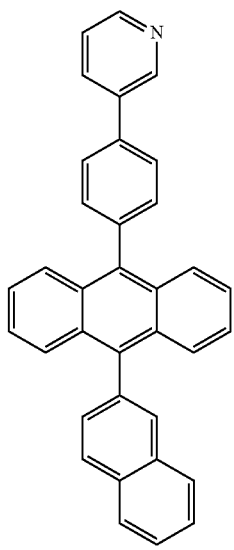
ET21
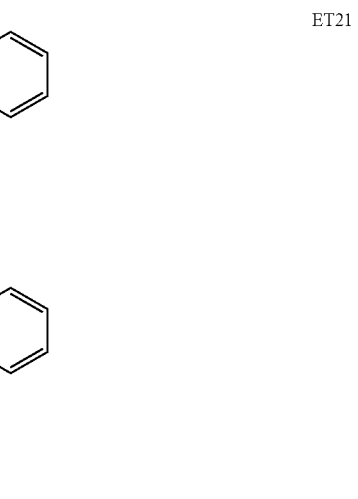

ET22
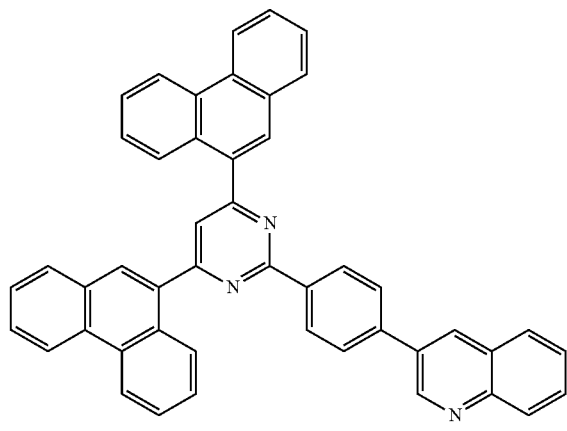
ET25
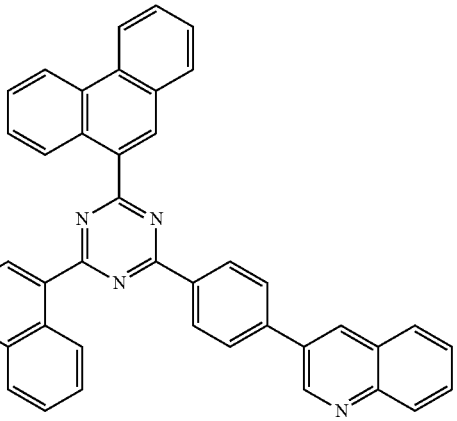
ET23
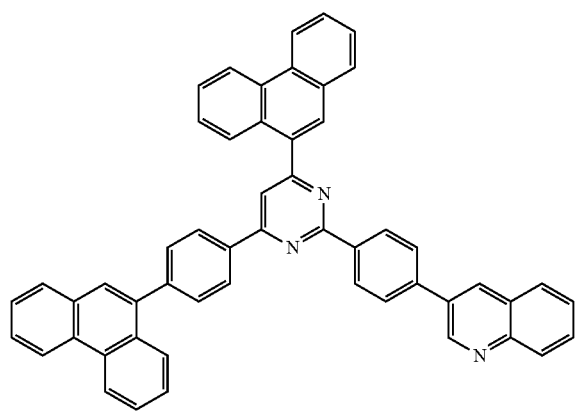
ET26
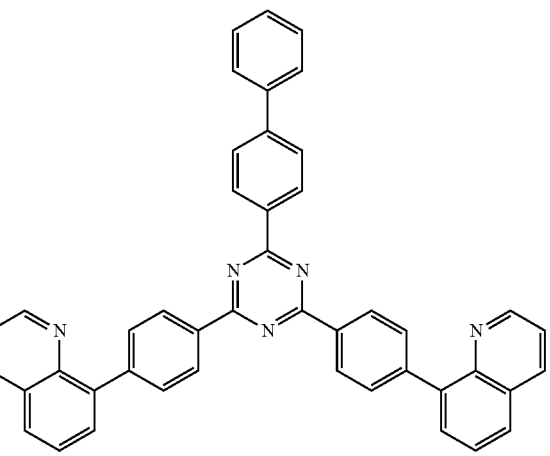
ET24
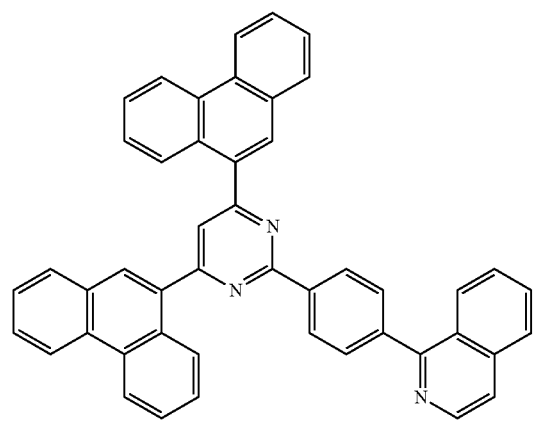
ET27
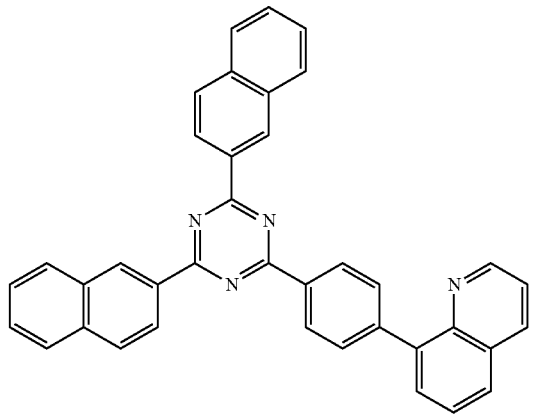

ET28
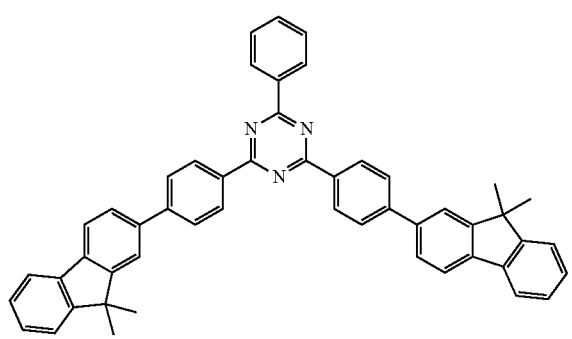
ET29
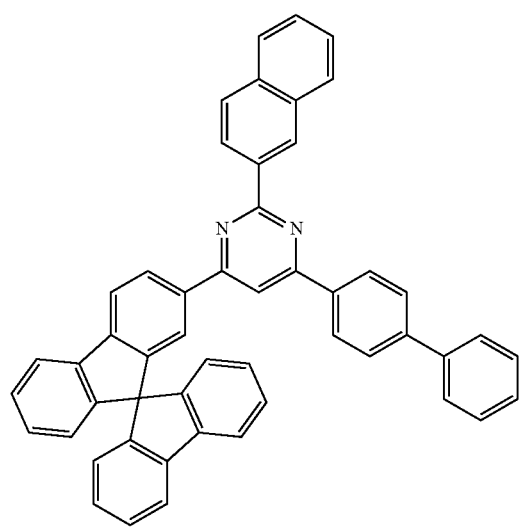
ET30
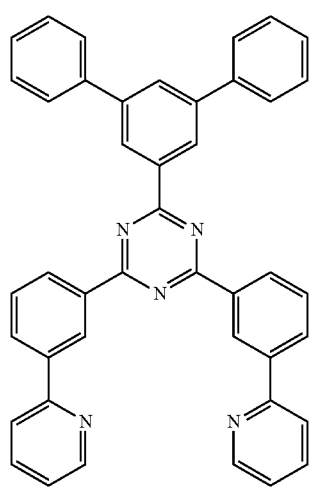
ET31
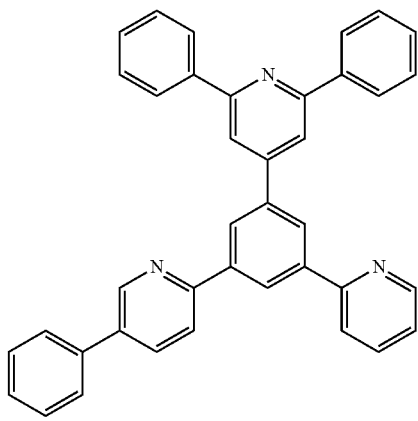
ET32
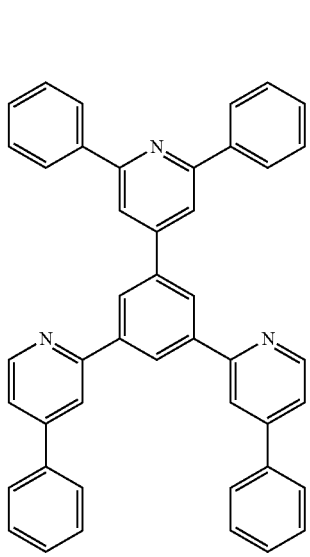
ET33
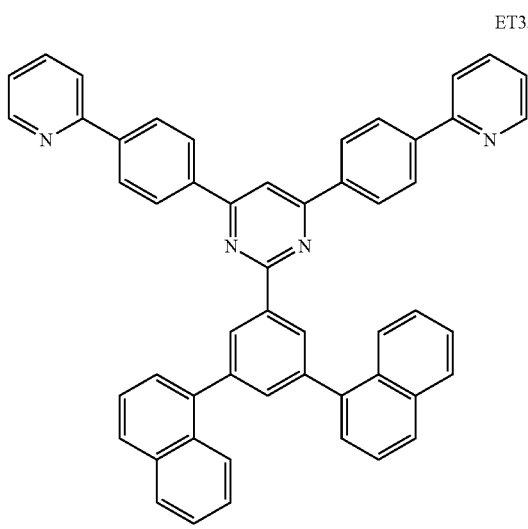

-continued

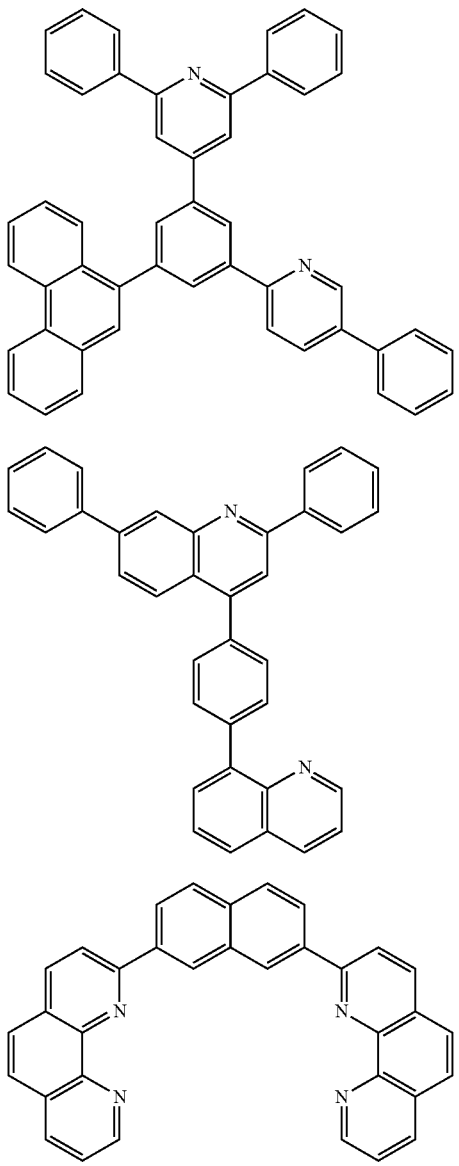

ET34

ET35

ET36

In one or more embodiments, the electron transport region ETR may include a metal halide such as LiF, NaCl, CsF, RbCl, RbI, CuI and/or KI; a metal in lanthanoides such as Yb; or a co-depositing material of the metal halide and the metal in lanthanoides. For example, the electron transport region ETR may include KI:Yb, RbI:Yb, etc., as the co-depositing material. In one or more embodiments, the electron transport region ETR may use a metal oxide such as $Li_2O$ and/or BaO; or 8-hydroxy-lithium quinolate (Liq). However, one or more embodiments of the present disclosure are not limited thereto. The electron transport region ETR also may be formed using a mixture material of an electron transport material and an insulating organo metal salt. The insulating organo metal salt may be a material having an energy band gap of about 4 eV or more. For example, the insulating organo metal salt may include metal acetates, metal benzoates, metal acetoacetates, metal acetylacetonates, and/or metal stearates.

The electron transport region ETR may include at least one of 2,9-dimethyl-4,7-diphenyl-1,10-phenanthroline (BCP), or 4,7-diphenyl-1,10-phenanthroline (Bphen) in addition to the aforementioned materials. However, one or more embodiments of the present disclosure are not limited thereto.

The electron transport region ETR may include the compounds of the electron transport region ETR in at least one selected from among an electron injection layer EIL, an electron transport layer ETL, and a hole blocking layer HBL.

If the electron transport region ETR includes the electron transport layer ETL, the thickness of the electron transport layer ETL may be from about 100 Å to about 1,000 Å, for example, from about 150 Å to about 500 Å. If the thickness of the electron transport layer ETL satisfies any of the above-described ranges, satisfactory (or suitable) electron transport properties may be obtained without a substantial increase of a driving voltage. If the electron transport region ETR includes the electron injection layer EIL, the thickness of the electron injection layer EIL may be from about 1 Å to about 100 Å, and for example, from about 3 Å to about 90 Å. If the thickness of the electron injection layer EIL satisfies any of the above described ranges, satisfactory (or suitable) electron injection properties may be obtained without a substantial increase of a driving voltage.

The second electrode EL2 is provided on the electron transport region ETR. The second electrode EL2 may be a common electrode. The second electrode EL2 may be a cathode or an anode, but one or more embodiments of the present disclosure are not limited thereto. For example, if the first electrode EL1 is an anode, the second electrode EL2 may be a cathode, and if the first electrode EL1 is a cathode, the second electrode EL2 may be an anode.

The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, compound(s) thereof, or mixture(s) thereof (for example, AgMg, AgYb, and/or MgAg). In one or more embodiments, the second electrode EL2 may have a multilayered structure including a reflective layer or a transflective layer formed using any of the above-described materials and a transparent conductive layer formed using ITO, IZO, ZnO, ITZO, etc. For example, the second electrode EL2 may include the aforementioned metal materials, combinations of two or more metal materials selected from the aforementioned metal materials, and/or oxides of the aforementioned metal materials.

In one or more embodiments, the second electrode EL2 may be connected with an auxiliary electrode. If the second electrode EL2 is connected with the auxiliary electrode, the resistance of the second electrode EL2 may decrease.

In one or more embodiments, on the second electrode EL2 in the light emitting diode ED of one or more embodiments, a capping layer CPL may be further disposed. The capping layer CPL may include a multilayer or a single layer.

In one or more embodiments, the capping layer CPL may be an organic layer or an inorganic layer. For example, if the capping layer CPL includes an inorganic material, the inorganic material may include an alkali metal compound such as LiF, an alkaline earth metal compound such as $MgF_2$, SiON, $SiN_x$, and/or $SiO_y$, etc.

For example, if the capping layer CPL includes an organic material, the organic material may include 2,2'-dimethyl-N, N'-di-[(1-naphthyl)-N,N'-diphenyl]-1,1'-biphenyl-4,4'-diamine (α-NPD), NPB, TPD, m-MTDATA, Alq₃, CuPc, N4,N4,N4',N4'-tetra(biphenyl-4-yl) biphenyl-4,4'-diamine (TPD15), 4,4',4"-tris(carbazol-9-yl) triphenylamine (TCTA), an epoxy resin, and/or acrylate such as methacrylate. In one or more embodiments, a capping layer CPL may include at least one selected from among Compounds P1 to P5 below, but one or more embodiments of the present disclosure are not limited thereto:

P1
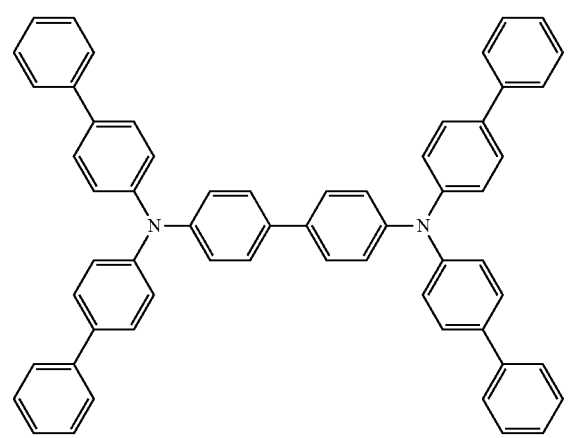

P2
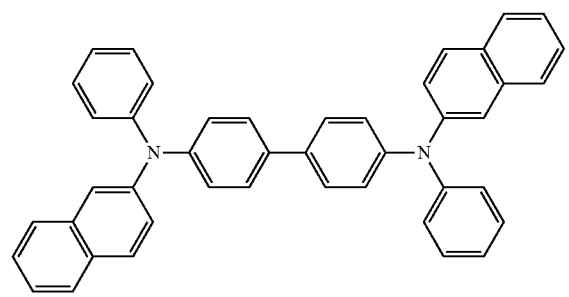

P3
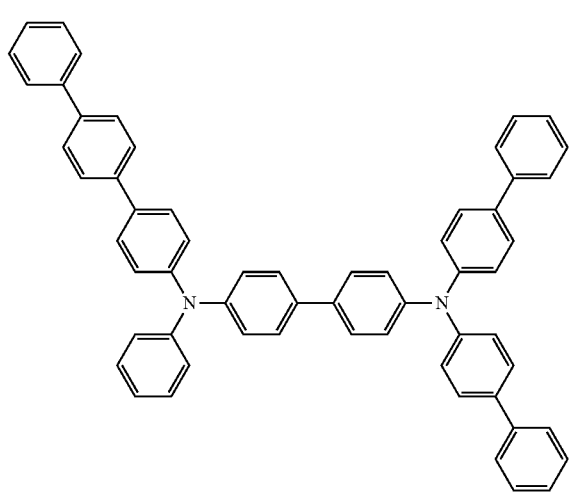

P4
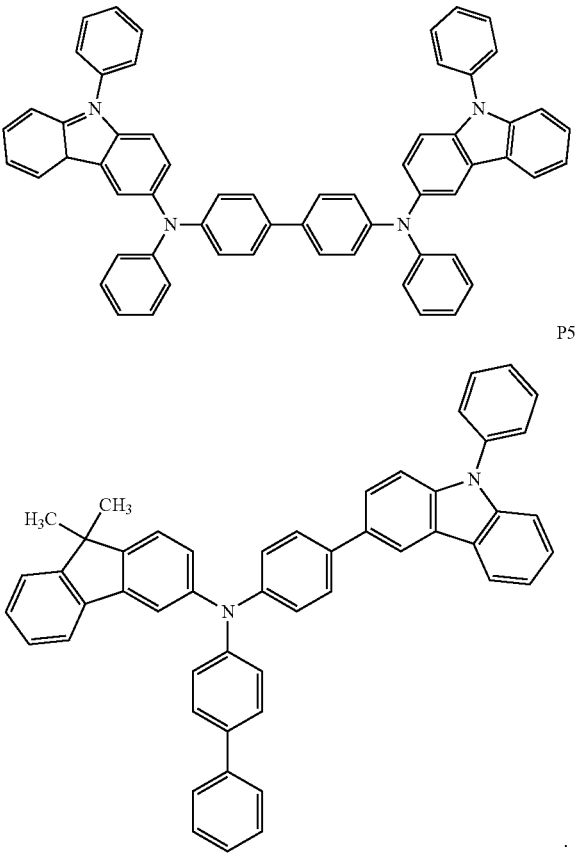

P5

In one or more embodiments, the refractive index of the capping layer CPL may be about 1.6 or more. For example, the refractive index of the capping layer CPL with respect to light in a wavelength range of about 550 nm to about 660 nm may be about 1.6 or more.

Figure 7:
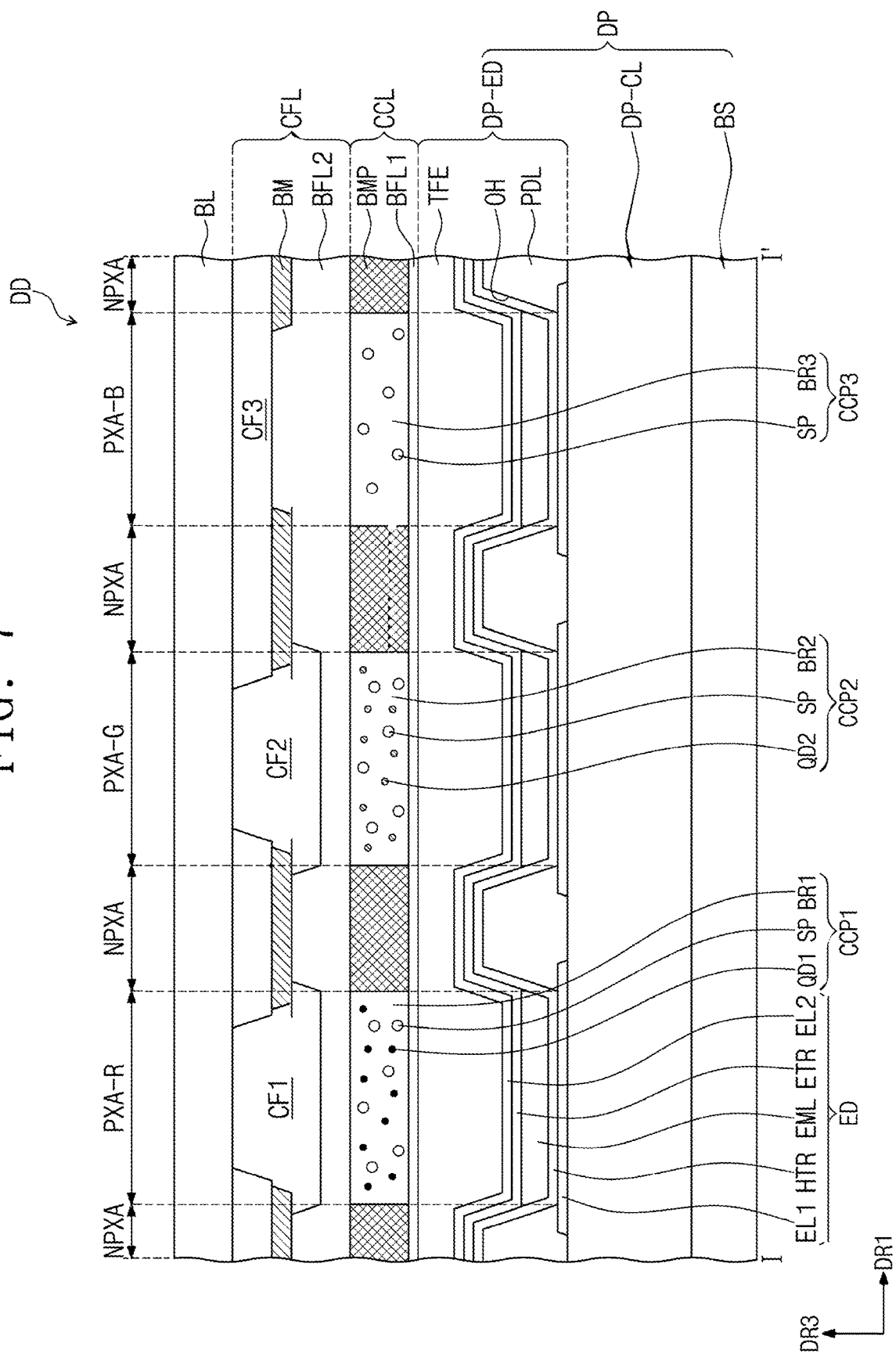
FIG. 7 is a cross-sectional view of a display apparatus according to one or more embodiments.
Figure 8:
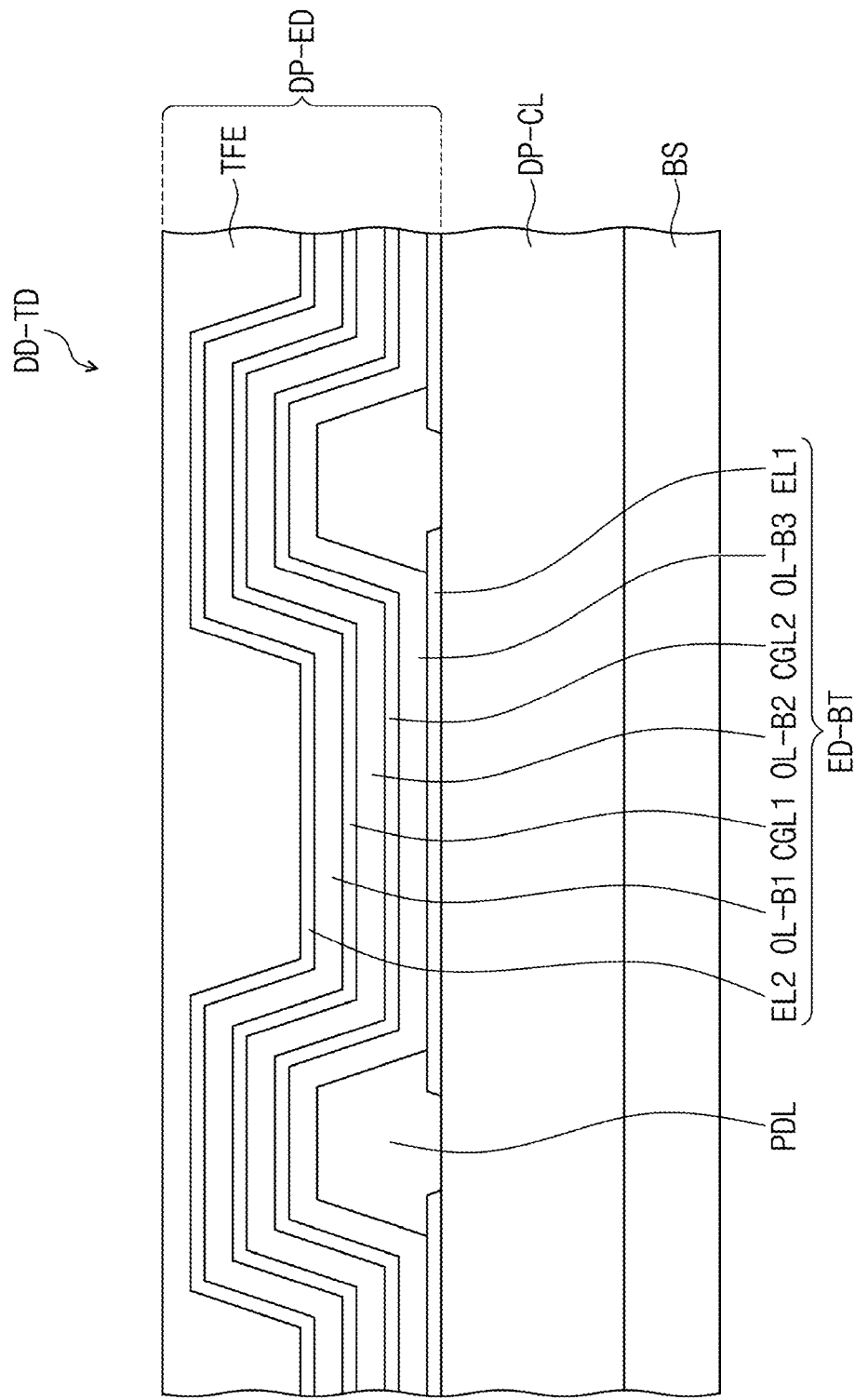
FIG. 8 is a cross-sectional view of a display apparatus according to one or more embodiments.

FIG. 7 and FIG. 8 are cross-sectional views of display apparatuses according to embodiments, respectively. In the explanation for the display apparatuses of embodiments, referring to FIG. 7 and FIG. 8, descriptions that are the same as or overlapping with the descriptions provided in connection with FIG. 1 to FIG. 6 will not be provided again, and the different features will be explained chiefly.

Referring to FIG. 7, the display apparatus DD according to one or more embodiments may include a display panel DP including a display device layer DP-ED, a light controlling layer CCL disposed on the display panel DP, and a color filter layer CFL.

In one or more embodiments shown in FIG. 7, the display panel DP includes a base layer BS, a circuit layer DP-CL provided on the base layer BS, and a display device layer DP-ED, and the display device layer DP-ED may include a light emitting diode ED.

The light emitting diode ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. In one or more embodiments, the description of the structures of the light emitting diodes ED of FIG. 3 to FIG. 6 may be applied to the structure of the light emitting diode ED shown in FIG. 7.

Referring to FIG. 7, the emission layer EML may be disposed in an opening part OH defined in a pixel definition layer PDL. For example, the emission layer EML divided by the pixel definition layer PDL and correspondingly provided to each of luminous areas PXA-R, PXA-G and PXA-B may emit light in the same wavelength region. In the display apparatus DD of one or more embodiments, the emission layer EML may emit blue light. In one or more embodiments, the emission layer EML may be provided as a common layer for all luminous areas PXA-R, PXA-G and PXA-B.

The light controlling layer CCL may be disposed on the display panel DP. The light controlling layer CCL may include a light converter. The light converter may be a quantum dot or a phosphor. The light converter may transform the wavelength of light provided and then emit the transformed light. For example, the light controlling layer CCL may be a layer including a quantum dot or a layer including a phosphor.

The light controlling layer CCL may include multiple light controlling parts CCP1, CCP2 and CCP3. The light controlling parts CCP1, CCP2 and CCP3 may be separated from one another.

Referring to FIG. 7, a partition pattern BMP may be disposed between the separated light controlling parts CCP1, CCP2 and CCP3, but one or more embodiments of the present disclosure are not limited thereto. In FIG. 7, the partition pattern BMP is shown not to be overlapped with the light controlling parts CCP1, CCP2 and CCP3, but at least a portion of the edge of the light controlling parts CCP1, CCP2 and/or CCP3 may be overlapped with the partition pattern BMP.

The light controlling layer CCL may include a first light controlling part CCP1 including a first quantum dot QD1 converting (e.g., to convert) first color light provided from the light emitting diode ED into second color light, a second light controlling part CCP2 including a second quantum dot QD2 converting (e.g., to convert) first color light into third color light, and a third light controlling part CCP3 transmitting (e.g., to transmit) first color light.

In one or more embodiments, the first light controlling part CCP1 may provide red light which is the second color light, and the second light controlling part CCP2 may provide green light which is the third color light. The third light controlling part CCP3 may transmit and provide blue light which is the first color light provided from the light emitting diode ED. For example, the first quantum dot QD1 may be a red quantum dot, and the second quantum dot QD2 may be a green quantum dot. For the quantum dots QD1 and QD2, the same description as that provided herein in connection with quantum dot may be applied.

In one or more embodiments, the light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but may include the scatterer SP.

The scatterer SP may be an inorganic particle. For example, the scatterer SP may include at least one selected from among $TiO_2$, ZnO, $Al_2O_3$, $SiO_2$, and hollow silica. The scatterer SP may include at least one selected from among $TiO_2$, ZnO, $Al_2O_3$, $SiO_2$, and hollow silica, or may be a mixture of two or more materials selected from among $TiO_2$, ZnO, $Al_2O_3$, $SiO_2$, and hollow silica.

The first light controlling part CCP1, the second light controlling part CCP2, and the third light controlling part CCP3 may respectively include base resins BR1, BR2 and BR3 respectively dispersing the quantum dots QD1 and QD2 and the scatterer SP. In one or more embodiments, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer SP dispersed in the third base resin BR3. The base resins BR1, BR2 and BR3 are mediums in which the quantum dots QD1 and QD2 and the scatterer SP are dispersed, and may be composed of one or more suitable resin compositions which may be generally referred to as a binder. For example, the base resins BR1, BR2 and BR3 may be acrylic-based resins, urethane-based resins, silicone-based resins, epoxy-based resins, etc. The base resins BR1, BR2 and BR3 may be transparent resins. In one or more embodiments, the first base resin BR1, the second base resin BR2 and the third base resin BR3 may be the same or different from each other.

The light controlling layer CCL may include a barrier layer BFL1. The barrier layer BFL1 may play the role of blocking or reducing the penetration of moisture and/or oxygen (hereinafter, will be referred to as "moisture/oxygen"). The barrier layer BFL1 may be disposed on the light controlling parts CCP1, CCP2 and CCP3 to block or reduce the exposure of the light controlling parts CCP1, CCP2 and CCP3 to moisture/oxygen. In one or more embodiments, the barrier layer BFL1 may cover the light controlling parts CCP1, CCP2 and CCP3. In some embodiments, the barrier layer BFL2 may be further provided between the light controlling parts CCP1, CCP2 and CCP3 and filters CF1, CF2 and CF3.

The barrier layers BFL1 and BFL2 may include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride, or any suitable metal thin film securing light transmittance. In one or more embodiments, the barrier layers BFL1 and BFL2 may further include an organic layer. The barrier layers BFL1 and BFL2 may be composed of a single layer or multiple layers.

In the display apparatus DD of one or more embodiments, the color filter layer CFL may be disposed on the light controlling layer CCL. For example, the color filter layer CFL may be disposed directly on the light controlling layer CCL. In this case, the barrier layer BFL2 may be omitted.

The color filter layer CFL may include a light blocking part BM and filters CF1, CF2 and CF3. The color filter layer CFL may include a first filter CF1 transmitting (e.g., to transmit) second color light, a second filter CF2 transmitting (e.g., to transmit) third color light, and a third filter CF3 transmitting (e.g., to transmit) first color light. For example, the first filter CF1 may be a red filter, the second filter CF2 may be a green filter, and the third filter CF3 may be a blue filter. Each of the filters CF1, CF2 and CF3 may include a polymer photosensitive resin and a pigment or dye. The first filter CF1 may include a red pigment or dye, the second filter CF2 may include a green pigment or dye, and the third filter CF3 may include a blue pigment or dye. However, embodiments of the present disclosure are not limited thereto, and the third filter CF3 may not include the pigment or dye. The third filter CF3 may include a polymer photosensitive resin and not include a pigment or dye. The third filter CF3 may be transparent. The third filter CF3 may be formed using a transparent photosensitive resin.

In one or more embodiments, the first filter CF1 and the second filter CF2 may be yellow filters. The first filter CF1 and the second filter CF2 may be provided in (e.g., as) one body without distinction.

The light blocking part BM may be a black matrix. The light blocking part BM may be formed by including an organic light blocking material and/or an inorganic light blocking material including a black pigment or black dye. The light blocking part BM may prevent or reduce light leakage phenomenon and divide the boundaries among adjacent filters CF1, CF2 and CF3. In one or more embodiments, the light blocking part BM may be formed as a blue filter.

The first to third filters CF1, CF2 and CF3 may be disposed corresponding, respectively, to a red luminous area PXA-R, a green luminous area PXA-G, and a blue luminous area PXA-B.

On the color filter layer CFL, a base substrate BL may be disposed. The base substrate BL may be a member providing a base surface on which the color filter layer CFL, the light controlling layer CCL, etc. are disposed. The base substrate BL may be a glass substrate, a metal substrate, a plastic substrate, etc. However, one or more embodiments of the present disclosure are not limited thereto, and the base substrate BL may be an inorganic layer, an organic layer, or a composite material layer. In one or more embodiments, the base substrate BL may be omitted.

FIG. 8 is a cross-sectional view showing a portion of the display apparatus according to one or more embodiments. In a display apparatus DD-TD of one or more embodiments, the light emitting diode ED-BT may include multiple light emitting structures OL-B1, OL-B2 and OL-B3. The light emitting diode ED-BT may include oppositely disposed first electrode EL1 and second electrode EL2, and the multiple light emitting structures OL-B1, OL-B2 and OL-B3 stacked in order in a thickness direction and provided between the first electrode EL1 and the second electrode EL2. Each of the multiple light emitting structures OL-B1, OL-B2 and OL-B3 may include an emission layer EML (FIG. 7), and a hole transport region HTR and an electron transport region ETR disposed with the emission layer EML (FIG. 7) therebetween.

For example, the light emitting diode ED-BT included in the display apparatus DD-TD of one or more embodiments may be a light emitting diode of a tandem structure including multiple emission layers EML.

In one or more embodiments shown in FIG. 8, light emitted from the light emitting structures OL-B1, OL-B2 and OL-B3 may be all blue light. However, one or more embodiments of the present disclosure are not limited thereto, and the wavelength regions of light emitted from the light emitting structures OL-B1, OL-B2 and OL-B3 may be different from each other. For example, the light emitting diode ED-BT including the multiple light emitting structures OL-B1, OL-B2 and OL-B3 emitting light in different wavelength regions may emit white light.

Between neighboring light emitting structures OL-B1, OL-B2 and OL-B3, charge generating layers CGL1 and CGL2 may be disposed. The charge generating layers CGL1 and CGL2 may include a p-type charge generating layer and/or an n-type charge generating layer.

The above-described polycyclic compound of one or more embodiments may be included in at least one of the light emitting structures OL-B1, OL-B2, and OL-B3 included in the display apparatus DD-TD of one or more embodiments.

The light emitting diode ED according to one or more embodiments of the present disclosure may include the polycyclic compound of one or more embodiments in at least one functional layer disposed between a first electrode EL1 and a second electrode EL2, and may show improved life. The light emitting diode ED according to one or more embodiments may include the polycyclic compound of one or more embodiments in at least one selected from among a hole transport region HTR, an emission layer EML, and an electron transport region ETR, disposed between the first electrode EL1 and the second electrode EL2, or in a capping layer CPL.

For example, the polycyclic compound according to one or more embodiments may be included in the emission layer EML of the light emitting diode ED of one or more embodiments, and the light emitting diode ED of one or more embodiments may show a low driving voltage, high efficiency and long-life characteristics.

The polycyclic compound of one or more embodiments may include a benzene ring with which boron atom is connected and a fused structure with the benzene ring as a center. With the benzene ring with which a boron atom is connected, S or Se may be directly connected at a para position relative to the boron atom. For example, a boron atom may be directly connected with a central benzene ring, and with the central benzene ring, S or Se may be directly connected at a para position relative to the boron atom.

The structure of the polycyclic compound of one or more embodiments may have improved multi-resonance and show heavy-atom effects. Due to the heavy-atom effects, intramolecular spin-orbital interaction may increase, and a reverse intersystem crossing rate may increase.

The light emitting diode of the present disclosure includes the polycyclic compound of the present disclosure in at least one functional layer, and may lead to markedly improved diode life.

Hereinafter, the polycyclic compound according to one or more embodiments and the light emitting diode of one or more embodiments including thereof will be explained by referring to embodiments and comparative embodiments. However, the embodiments below are only illustrations to assist the understanding of the present disclosure, and the scope of the present disclosure is not limited thereto.

Example 1. Synthesis of Polycyclic Compound

The synthetic method of a polycyclic compound of the present disclosure will be explained by illustrating the synthetic methods of Compound (A-1), Compound (A-2), Compound (A-3), Compound (A-7), and Compound (C-1). However, the synthetic methods of the polycyclic compounds explained hereinafter are embodiments, and the synthetic method of the polycyclic compound according to one or more embodiments of the present disclosure is not limited to the embodiments below.

1. Synthesis of Compound (A-1)
Reaction 1
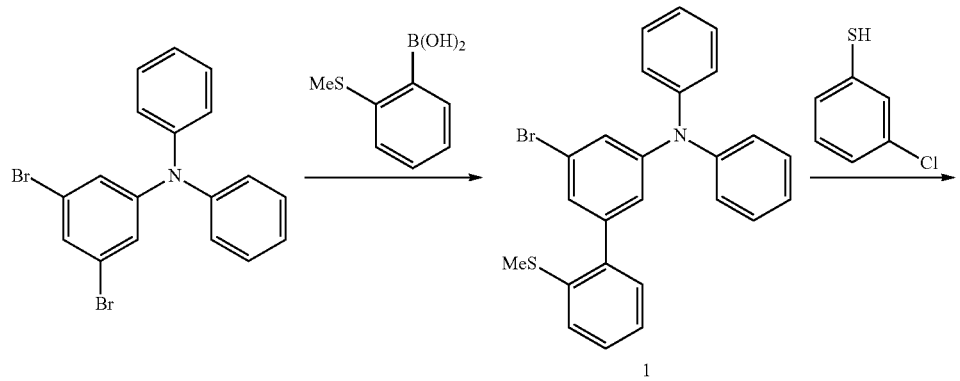
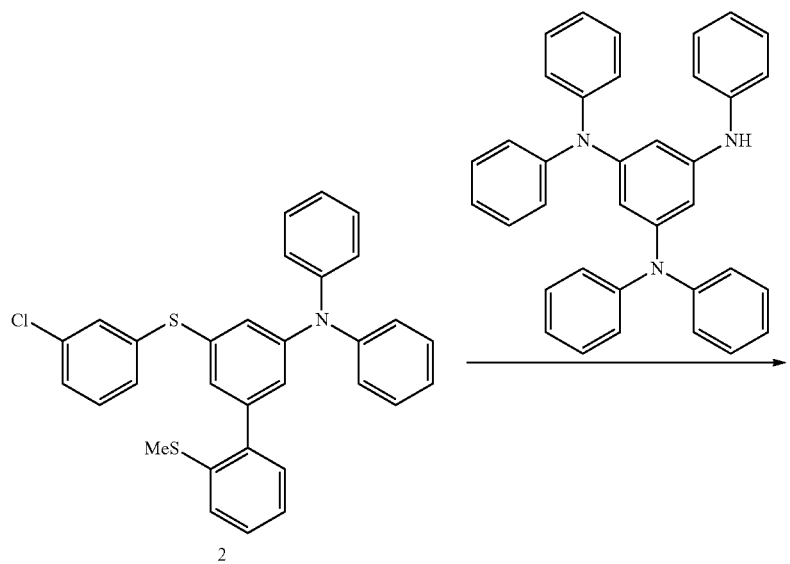
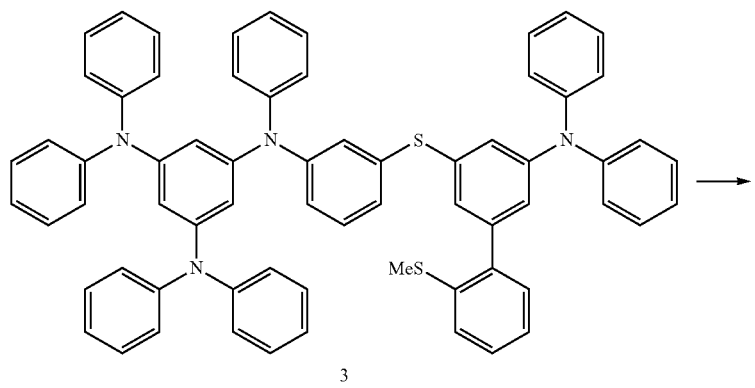

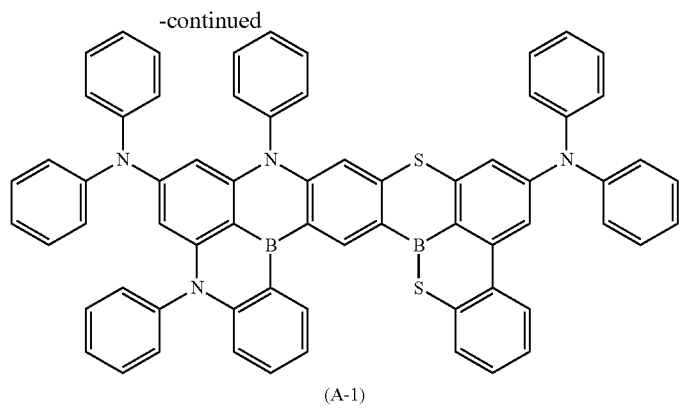

(A-1)

1-1) Synthesis of Intermediate 1

A mixture solution of dimethyl ether (DME) (300 ml) and water (100 ml) including 3,5-dibromo-N,N-diphenylaniline (18.3 g), 2-(methylthio)phenylboronic acid (8.4 g), Pd(PPh$_3$)$_4$ (0.5 g) and potassium carbonate (12.3 g) was heated and stirred at about 60° C. for about 1 hour. After cooling to room temperature, through liquid separation, a target material was extracted with ethyl acetate, and an organic layer was dried with magnesium sulfate and concentrated under a reduced pressure. The mixture thus obtained was separated by silica gel chromatography to obtain 14.0 g (yield 69%) of Intermediate 1.

1-2) Synthesis of Intermediate 2

An N-methylpyrrolidone (NMP) (250 ml) solution including Intermediate 1 obtained above (14 g), 3-chlorothiophenol (6.8 g), CuI (3 g) and potassium carbonate (12.5 g) was heated and stirred at about 200° C. for about 6 hours. The reaction was checked by thin-layer chromatography (TLC), and after finishing the reaction, the solution was cooled to room temperature. The reaction solution was poured into water, and a target material was extracted with a mixture solvent of hexane and ethyl acetate, dried with magnesium sulfate, and concentrated under a reduced pressure. The mixture thus obtained was separated by silica gel chromatography to obtain 12.5 g (yield 78%) of Intermediate 2.

1-3) Synthesis of Intermediate 3

A toluene (160 ml) solution including Intermediate 2 obtained above (11.7 g), $N^1,N^1,N^3,N^3,N^5$-pentaphenyl-1,3,5-benzenetriamine (13 g), sodium butoxide (7 g), Pd$_2$(dba)$_3$ (0.45 g) and P(tBu)$_3$/BF$_4$ (0.57 g) was heated and refluxed for about 7 hours. After cooling to room temperature, the reaction solution was poured into water. A target material was extracted with toluene, dried with magnesium sulfate, and concentrated under a reduced pressure. The mixture thus obtained was separated by silica gel chromatography to obtain 18.4 g (yield 82%) of Intermediate 3.

1-4) Synthesis of Compound (A-1)

A solution obtained by adding 1,2-dichlorobenzene (100 ml) to Intermediate 3 obtained above (10 g) was cooled to about 0° C., and BBr$_3$ (4 ml) was dropwisely added. After finishing the dropwise addition, the temperature was raised to about 120° C., and stirring was performed for about 1 hour. To the reaction solution, N,N-diisopropylethylamine (7 ml) was added, and the temperature was raised to about 160° C. The reaction was checked with TLC, and after about 5 hours and after confirming the disappearance of raw materials, an excessive amount of N,N-diisopropylethylamine was additionally added, and stirring was performed at about 160° C. for about 1 hour, and then, the temperature was reduced to room temperature. The mixture thus obtained was separated by silica gel chromatography twice to obtain 2.5 g (yield 25%) of Compound (A-1). By the measurement of FAB-MS, the molecular weight of 971 Compound (A-1) was confirmed.

2. Synthesis of Compound (A-2)

Reaction 2

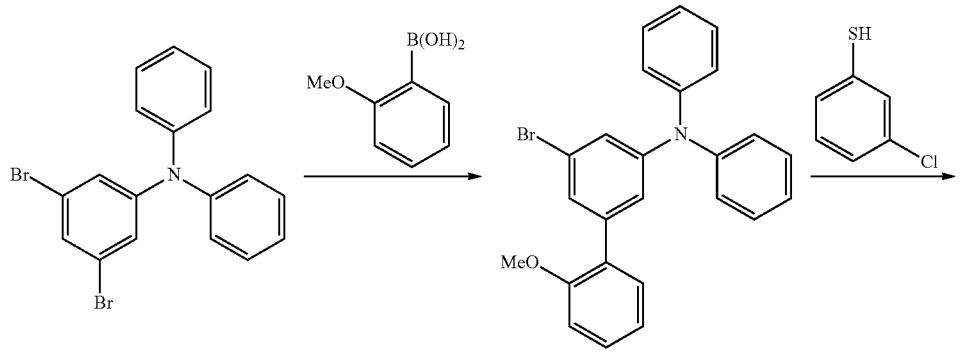

-continued
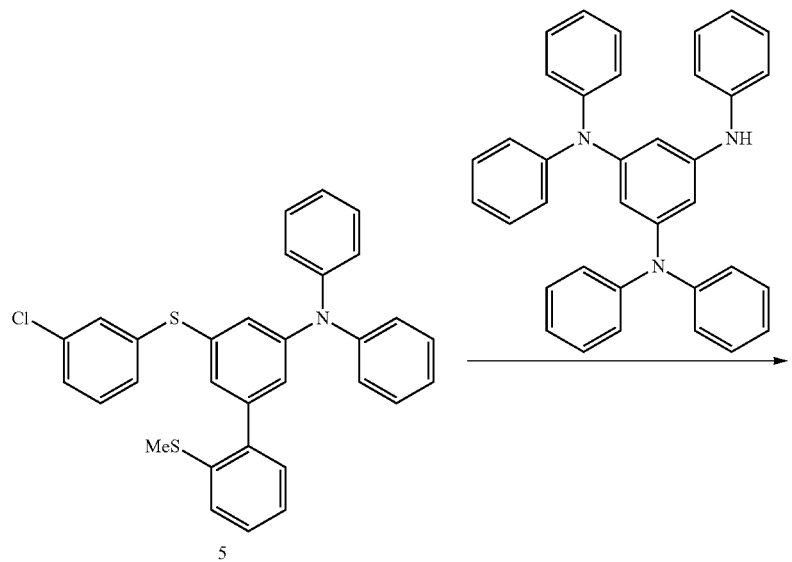
5
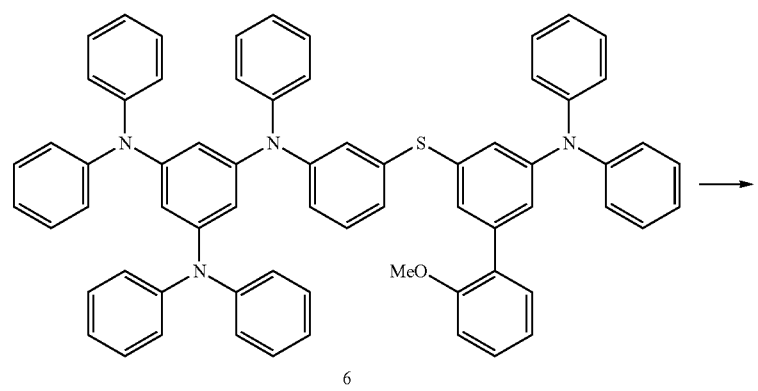
6
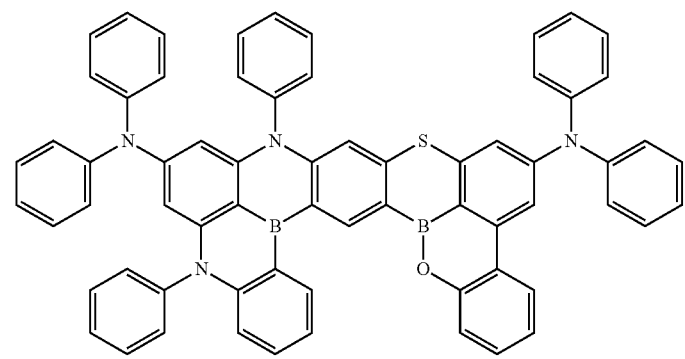
(A-2)

2-1) Synthesis of Intermediate 4

A mixture solution of dimethyl ether (DME) (300 ml) and water (100 ml) including 3,5-dibromo-N,N-diphenylaniline (20 g), 2-(methoxy)phenylboronic acid (8.3 g), Pd(PPh$_3$)$_4$ (0.57 g) and potassium carbonate (13.7 g) was heated and stirred at about 60° C. for about 1 hour. After cooling to room temperature, through liquid separation, a target material was extracted with ethyl acetate, and an organic layer was dried with magnesium sulfate and concentrated under a reduced pressure. The mixture thus obtained was separated by silica gel chromatography to obtain 15.1 g (yield 72%) of Intermediate 4.

2-2) Synthesis of Intermediate 5

An N-methylpyrrolidone (NMP) (250 ml) solution including Intermediate 4 obtained above (15 g), 3-chlorothiophenol (7.6 g), CuI (3.3 g) and potassium carbonate (14.5 g) was heated and stirred at about 200° C. for about 5 hours. The reaction was checked by TLC, and after finishing the reaction, the solution was cooled to room temperature. The reaction solution was poured into water, and a target material was extracted with a mixture solvent of hexane and ethyl acetate, dried with magnesium sulfate, and concentrated under a reduced pressure. The mixture thus obtained was separated by silica gel chromatography to obtain 12.9 g (yield 75%) of Intermediate 5.

2-3) Synthesis of Intermediate 6

A toluene (170 ml) solution including Intermediate 5 obtained above (12.9 g), N$^1$,N$^1$,N$^3$,N$^3$,N$^5$-pentaphenyl-1,3,5-benzenetriamine (13.8 g), sodium butoxide (7.5 g), Pd$_2$(dba)$_3$ (0.48 g) and P(tBu)$_3$/BF$_4$ (0.61 g) was heated and refluxed for about 7 hours. After cooling to room temperature, the reaction solution was poured into water. A target material was extracted with toluene, dried with magnesium sulfate, and concentrated under a reduced pressure. The mixture thus obtained was separated by silica gel chromatography to obtain 21 g (yield 85%) of Intermediate 6.

2-4) Synthesis of Compound (A-2)

A solution obtained by adding 1,2-dichlorobenzene (200 ml) to Intermediate 6 obtained above (21 g) was cooled to about 0° C., and BBr$_3$ (8 ml) was dropwisely added. After finishing the dropwise addition, the temperature was raised to about 120° C., and stirring was performed for about 1 hour. To the reaction solution, N,N-diisopropylethylamine (15 ml) was added, and the temperature was raised to about 160° C. The reaction was checked with TLC, and after about 5 hours and after confirming the disappearance of raw materials, an excessive amount of N,N-diisopropylethylamine was additionally added, and stirring was performed at about 160° C. for about 1 hour, and then, the temperature was reduced to room temperature. The mixture thus obtained was separated by silica gel chromatography twice to obtain 4 g (yield 20%) of Compound (A-2). By the measurement of FAB-MS, the molecular weight of 962 of Compound (A-2) was confirmed.

3. Synthesis of Compound (A-3)

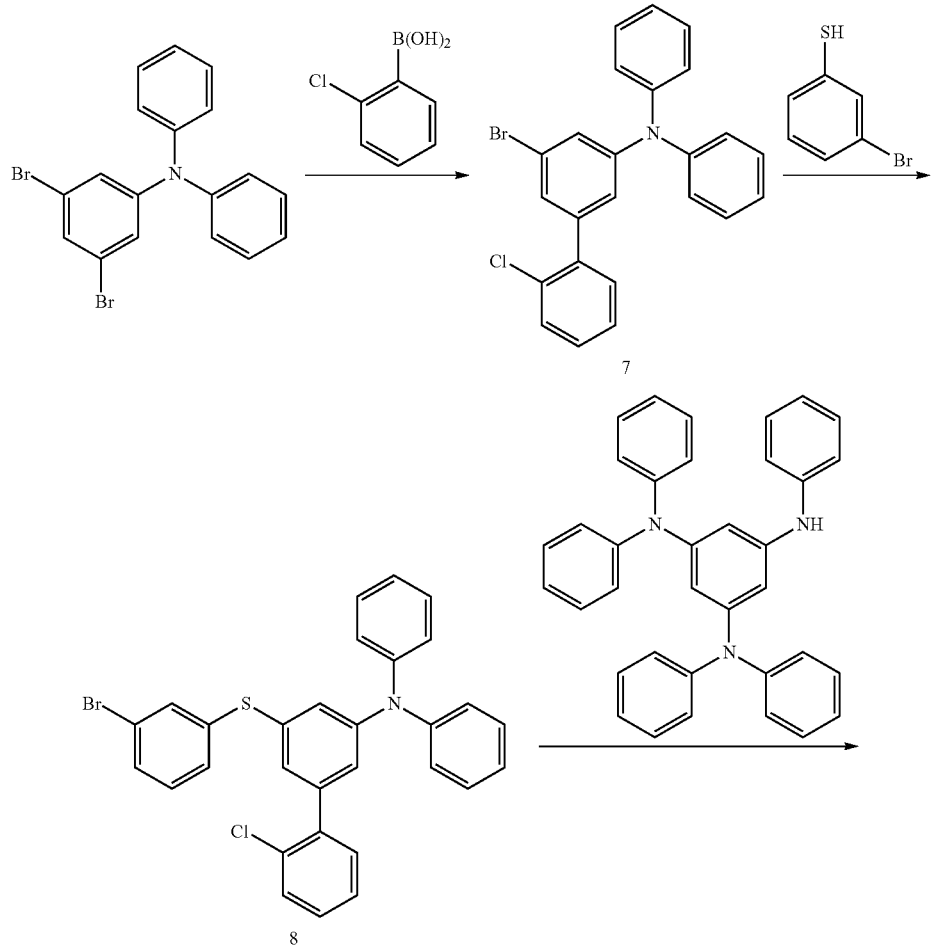

Reaction 3

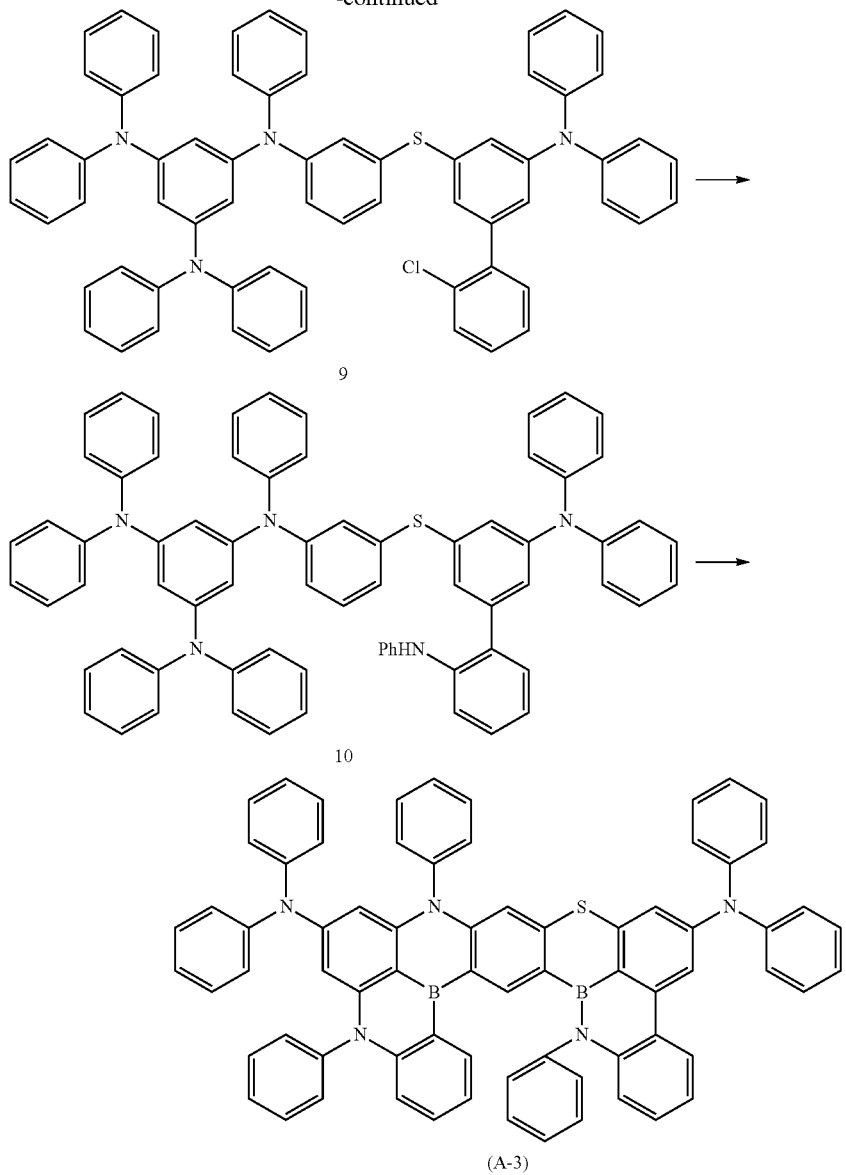

(A-3)

3-1) Synthesis of Intermediate 7

A mixture solution of dimethyl ether (DME) (300 ml) and water (100 ml) including 3,5-dibromo-N,N-diphenylaniline (18 g), 2-chlorophenylboronic acid (7.7 g), Pd(PPh$_3$)$_4$ (0.52 g) and potassium carbonate (12.3 g) was heated and stirred at about 60° C. for about 1 hour. After cooling to room temperature, through liquid separation, a target material was extracted with ethyl acetate, and an organic layer was dried with magnesium sulfate and concentrated under a reduced pressure. The mixture thus obtained was separated by silica gel chromatography to obtain 13.2 g (yield 68%) of Intermediate 7.

3-2) Synthesis of Intermediate 8

An N-methylpyrrolidone (NMP) (200 ml) solution including Intermediate 7 obtained above (13 g), 3-bromothiophenol (8.5 g), CuI (2.9 g) and potassium carbonate (12.3 g) was heated and stirred at about 200° C. for about 5 hours. The reaction was checked by TLC, and after finishing the reaction, the solution was cooled to room temperature. The reaction solution was poured into water, and a target material was extracted with a mixture solvent of hexane and ethyl acetate, dried with magnesium sulfate, and concentrated under a reduced pressure. The mixture thus obtained was separated by silica gel chromatography to obtain 13 g (yield 80%) of Intermediate 8.

3-3) Synthesis of Intermediate 9

A toluene (170 ml) solution including Intermediate 8 obtained above (13 g), $N^1,N^1,N^3,N^3,N^5$-pentaphenyl-1,3,5-benzenetriamine (12.7 g), sodium butoxide (6.9 g), Pd$_2$(dba)$_3$ (0.44 g) and P(tBu)$_3$/BF$_4$ (0.56 g) was heated and refluxed for about 7 hours. After cooling to room temperature, the reaction solution was poured into water. A target material was extracted with toluene, dried with magnesium sulfate, and concentrated under a reduced pressure. The mixture thus obtained was separated by silica gel chromatography to obtain 21 g (yield 91%) of Intermediate 9.

3-4) Synthesis of Intermediate 10

A toluene (200 ml) solution including Intermediate 9 obtained above (21 g), aniline (3 g), sodium butoxide (6.4 g), Pd$_2$(dba)$_3$ (0.4 g) and P(tBu)$_3$/BF$_4$ (0.5 g) was heated and refluxed for about 4 hours. After cooling to room temperature, the reaction solution was poured into water. A target material was extracted with toluene, dried with magnesium sulfate, and concentrated under a reduced pressure. The mixture thus obtained was separated by silica gel chromatography to obtain 19 g (yield 86%) of Intermediate 10.

3-5) Synthesis of Compound (A-3)

A solution obtained by adding 1,2-dichlorobenzene (200 ml) to Intermediate 10 obtained above (19 g) was cooled to about 0° C., and BBr$_3$ (4 ml) was dropwisely added. After finishing the dropwise addition, the temperature was raised to about 120° C., and stirring was performed for about 1 hour. To the reaction solution, N,N-diisopropylethylamine (13 ml) was added, and the temperature was raised to about 160° C. The reaction was checked with TLC, and after about 5 hours and after confirming the disappearance of raw materials, an excessive amount of N,N-diisopropylethylamine was additionally added, and stirring was performed at about 160° C. for about 1 hour, and then, the temperature was reduced to room temperature. The mixture thus obtained was separated by silica gel chromatography twice to obtain 6.2 g (yield 32%) of Compound (A-3). By the measurement of FAB-MS, the molecular weight of 1038 of Compound (A-3) was confirmed.

4. Synthesis of Compound (A-7)

Reaction 4

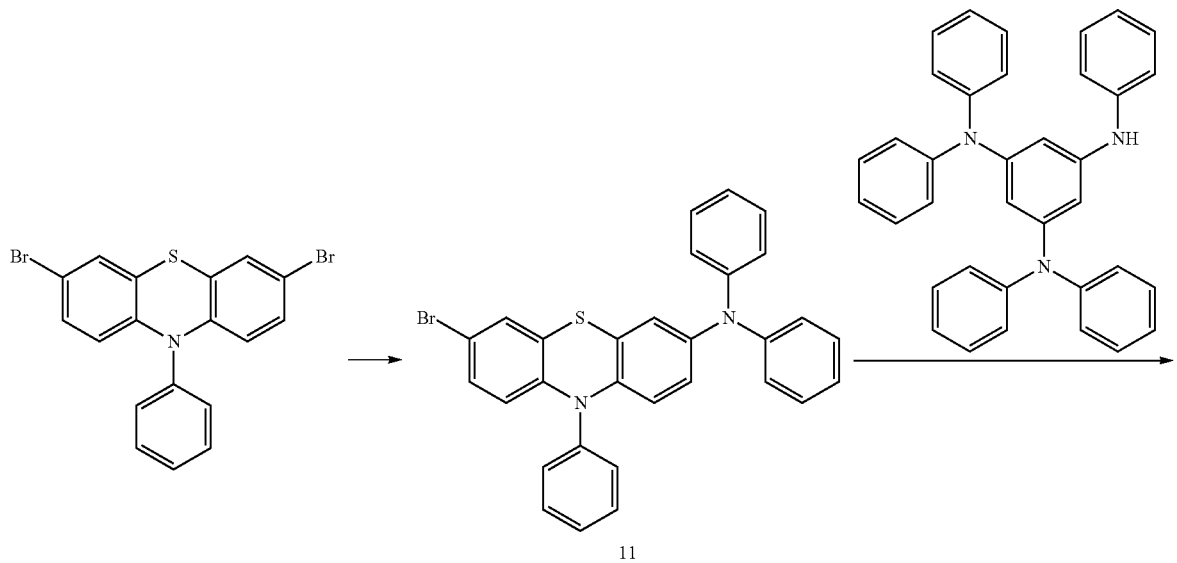

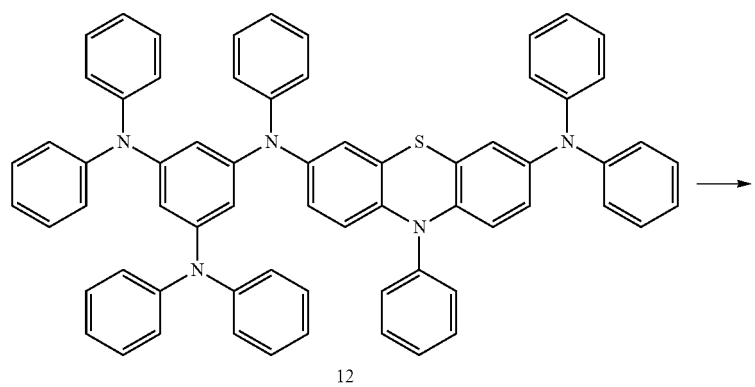

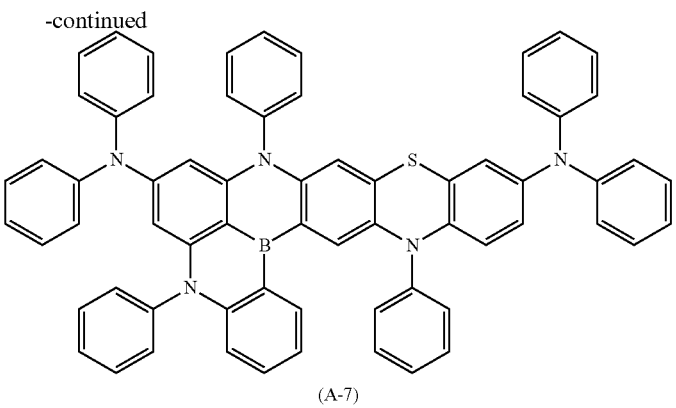

(A-7)

4-1) Synthesis of Intermediate 11

A toluene (300 ml) solution including 3,7-dibromo-10-phenyl-10H-phenothiazine (20 g), diphenylamine (7.8 g), sodium butoxide (13.3 g), Pd$_2$(dba)$_3$ (0.4 g) and 9,9-dimethyl-4,5-bis(diphenylphosphino)xanthene (XantPhos) (0.5 g) was stirred at about 70° C. for about 2 hours. After cooling to room temperature, the reaction solution was poured into water, and a target material was extracted with toluene, dried with magnesium sulfate, and concentrated under a reduced pressure. The mixture thus obtained was separated by silica gel chromatography to obtain 19 g (yield 79%) of Intermediate 11.

4-2) Synthesis of Intermediate 12

A toluene (250 ml) solution including Intermediate 11 obtained above (19 g), $N^1,N^1,N^3,N^3,N^5$-pentaphenyl-1,3,5-benzenetriamine (19.3 g), sodium butoxide (3.8 g), Pd$_2$(dba)$_3$ (0.67 g) and P(tBu)$_3$/BF$_4$ (0.85 g) was heated and refluxed for about 5 hours. After cooling to room temperature, the reaction solution was poured into water. A target material was extracted with toluene, dried with magnesium sulfate, and concentrated under a reduced pressure. The mixture thus obtained was separated by silica gel chromatography to obtain 31 g (yield 90%) of Intermediate 12.

4-3) Synthesis of Compound (A-7)

A solution obtained by adding 1,2-dichlorobenzene (300 ml) to Intermediate 12 obtained above (31 g) was cooled to about 0° C., and BBr$_3$ (12 ml) was dropwisely added. After finishing the dropwise addition, the temperature was raised to about 120° C., and stirring was performed for about 1 hour. To the reaction solution, N,N-diisopropylethylamine (23 ml) was added, and the temperature was raised to about 160° C. The reaction was checked with TLC, and after about 5 hours and after confirming the disappearance of raw materials, an excessive amount of N,N-diisopropylethylamine was additionally added, and stirring was performed at about 160° C. for about 1 hour, and then, the temperature was reduced to room temperature. The mixture thus obtained was separated by silica gel chromatography twice to obtain 8.7 g (yield 28%) of Compound (A-7). By the measurement of FAB-MS, the molecular weight of 951 of Compound (A-7) was confirmed.

5. Synthesis of Compound (C-1)

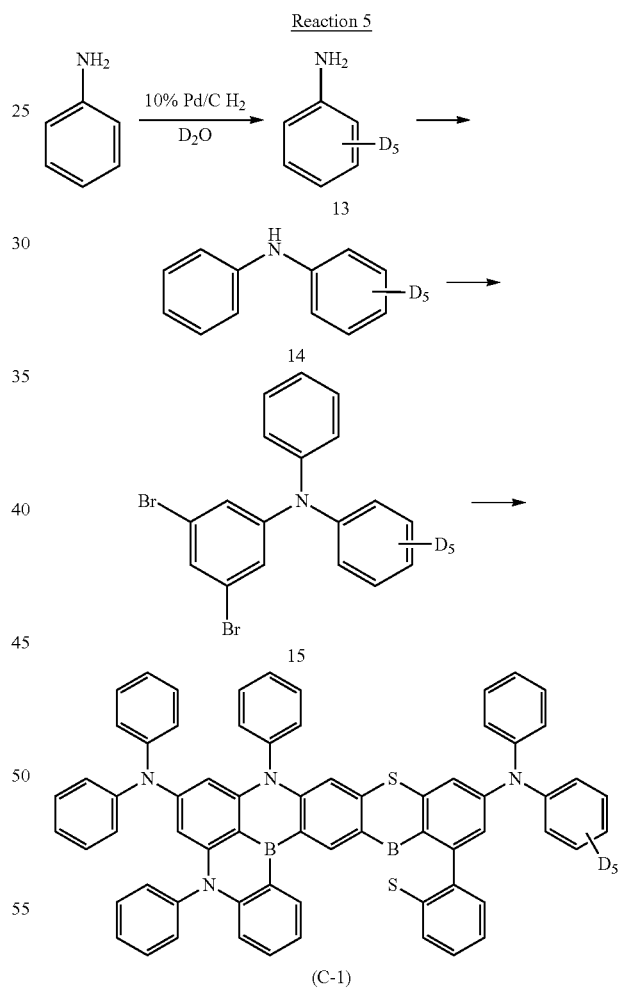

5-1) Synthesis of Intermediate 13

The pressure of a mixture solution of D$_2$O (100 ml) including aniline (10 g), and 10% Pd/C (1 g) was reduced, and hydrogen substitution was performed, followed by heating and stirring at about 80° C. for about 24 hours. After cooling to room temperature, a catalyst was removed by celite filtering, and concentration was performed under a reduced pressure. The mixture thus obtained was analyzed by NMR, and the production of Intermediate 13 in which about 98% was deuterated, was confirmed.

5-2) Synthesis of Intermediate 14

A toluene (400 ml) solution including Intermediate 13 obtained above (7.5 g), bromobenzene (13 g), sodium butoxide (15.9 g), Pd$_2$(dba)$_3$ (0.76 g) and XantPhos (0.96 g) was heated and stirred at about 70° C. for about 2 hours. After cooling to room temperature, the reaction solution was poured into water, and a target material was extracted with toluene, dried with magnesium sulfate, and concentrated under a reduced pressure. The mixture thus obtained was separated by silica gel chromatography to obtain 11 g (yield 76%) of Intermediate 14.

5-3) Synthesis of Intermediate 15

A toluene (380 ml) solution including Intermediate 14 obtained above (11 g), 1,3,5-tribromobenzene (18 g), sodium butoxide (16.5 g), Pd$_2$(dba)$_3$ (0.52 g) and XantPhos (0.66 g) was heated and stirred at about 80° C. for about 1 hour. After cooling to room temperature, the reaction solution was poured into water, and a target material was extracted with toluene, dried with magnesium sulfate, and concentrated under a reduced pressure. The mixture thus obtained was separated by silica gel chromatography to obtain 18 g (yield 77%) of Intermediate 15.

5-4) Synthesis of Compound (C-1)

Substantially the same method as in the synthesis of Compound (A-1) was performed to obtain 3 g of Compound (C-1), except for using 3,5-dibromo-N,N-diphenylaniline-D$_5$ (18 g) (Intermediate 15) instead of 3,5-dibromo-N,N-diphenylaniline in Reaction 1. By the measurement of FAB-MS, the molecular weight of 983 of Compound (C-1) was confirmed.

Example 2. Manufacture of Light Emitting Diode and Evaluation of Polycyclic Compound A light emitting diode of one or more embodiments, including a polycyclic compound of one or more embodiments in an emission layer was manufactured by a method below. For the evaluation of a light emitting diode, a method of manufacturing a light emitting diode is described below.

Light emitting diodes of Example 1 to Example 5 were manufactured using Compound (A-1), Compound (A-2), Compound (A-3), Compound (A-7), and Compound (C-1) above, respectively, as dopant materials of an emission layer.

Light emitting diodes of Comparative Example 1 to Comparative Example 4 were manufactured using Comparative Compounds C1 to C4, respectively, as dopant materials of an emission layer.

The compounds used as the dopant materials in an emission layer in Example 1 to Example 5, and Comparative Example 1 to Comparative Example 4 are as follows.

Example Compounds

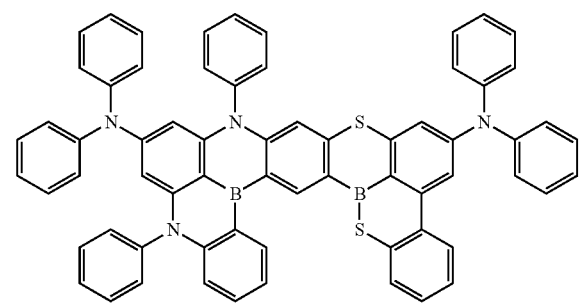
(A-1)

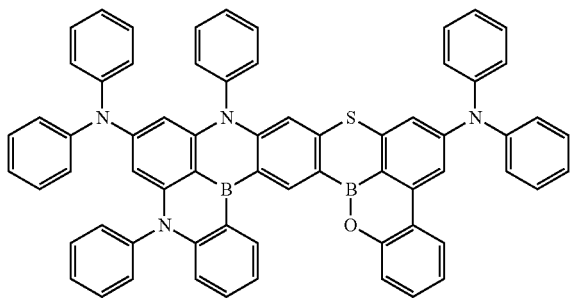
(A-2)

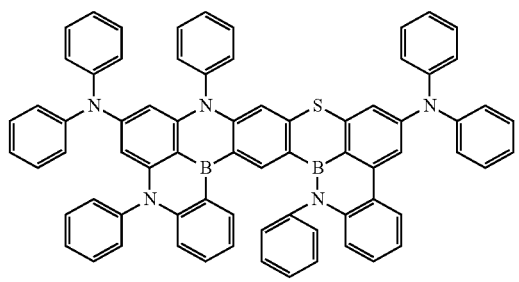

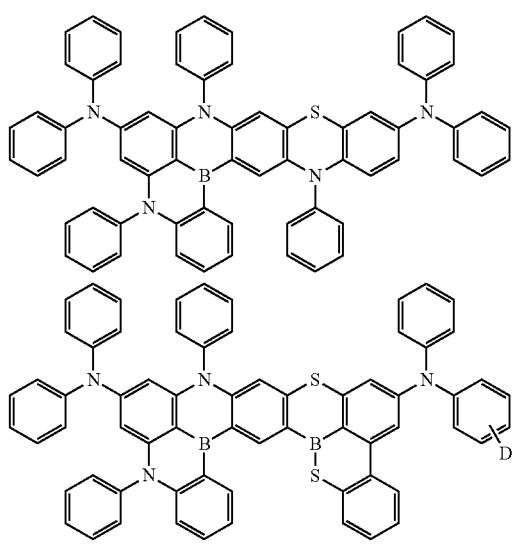

Comparative Copounds

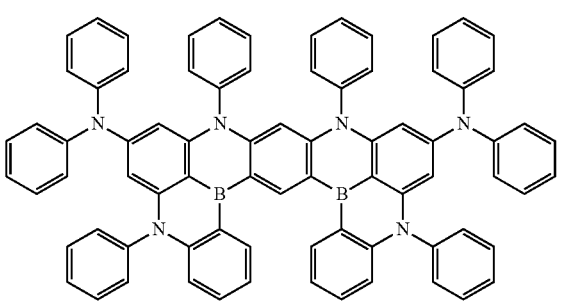
C1

-continued

C2

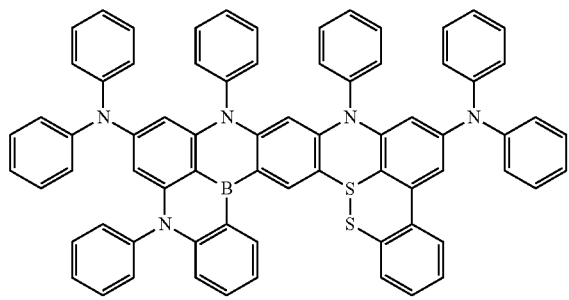

C3

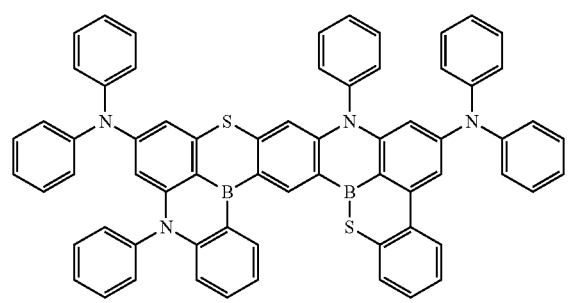

C4

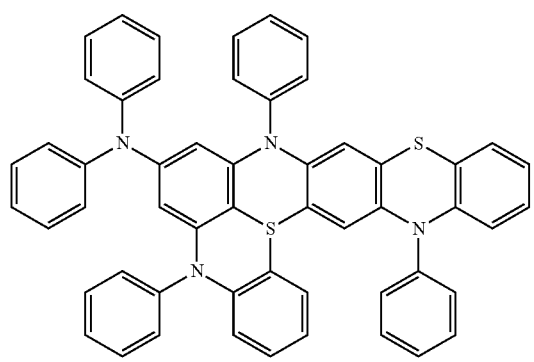

Manufacture of Light Emitting Diode

As a first electrode, on a glass substrate, ITO with a thickness of about 1500 Å was patterned, washed with ultrapure water, cleaned with ultrasonic waves, exposed to UV for about 30 minutes and treated with ozone. Then, HAT-CN was deposited to a thickness of about 100 Å, NPD was deposited to a thickness of about 800 Å, and mCP was deposited to a thickness of about 50 Å to form a hole transport region.

Then, for forming an emission layer, the polycyclic compound of one or more embodiments or a comparative compound was co-deposited with a host material in a ratio of about 6:94 to form a layer to a thickness of about 200 Å. That is, the emission layer formed by the co-deposition was formed by mixing Compound (A-1), Compound (A-2), Compound (A-3), Compound (A-7), and Compound (C-1) with a host material and depositing in Example 1 to Example 5, respectively. In Comparative Example 1 to Comparative Example 4, Comparative Compounds C1 to C4 were mixed with a host material and then, deposited, respectively. During forming the emission layer, mCP was used as the host material.

Then, on the emission layer, a layer with a thickness of about 100 Å was formed using DPEPO, a layer with a thickness of about 300 Å was formed using TPBi, and a layer with a thickness of about 50 Å was formed using LiF in order to form an electron transport region. Then, a second electrode with a thickness of about 1,000 Å was formed using aluminum (Al).

In one or more embodiments, the hole transport region, the emission layer, the electron transport region, and the second electrode were formed using a vacuum deposition apparatus.

Functional layer compounds

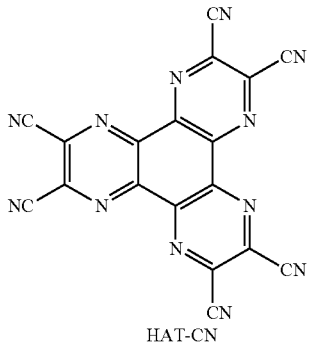
HAT-CN

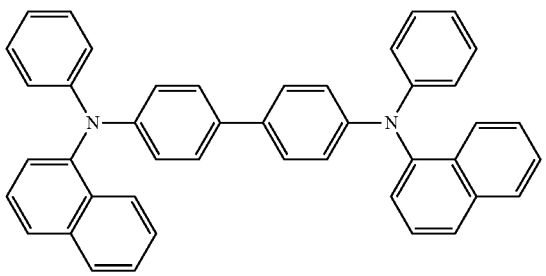
NPD

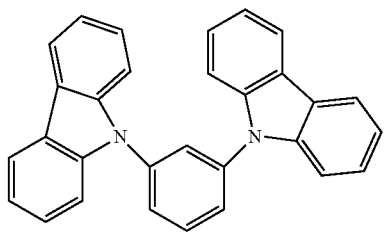
mCP

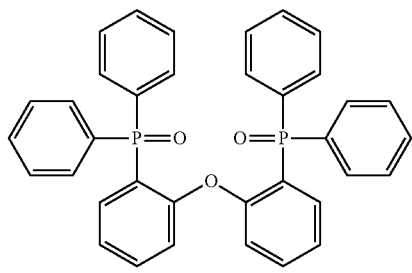
DPEPO

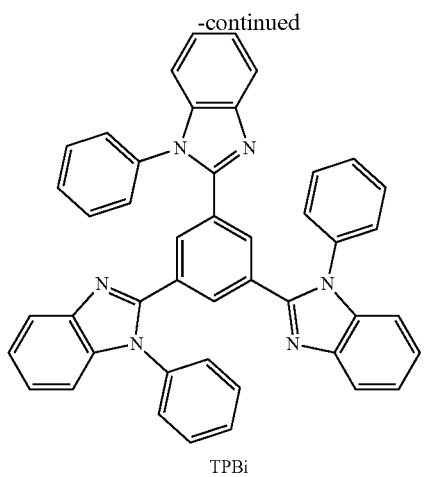

TPBi

Evaluation of Properties of Light Emitting Diode

In Table 1, the evaluation results of the light emitting diodes of Example 1 to Example 5, and Comparative Example 1 to Comparative Example 4 are shown. In Table 1, the emission wavelength (nm), lifetime of fluorescence τ (μs), and diode life (%) of the light emitting diodes thus manufactured are compared and shown.

In Table 1, the emission wavelength (nm) shows a wavelength based on the maximum value in an emission spectrum, and the diode life shows a relative value based on 100% of the diode life of Comparative Example 1.

TABLE 1

| Division | Dopant | Emission wavelength (nm) | Lifetime of fluorescence τ (μs) | Diode life (%) |
|---|---|---|---|---|
| Example 1 | Compound (A-1) | 465 | 2.1 | 125 |
| Example 2 | Compound (A-2) | 462 | 3.5 | 153 |
| Example 3 | Compound (A-3) | 454 | 2.8 | 141 |
| Example 4 | Compound (A-7) | 458 | 3.1 | 135 |
| Example 5 | Compound (C-1) | 465 | 1.9 | 132 |
| Comparative Example 1 | Comparative Compound C1 | 467 | 4.1 | 100 |
| Comparative Example 2 | Comparative Compound C2 | 462 | 13 | 91 |
| Comparative Example 3 | Comparative Compound C3 | 454 | 21 | 58 |
| Comparative Example 4 | Comparative Compound C4 | 460 | 10 | 95 |

Referring to the results of Table 1, the light emitting diodes of Example 1 to Example 5, and Comparative Example 1 to Comparative Example 4 emit light in a blue wavelength region of about 470 nm or less.

However, it could be confirmed that the light emitting diodes of Example 1 to Example 5 showed short lifetime of fluorescence τ (μs) and long diode life (%) when compared to the light emitting diodes of Comparative Example 1 to Comparative Example 4. For example, the light emitting diodes of Example 1 to Example 5 showed the lifetimes of fluorescence τ (μs) of about 3.5 μs or less and the diode life (%) of about 125% or more, and showed improved diode life when compared to the light emitting diodes of Comparative Example 1 to Comparative Example 4.

The Example Compounds included in the light emitting diodes of Example 1 to Example 5 have a fused structure of rings condensed with a central benzene ring which is connected with a boron atom, and S or Se is connected with the central benzene ring at a para position with respect to the boron atom, thereby showing heavy-atom effects.

Comparative Compound C1 and Comparative Compound C4 are fused polycyclic compounds including a boron atom, but not including a structure in which a boron atom is connected with an adjacent aromatic ring via *—O—*, *—S—*, or *—NAr$_a$—* as a linker in a molecule. Accordingly, it is believed that multi-resonance effects are lower than in the Example Compounds of this application, and the life of the light emitting diodes of Comparative Example 1 and Comparative Example 4 was degraded.

Comparative Compound C2 has a structure of a fused polycyclic compound including a boron atom, wherein the boron atom is connected with a benzene ring via *—S—* as a linker, but does not have S or Se substituted at the para position with respect to the boron atom. Accordingly, Comparative Compound C2 shows lower heavy-atom effects than the Example Compound of this application, and the light emitting diode of Comparative Example 2 is recognized to show degraded life.

Comparative Compound C3 is a fused polycyclic compound, wherein S is connected at the para position with respect to the boron atom. For example, Comparative Compound C3 includes two boron atoms positioned on the right and left with respect to a central benzene ring. The boron atom on the right is connected with an adjacent benzene ring via *—S—*, and the boron atom on the left is directly connected with an adjacent benzene ring.

The boron atom on the left of Comparative Compound C3 may correspond to the first boron atom of the polycyclic compound of the present embodiments. The boron atom on the right of Comparative Compound C3 may correspond to the second boron atom of the polycyclic compound of the present embodiments.

However, Comparative Compound C3 discloses S at the ortho position with respect to the first boron atom and at the para position with respect to the second boron atom.

This is a different structure from the polycyclic compound of the present disclosure, which includes S or Se at the para position with respect to the first boron atom and at the ortho position with respect to the second boron atom. Accordingly, it is believed that Comparative Compound C3 showed deteriorated heavy-atom effects compared with the polycyclic compound of the embodiments, and the life of the light emitting diode of Comparative Example 3 was reduced.

The polycyclic compound of the present embodiments includes a central benzene ring, a boron atom connected with the central benzene ring, and S or Se connected with the central benzene ring at the para position with respect to the boron atom, and may improve heavy-atom effects and multi-resonance effects.

The light emitting diode of one or more embodiments includes the polycyclic compound of one or more embodiments in an emission layer and may emit blue light and show improved life characteristics.

The light emitting diode of the present disclosure may show increased emission efficiency and improved life.

Although the embodiments of the present disclosure have been described, it is understood that the present disclosure should not be limited to these embodiments, but various changes and modifications can be made by one ordinary skilled in the art within the spirit and scope of the present disclosure as hereinafter claimed by the following claims their equivalents.

What is claimed is:

1. A light emitting diode, comprising:
a first electrode;
a second electrode opposite the first electrode; and
at least one functional layer between the first electrode and the second electrode, the at least one functional layer comprising a polycyclic compound represented by Formula 1,
wherein the first electrode and the second electrode each independently comprises at least one selected from among Ag, Mg, Cu, Al, Pt, Pd, Au, Ni, Nd, Ir, Cr, Li, Ca, LiF, Mo, Ti, W, In, Sn, Zn, compounds thereof, and mixtures thereof:

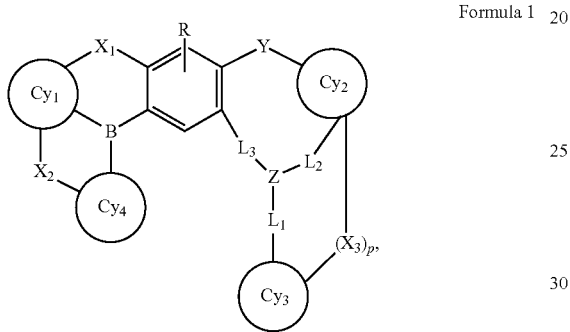

Formula 1 and
in Formula 1,
$X_1$, $X_2$, and $X_3$ are each independently a direct linkage, *—O—*, *—S—*, *—CO—*, *—$SO_2$—*, or *—$NAr_a$—*,
Y is *—S—* or *—Se—*,
Z is *—B—* or *—N—*,
$L_1$, $L_2$ and $L_3$ are each independently a direct linkage, *—O—*, *—S—*, or *—$NAr_b$—*, where if Z is *—N—*, $L_1$, $L_2$ and $L_3$ are each a direct linkage, and if Z is *—B—*, any two selected from among $L_1$, $L_2$ and $L_3$ are direct linkages, and a remaining one selected from among $L_1$, $L_2$ and $L_3$ is *—O—*, *—S—*, or *—$NAr_b$—*,
"p" is 0 or 1, where if Z is *—B—*, "p" is 1, and if Z is *—N—*, "p" is 0,
$C_{y1}$, $C_{y3}$, and $C_{y4}$ are each independently an aromatic hydrocarbon ring of 6 to 30 ring-forming carbon atoms, or an aromatic heterocycle of 2 to 30 ring-forming carbon atoms,
$C_{y2}$ is an aromatic hydrocarbon ring of 6 to 20 ring-forming carbon atoms, where if Z is *—N—*, $C_{y2}$ is substituted with a substituted or unsubstituted diphenyl amine group, or a substituted or unsubstituted carbazole group,
$Ar_a$ and $Ar_b$ are each independently a substituted or unsubstituted aryl group of 6 to 30 ring-forming carbon atoms, or a substituted or unsubstituted heteroaryl group of 2 to 30 ring-forming carbon atoms, and
R is a hydrogen atom, a deuterium atom, a halogen atom, a cyano group, a substituted or unsubstituted nitro group, a substituted or unsubstituted amine group, a substituted or unsubstituted alkoxy group of 1 to 20 carbon atoms, a substituted or unsubstituted alkyl group of 1 to 30 carbon atoms, a substituted or unsubstituted alkenyl group of 2 to 30 carbon atoms, a substituted or unsubstituted aryl group of 6 to 50 ring-forming carbon atoms, or a substituted or unsubstituted heteroaryl group of 2 to 50 ring-forming carbon atoms, and/or is combined with an adjacent group to form a ring.

2. The light emitting diode of claim 1, wherein the polycyclic compound represented by Formula 1 is represented by Formula 2-1 or Formula 2-2:

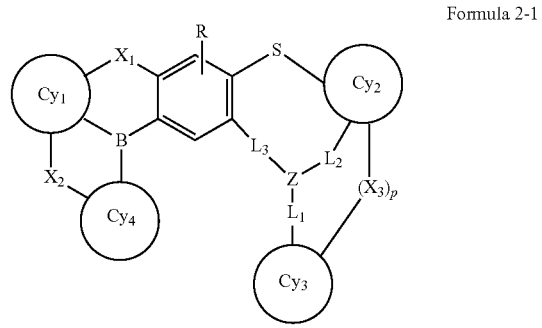

Formula 2-1

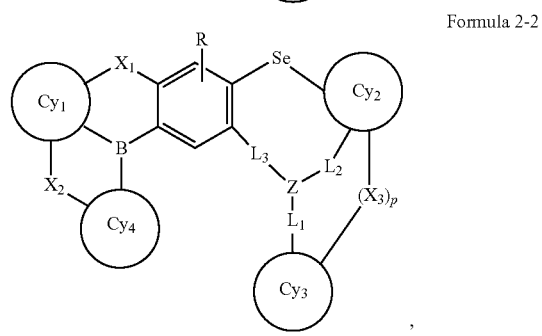

Formula 2-2 and
in Formula 2-1 and Formula 2-2, $X_1$, $X_2$, $X_3$, Z, $L_1$, $L_2$, $L_3$, "p", $C_{y1}$, $C_{y2}$, $C_{y3}$, $C_{y4}$ and R are the same as defined in Formula 1.

3. The light emitting diode of claim 1, wherein the polycyclic compound represented by Formula 1 is represented by Formula 3:

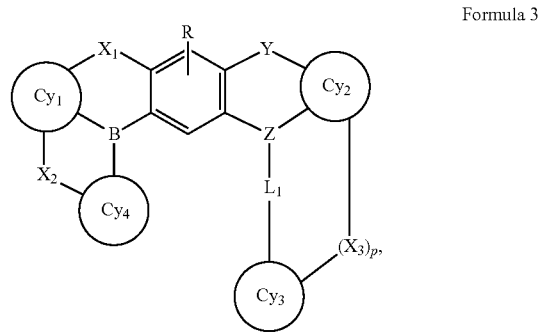

Formula 3 and
in Formula 3, $X_1$, $X_2$, $X_3$, Y, Z, $L_1$, "p", $C_{y1}$, $C_{y2}$, $C_{y3}$, $C_{y4}$ and R are the same as defined in Formula 1.

4. The light emitting diode of claim 1, wherein the polycyclic compound represented by Formula 1 is represented by Formula 4-1 or Formula 4-2:

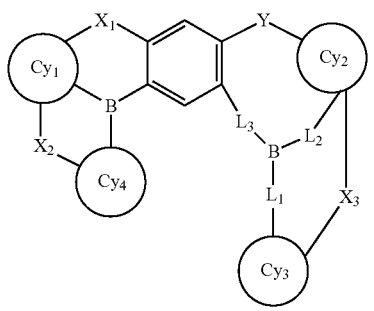

Formula 4-1

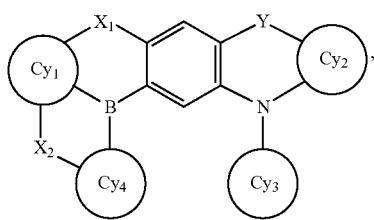

Formula 4-2 and in Formula 4-1 and Formula 4-2, $X_1$, $X_2$, $X_3$, Y, $L_1$, $L_2$, $L_3$, $Cy_1$, $Cy_2$, $Cy_3$, and $Cy_4$ are the same as defined in Formula 1.

5. The light emitting diode of claim 1, wherein the polycyclic compound represented by Formula 1 is represented by any one selected from among Formula 5-1 to Formula 5-3:

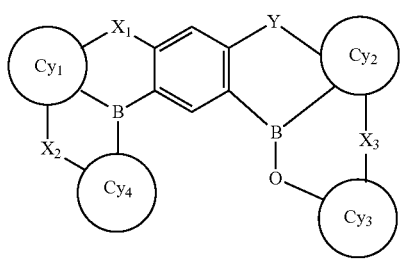

Formula 5-1

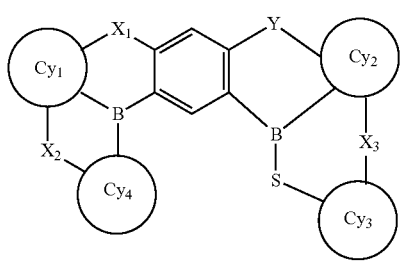

Formula 5-2

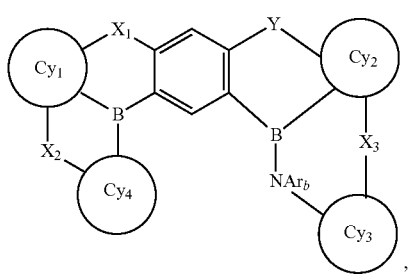

Formula 5-3 and in Formula 5-1 to Formula 5-3, $X_1$, $X_2$, $X_3$, Y, $Cy_1$, $Cy_2$, $Cy_3$, $Cy_4$ and $Ar_b$ are the same as defined in Formula 1.

6. The light emitting diode of claim 1, wherein $Cy_1$, $Cy_2$, $Cy_3$, and $Cy_4$ are each independently a substituted or unsubstituted aromatic hydrocarbon ring of 6 to 20 ring-forming carbon atoms.

7. The light emitting diode of claim 1, wherein the polycyclic compound represented by Formula 1 is represented by Formula 6:

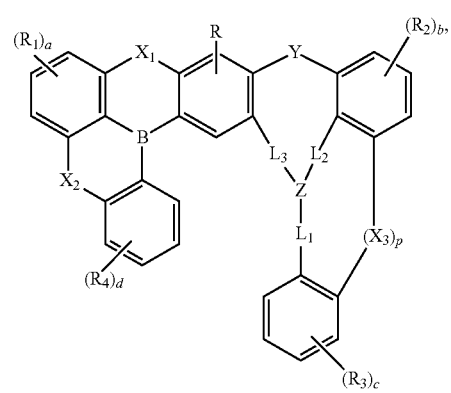

Formula 6 and in Formula 6, $R_1$, $R_2$, $R_3$, and $R_4$ are each independently a hydrogen atom, a deuterium atom, a halogen atom, a cyano group, a substituted or unsubstituted nitro group, a substituted or unsubstituted amine group, a substituted or unsubstituted alkoxy group of 1 to 20 carbon atoms, a substituted or unsubstituted alkyl group of 1 to 30 carbon atoms, a substituted or unsubstituted alkenyl group of 2 to 30 carbon atoms, a substituted or unsubstituted aryl group of 6 to 50 ring-forming carbon atoms, or a substituted or unsubstituted heteroaryl group of 2 to 50 ring-forming carbon atoms, and/or combined with an adjacent group to form a ring, "a" and "b" are each independently an integer of 0 to 3, "c" and "d" are each independently an integer of 0 to 4, and $X_1$, $X_2$, $X_3$, Y, Z, $L_1$, $L_2$, $L_3$, "p", and R are the same as defined in Formula 1.

8. The light emitting diode of claim 7, wherein $R_1$ and $R_2$ are each independently a substituted or unsubstituted diphenyl amine group, or a substituted or unsubstituted carbazole group.

9. The light emitting diode of claim 7, wherein $R_3$ is a hydrogen atom, a deuterium atom, a substituted or unsubstituted phenyl group, or a substituted or unsubstituted biphenyl group.

10. The light emitting diode of claim 7, wherein $R_4$ is a hydrogen atom or a deuterium atom.

11. The light emitting diode of claim 1, wherein $Ar_a$ and $Ar_b$ are each independently a substituted or unsubstituted phenyl group, or a substituted or unsubstituted biphenyl group.

12. The light emitting diode of claim 1, wherein the polycyclic compound represented by Formula 1 is represented by any one selected from among polycyclic compounds in Compound Group 1:

Compound Group 1
(A-1)
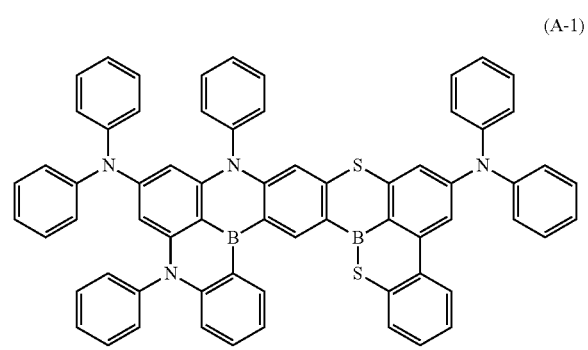
(A-2)
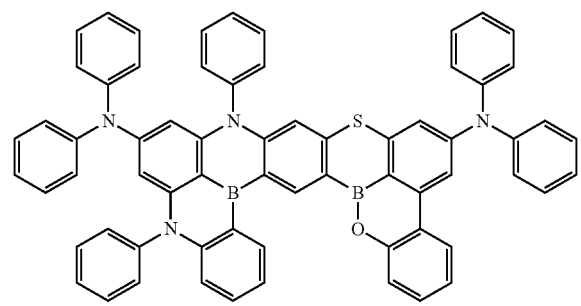
(A-3)
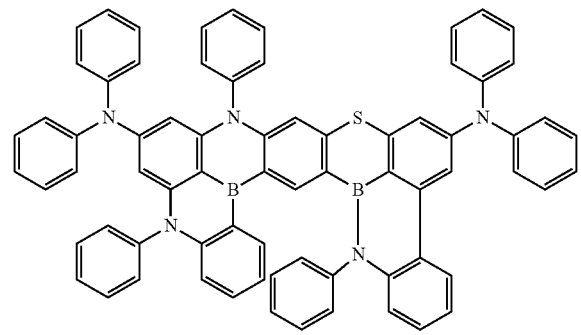
(A-4)
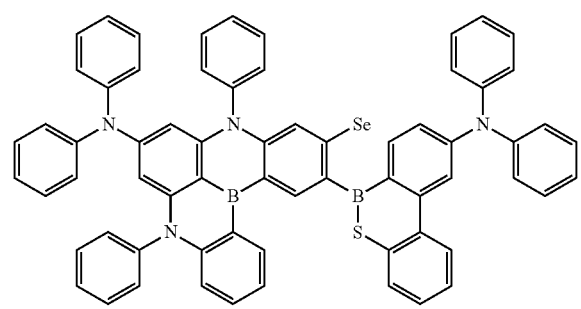
-continued
(A-5)
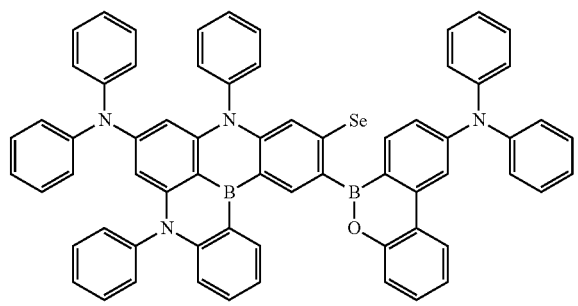
(A-6)
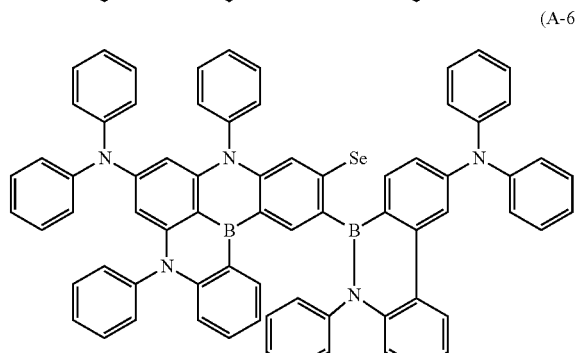
(A-7)
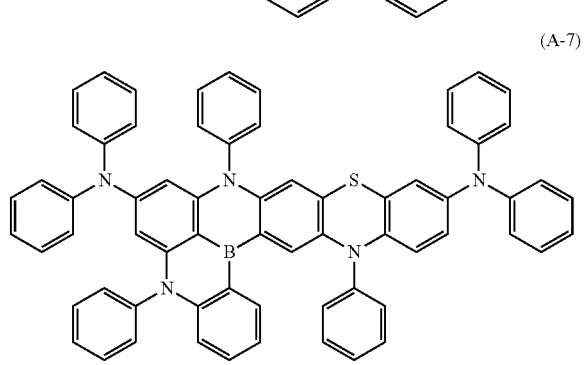
(A-8)
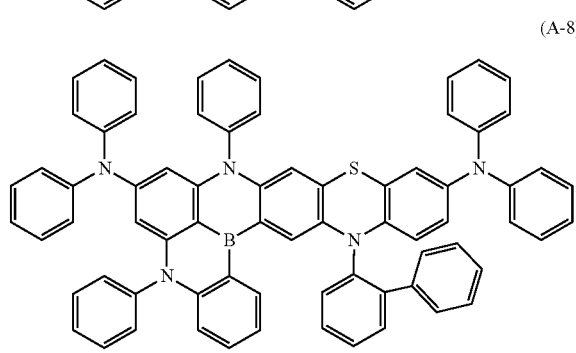
(A-9)
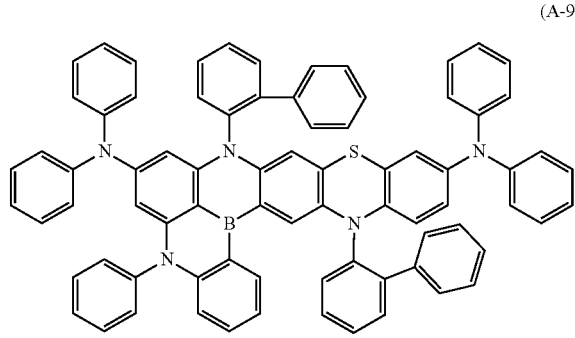

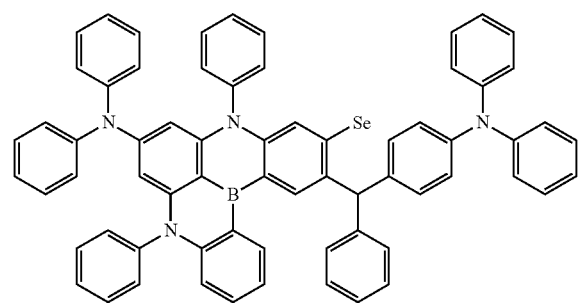
(A-10)
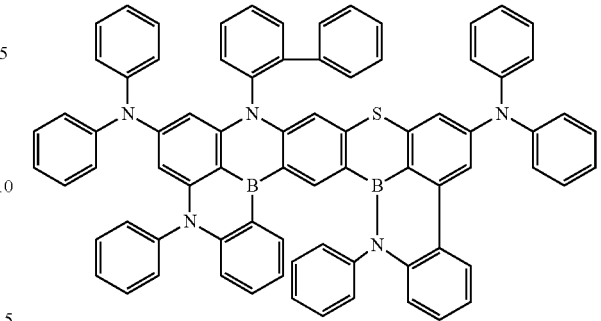
(A-15)
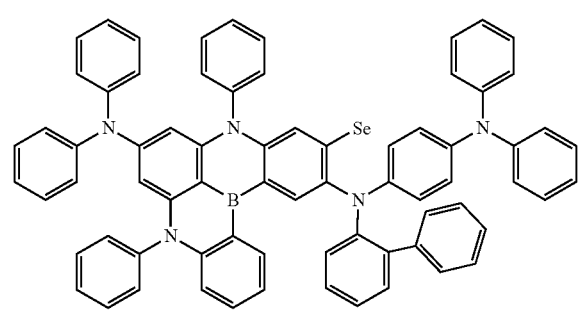
(A-11)
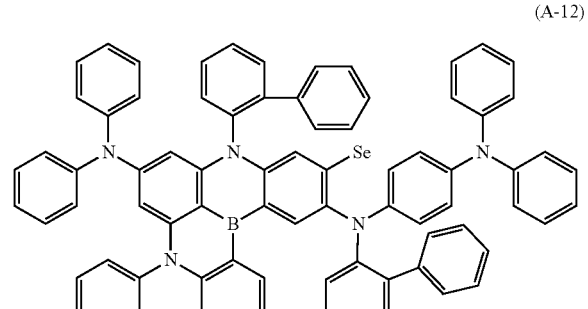
(A-12)
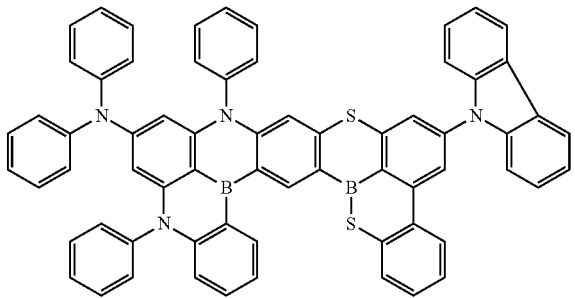
(B-1)
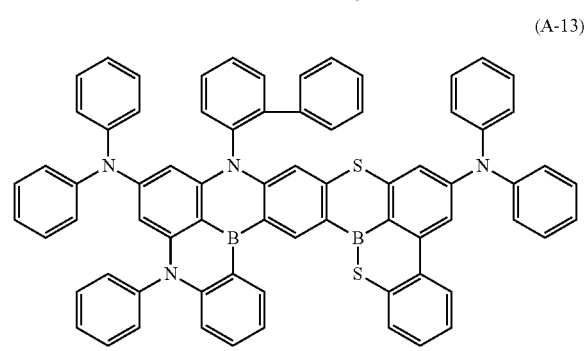
(A-13)
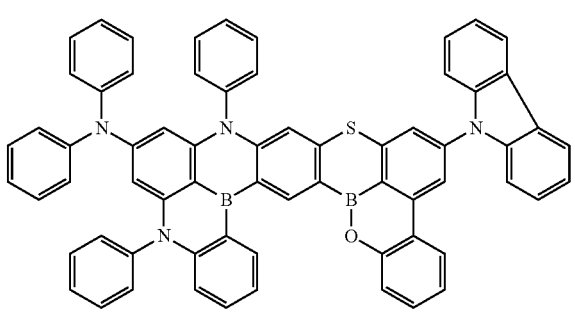
(B-2)
(A-14)
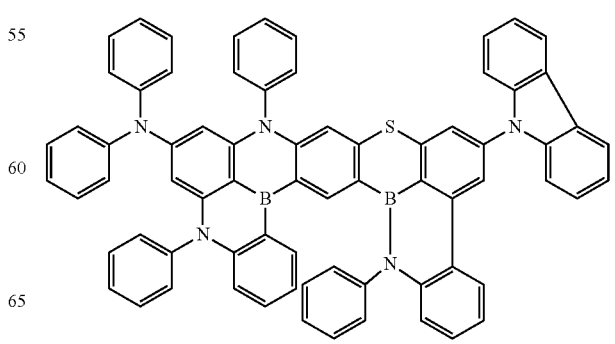
(B-3)

(B-4)
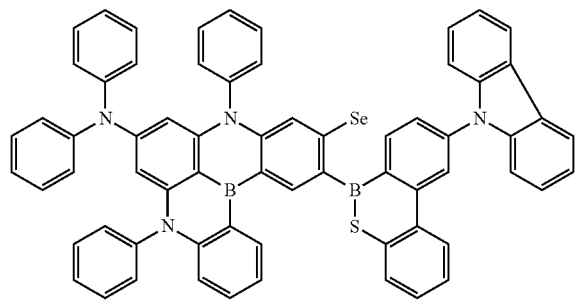
(B-5)
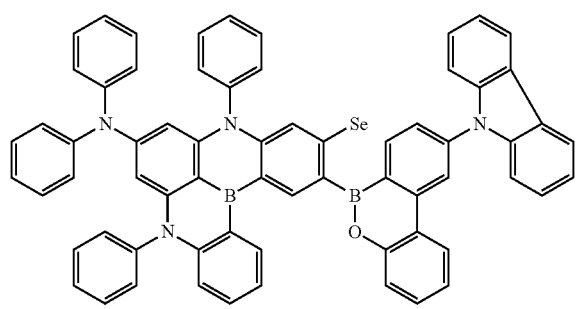
(B-6)
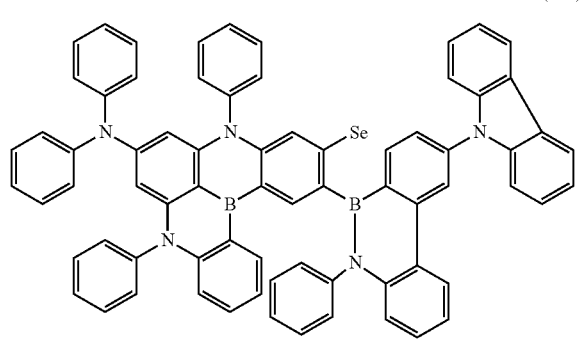
(B-7)
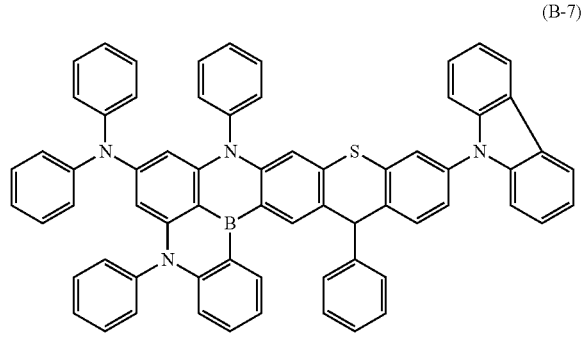
(B-8)
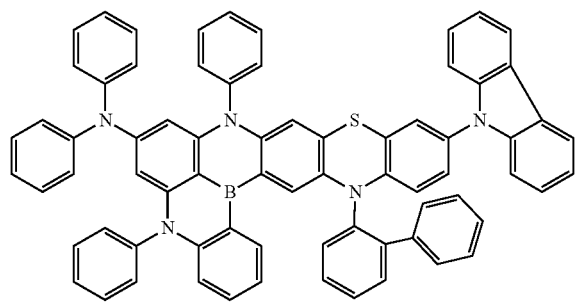
(B-9)
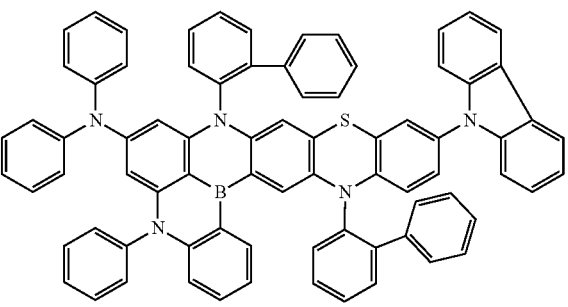
(B-10)
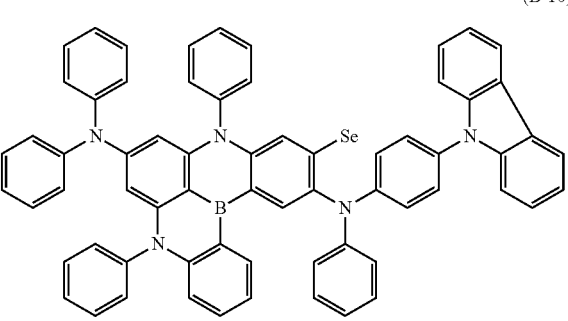
(B-11)
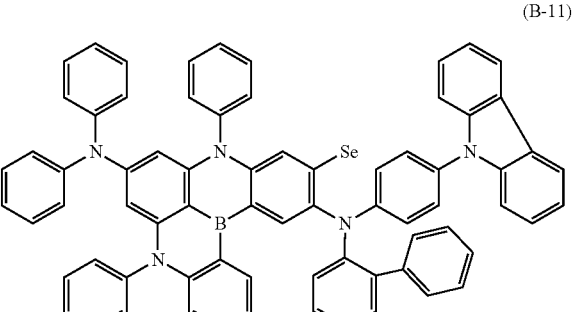
(B-12)
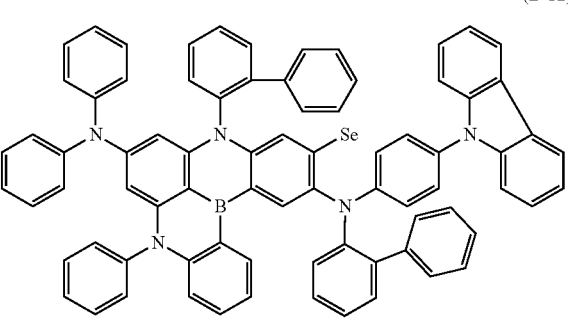
(B-13)
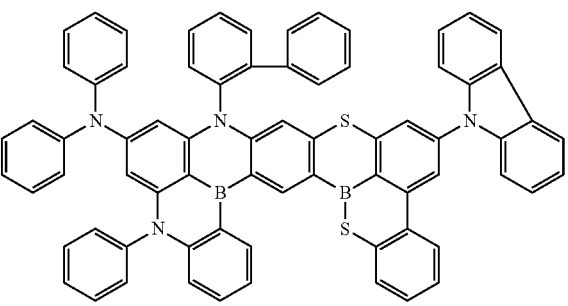

(B-14)
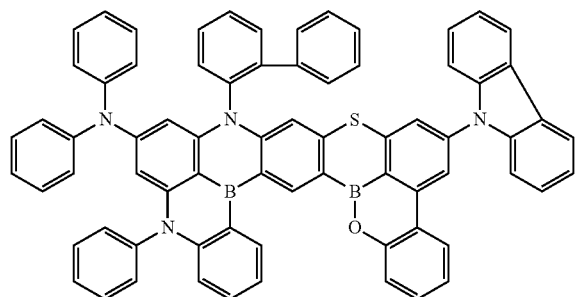
(B-15)
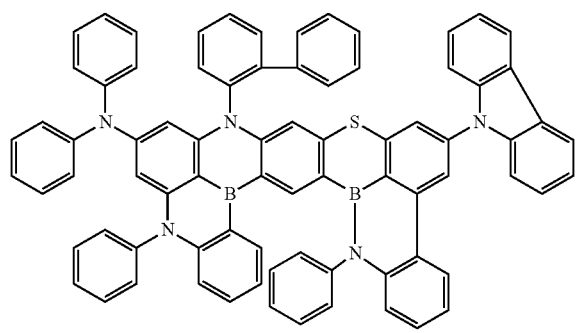
(C-1)
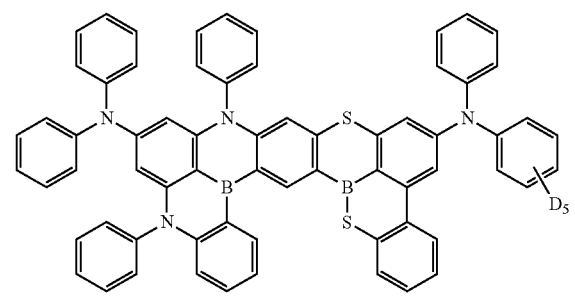
(C-2)
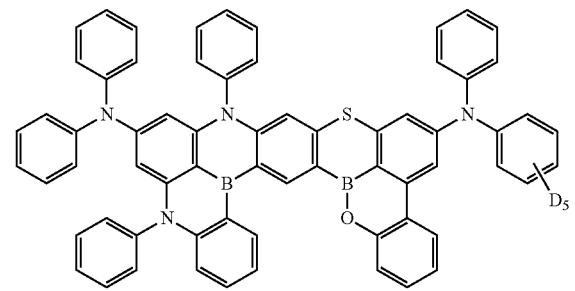
(C-3)
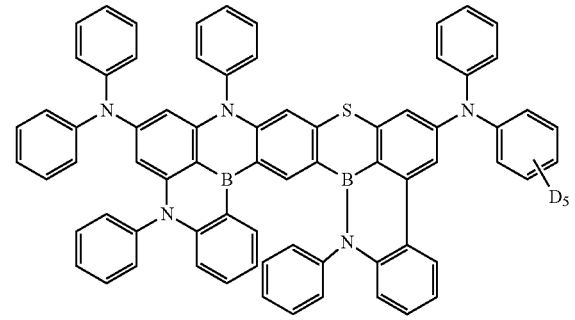
(C-4)
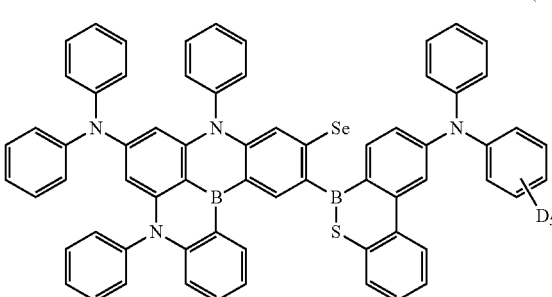
(C-5)
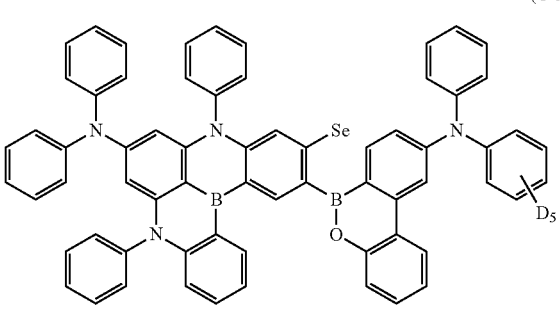
(C-6)
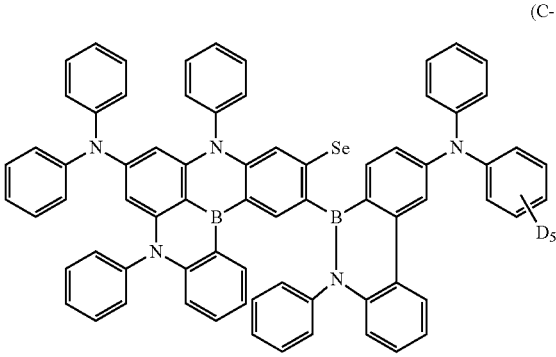
(C-7)
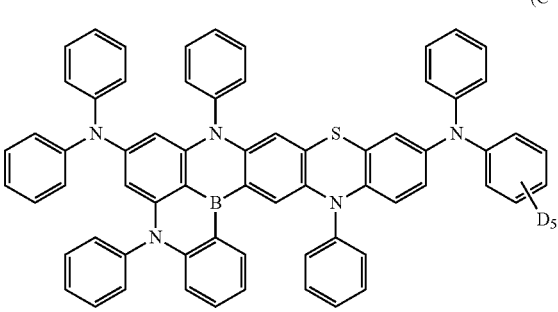
(C-8)
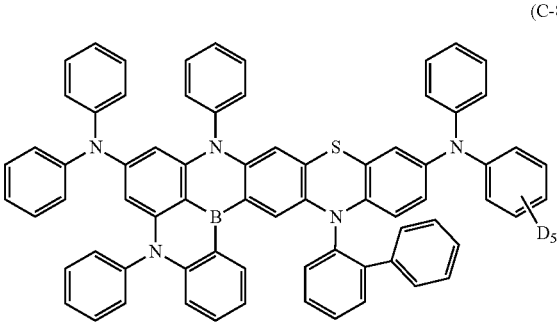

-continued (C-9)
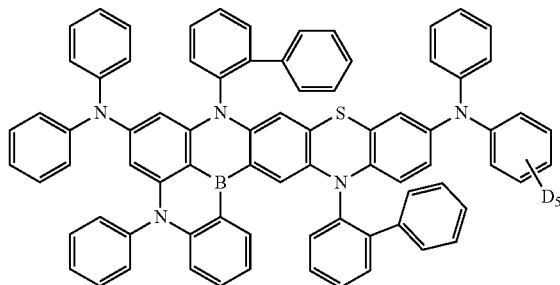

(C-10)
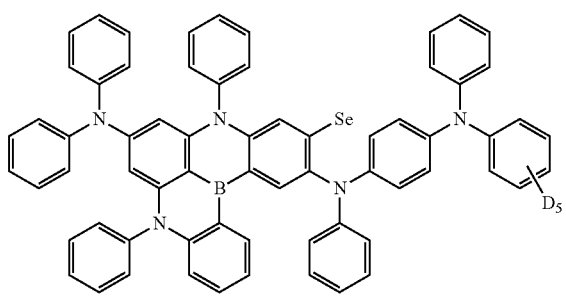

(C-11)
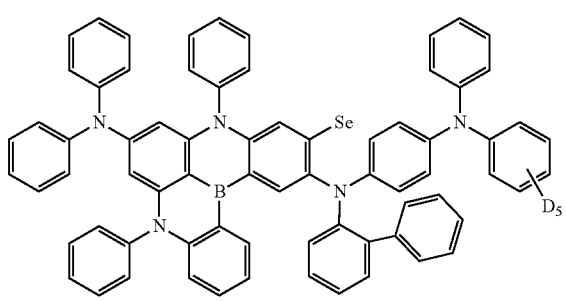

(C-12)
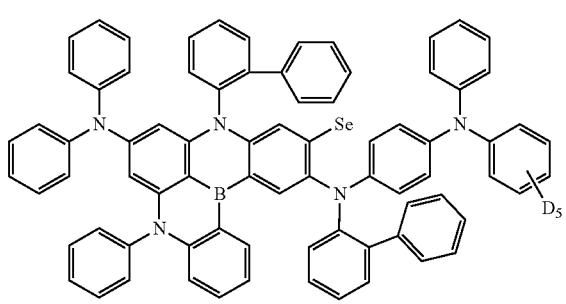

(C-13)

-continued (C-14)
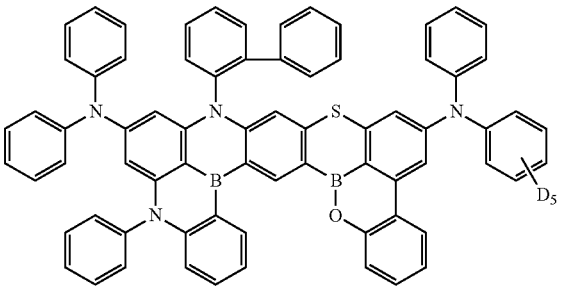

(C-15)
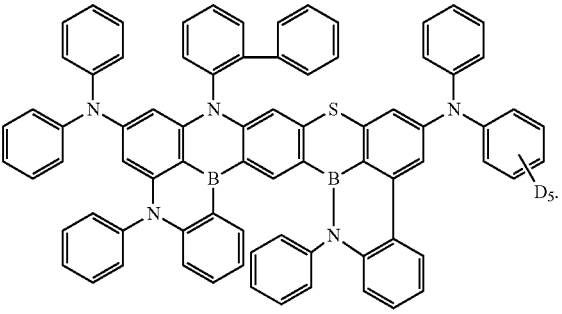

13. A light emitting diode, comprising:
a first electrode;
a second electrode opposite the first electrode;
an emission layer between the first electrode and the second electrode, the emission layer comprising a polycyclic compound represented by Formula 1, and
a hole transport region between the first electrode and the second electrode, the hole transport region comprising a compound represented by Formula E-2b:

Formula E-2b $(Cbz1)\!-\!(L_b)_s\!-\!(Cbz2)$, wherein, in Formula E-2b, Cbz1 and Cbz2 are each independently a substituted or unsubstituted carbazole group,
$L_b$ is a direct linkage, a substituted or unsubstituted arylene group of 6 to 30 ring-forming carbon atoms, or a substituted or unsubstituted heteroarylene group of 2 to 30 ring-forming carbon atoms, and
"s" is an integer of 0 to 10, Formula 1

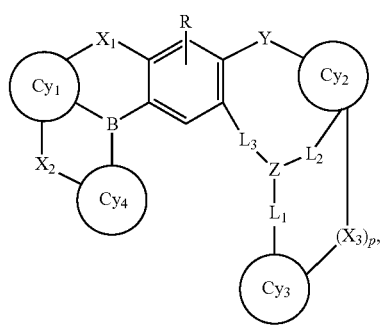

and
in Formula 1, $X_1$, $X_2$, and $X_3$ are each independently a direct linkage, *—O—*, *—S—*, *—CO—*, *—SO$_2$—*, or *—NAr$_a$—*, Y is *—S—* or *—Se—*, Z is *—B—* or *—N—*, $L_1$, $L_2$ and $L_3$ are each independently a direct linkage, *—O—*, *—S—*, or *—NAr$_b$—*, where if Z is *—N—*, $L_1$, $L_2$ and $L_3$ are each a direct linkage, and if Z is *—B—*, any two selected from among $L_1$, $L_2$ and $L_3$ are direct linkages, and a remaining one selected from among $L_1$, $L_2$ and $L_3$ is *—O—*, *—S—*, or *—NAr$_b$—*, p is 0 or 1, where if Z is *—B—*, p is 1, and if Z is *—N—*, p is 0, $C_{y1}$, $C_{y3}$, and $C_{y4}$ are each independently an aromatic hydrocarbon ring of 6 to 30 ring-forming carbon atoms, or an aromatic heterocycle of 2 to 30 ring-forming carbon atoms, $C_{y2}$ is an aromatic hydrocarbon ring of 6 to 20 ring-forming carbon atoms, where if Z is *—N—*, $C_{y2}$ is substituted with a substituted or unsubstituted diphenyl amine group, or a substituted or unsubstituted carbazole group, $Ar_a$ and $Ar_b$ are each independently a substituted or unsubstituted aryl group of 6 to 30 ring-forming carbon atoms, or a substituted or unsubstituted heteroaryl group of 2 to 30 ring-forming carbon atoms, and R is a hydrogen atom, a deuterium atom, a halogen atom, a cyano group, a substituted or unsubstituted nitro group, a substituted or unsubstituted amine group, a substituted or unsubstituted alkoxy group of 1 to 20 carbon atoms, a substituted or unsubstituted alkyl group of 1 to 30 carbon atoms, a substituted or unsubstituted alkenyl group of 2 to 30 carbon atoms, a substituted or unsubstituted aryl group of 6 to 50 ring-forming carbon atoms, or a substituted or unsubstituted heteroaryl group of 2 to 50 ring-forming carbon atoms, and/or is combined with an adjacent group to form a ring.

14. The light emitting diode of claim 13, wherein the emission layer comprises a dopant and a host, and the dopant comprises the polycyclic compound represented by Formula 1.

15. The light emitting diode of claim 13, wherein the emission layer is to emit blue light.

16. The light emitting diode of claim 13, wherein the emission layer is to emit thermally activated delayed fluorescence.

17. The light emitting diode of claim 13, wherein the hole transport region comprises a hole transport layer and a hole injection layer, and
the hole transport layer comprises the compound represented by Formula E-2b.

18. A light emitting diode, comprising:
a first electrode;
a second electrode opposite the first electrode; and
at least one functional layer between the first electrode and the second electrode, the at least one functional layer comprising a polycyclic compound represented by Formula A or Formula B,
wherein the first electrode and the second electrode each independently comprises at least one selected from among Ag, Mg, Cu, Al, Pt, Pd, Au, Ni, Nd, Ir, Cr, Li, Ca, LiF, Mo, Ti, W, In, Sn, Zn, compounds thereof, and mixtures thereof:

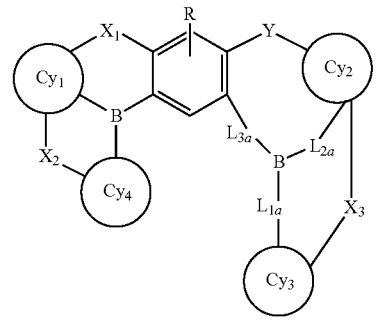

Formula A

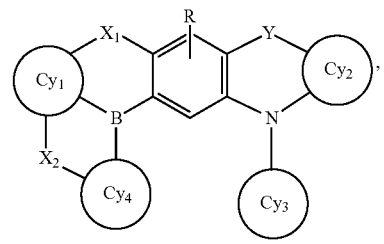

Formula B and in Formula A and Formula B, $X_1$, $X_2$, and $X_3$ are each independently a direct linkage, *—O—*, *—S—*, *—CO—*, *—SO$_2$—*, or *—NAr$_a$—*, Y is *—S—* or *—Se—*, $L_{1a}$, $L_{2a}$ and $L_{3a}$ are each independently a direct linkage, *—O—*, *—S—*, or *—NAr$_b$—*, where any two selected from among $L_{1a}$, $L_{2a}$ and $L_{3a}$ are direct linkages, and a remaining one selected from among $L_{1a}$, $L_{2a}$ and $L_{3a}$ is *—O—*, *—S—*, or *—NAr$_b$—*, $C_{y1}$, $C_{y3}$, and $C_{y4}$ are each independently an aromatic hydrocarbon ring of 6 to 30 ring-forming carbon atoms, or an aromatic heterocycle of 2 to 30 ring-forming carbon atoms, $C_{y2}$ is an aromatic hydrocarbon ring of 6 to 20 ring-forming carbon atoms, where in Formula B, $C_{y2}$ is substituted with a substituted or unsubstituted diphenyl amine group, or a substituted or unsubstituted carbazole group, $Ar_a$ and $Ar_b$ are each independently a substituted or unsubstituted aryl group of 6 to 30 ring-forming carbon atoms, or a substituted or unsubstituted heteroaryl group of 2 to 30 ring-forming carbon atoms, and R is a hydrogen atom, a deuterium atom, a halogen atom, a cyano group, a substituted or unsubstituted nitro group, a substituted or unsubstituted amine group, a substituted or unsubstituted alkoxy group of 1 to 20 carbon atoms, a substituted or unsubstituted alkyl group of 1 to 30 carbon atoms, a substituted or unsubstituted alkenyl group of 2 to 30 carbon atoms, a substituted or unsubstituted aryl group of 6 to 50 ring-forming carbon atoms, or a substituted or unsubstituted heteroaryl group of 2 to 50 ring-forming carbon atoms, and/or is combined with an adjacent group to form a ring.

19. The light emitting diode of claim 18, wherein the polycyclic compound represented by Formula A is represented by Formula A-1 or Formula A-2:

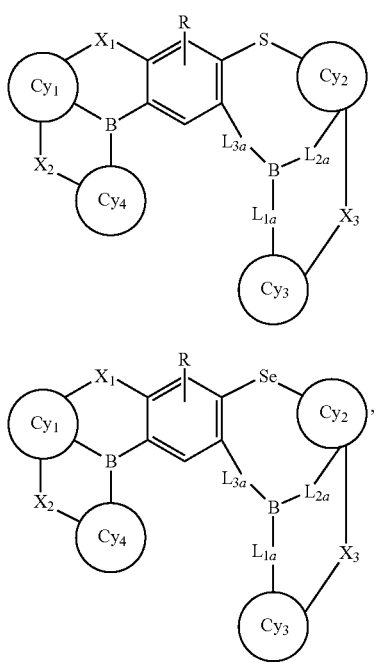

Formula A-1

Formula A-2 and in Formula A-1 and Formula A-2, $X_1$, $X_2$, $X_3$, $L_{1a}$, $L_{2a}$, $L_{3a}$, $Cy_1$, $Cy_2$, $Cy_3$, $Cy_4$, and R are the same as defined in Formula A and Formula B.

20. The light emitting diode of claim 18, wherein the polycyclic compound represented by Formula B is represented by Formula B-1 or Formula B-2:

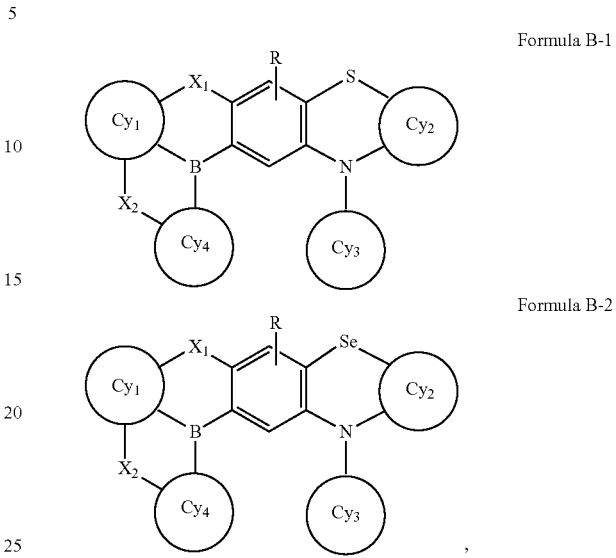

Formula B-1

Formula B-2 and in Formula B-1 and Formula B-2, $X_1$, $X_2$, $Cy_1$, $Cy_2$, $Cy_3$, $Cy_4$, and R are the same as defined in Formula A and Formula B.

* * * * *